US009906746B2

(12) United States Patent
Kondo

(10) Patent No.: US 9,906,746 B2
(45) Date of Patent: Feb. 27, 2018

(54) SOLID-STATE IMAGE PICKUP DEVICE AND IMAGE PICKUP APPARATUS

(71) Applicant: OLYMPUS CORPORATION, Hachioji-shi, Tokyo (JP)

(72) Inventor: Toru Kondo, Hachioji (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 15/333,700

(22) Filed: Oct. 25, 2016

(65) Prior Publication Data

US 2017/0041565 A1 Feb. 9, 2017

Related U.S. Application Data

(63) Continuation of application No. PCT/JP2015/062663, filed on Apr. 27, 2015.

(30) Foreign Application Priority Data

May 2, 2014 (JP) ................. 2014-095478

(51) Int. Cl.
*H04N 5/232* (2006.01)
*H01L 27/146* (2006.01)
(Continued)

(52) U.S. Cl.
CPC ....... *H04N 5/3745* (2013.01); *H01L 27/1464* (2013.01); *H01L 27/14634* (2013.01);
(Continued)

(58) Field of Classification Search
None
See application file for complete search history.

(56) References Cited

U.S. PATENT DOCUMENTS

| 2013/0181316 | A1 | 7/2013 | Tsukimura | |
|---|---|---|---|---|
| 2013/0182161 | A1 | 7/2013 | Nakajima | |
| 2013/0229560 | A1* | 9/2013 | Kondo | H04N 5/374 |
| | | | | 348/308 |

FOREIGN PATENT DOCUMENTS

| JP | 2007-228460 A | 9/2007 |
|---|---|---|
| JP | 2011-135194 A | 7/2011 |

(Continued)

OTHER PUBLICATIONS

International Search Report dated Jun. 16, 2015, issued in counterpart application No. PCT/JP2015/062663. (2 pages).

*Primary Examiner* — Mark T Monk
(74) *Attorney, Agent, or Firm* — Westerman, Hattori, Daniels & Adrian, LLP

(57) ABSTRACT

A solid-state image pickup device includes: a first substrate which has a pixel part divided into a plurality of groups obtained by dividing a plurality of pixels arranged in a two-dimensional matrix into groups corresponding to each of a plurality of predetermined rows; and a second substrate including a pixel load current source corresponding to a vertical signal line to which the plurality of pixels disposed in the same column within the groups are connected, a column circuit that performs a predetermined process on a pixel signal which is output from the pixel to a corresponding vertical signal line, and a pixel for correction that outputs a pixel signal for correction for correcting the corresponding column circuit to the vertical signal line to which the corresponding column circuit is connected, for each column of the pixels belonging to the group.

7 Claims, 17 Drawing Sheets

(51) Int. Cl.
*H04N 5/3745* (2011.01)
*H04N 5/378* (2011.01)

(52) U.S. Cl.
CPC .. *H01L 27/14636* (2013.01); *H01L 27/14643* (2013.01); *H04N 5/23241* (2013.01); *H04N 5/23245* (2013.01); *H04N 5/23254* (2013.01); *H04N 5/378* (2013.01)

(56) References Cited

FOREIGN PATENT DOCUMENTS

| | | | |
|---|---|---|---|
| JP | 2012-257095 | A | 12/2012 |
| JP | 2013-168623 | A | 8/2013 |
| JP | 2013-243781 | A | 12/2013 |
| WO | 2013/041924 | A1 | 3/2013 |
| WO | 2014/007004 | A1 | 1/2014 |

\* cited by examiner

SOLID-STATE IMAGE PICKUP DEVICE AND IMAGE PICKUP APPARATUS

CROSS REFERENCE TO RELATED APPLICATIONS

This application is a continuation application based on a PCT International Application No. PCT/JP2015/062663, filed on Apr. 27, 2015, whose priority is claimed on Japanese Patent Application No. 2014-095478, filed on May 2, 2014. Both of the contents of the PCT International Application and the Japanese Application are incorporated herein by reference.

BACKGROUND OF THE INVENTION

Field of the Invention

The present invention relates to a solid-state image pickup device and an image pickup apparatus.

Description of Related Art

In recent years, image pickup apparatuses such as video cameras or electronic still cameras have generally been in widespread use. Charge coupled device (CCD)-type solid-state image pickup devices or amplification-type solid-state image pickup devices are used in these image pickup apparatuses. In the amplification-type solid-state image pickup device, a signal charge generated and accumulated by a photoelectric conversion part on which light is incident is guided to an amplification part, and a plurality of pixels that output a signal amplified by this amplification part as a pixel signal are disposed in a two-dimensional matrix.

Examples of the amplification-type solid-state image pickup device include a solid-state image pickup device using a junction-type electric field effect transistor in an amplification part, a CMOS-type solid-state image pickup device (hereinafter, also simply referred to as a "solid-state image pickup device") using a complementary metal oxide semiconductor (CMOS) transistor in an amplification part, and the like.

In addition, in recent years, the number of pixels included in the solid-state image pickup device has increased with an increase in the number of pixels and the image quality of the solid-state image pickup device. Consequently, a speed-up in readout of a pixel signal from each of the pixels included in the solid-state image pickup device has been required.

In general solid-state image pickup devices of the related art, a method of amplifying signal charge generated and accumulated by a photoelectric conversion part within each of pixels arrayed in a two-dimensional matrix, and sequentially reading out the signal charge for each row is adopted. For this reason, an increase in the number of pixels included in the solid-state image pickup device is accompanied with an increase in the number of transistors (selection parts) connected to one vertical signal line. Thereby, in the solid-state image pickup device, it takes a lot of time for the pixel signal which is read out for each row from each pixel to reach a column circuit provided for each column of the pixel, and increases power consumption. That is, an increase in the number of pixels included in the solid-state image pickup device increases the time taken to read out the pixel signal from the pixel to the column circuit, and increases the power consumption of the solid-state image pickup device.

In addition, in a case where a chip area is increased in accordance with an increase in the number of pixels included in the solid-state image pickup device, not only does a yield rate during the manufacturing of the solid-state image pickup device deteriorate, but also the capacity (wiring capacity) of the vertical signal line itself increases. This increase in the capacity of the vertical signal line leads to a tendency for the readout time of the pixel signal to be further lengthened. In addition, the power consumption of the solid-state image pickup device also increases.

It is considered that the size of the pixel is reduced to cope with an increase in the number of pixels of the solid-state image pickup device. In this case, it is possible to speed up the readout of pixel signals from a large number of pixels by increasing the current value of a pixel load current source corresponding to each pixel.

Incidentally, in a case where the current value of the pixel load current source corresponding to each pixel is increased, characteristics during the readout of the pixel signal to the vertical signal line cannot be secured without increasing the size of a transistor of the amplification part. However, in a pixel having a small size, an increase in the size of the transistor of the amplification part leads to the incapability of securing a size required for a photodiode which is a photoelectric conversion part formed within a pixel, and thus a dynamic range or linearity is not sufficiently obtained. For this reason, it is very difficult to achieve both a reduction in the size of the pixel for coping with an increase in the number of pixels of the solid-state image pickup device and a speed-up in readout of the pixel signal from each pixel.

As a technique for solving such problems, for example, Japanese Unexamined Patent Application, First Publication No. 2013-243781 discloses a method of reducing the number of transistors (amplification parts) connected to one vertical signal line by dividing pixels included in a solid-state image pickup device into a plurality of groups. In the technique disclosed in Japanese Unexamined Patent Application, First Publication No. 2013-243781, one vertical signal line of the related art is divided into two parts by dividing the pixels included in the solid-state image pickup device into two groups. A column circuit corresponding to each of the divided vertical signal lines is provided. That is, in the technique disclosed in Japanese Unexamined Patent Application, First Publication No. 2013-243781, a set of column circuits corresponding to each column of the pixels included in the solid-state image pickup device is provided by the number of groups into which the pixels within a pixel part are divided.

With such a configuration, in the technique disclosed in Japanese Unexamined Patent Application, First Publication No. 2013-243781, the number of transistors (amplification parts) connected to each vertical signal line is reduced to ½, that is, the load of the vertical signal line when a pixel signal is read out from each pixel to a column circuit is reduced, and thus the readout time of the pixel signal is shortened. In addition, in the technique disclosed in Japanese Unexamined Patent Application, First Publication No. 2013-243781, the pixel signals are read out from two groups in parallel, and thus a speed-up in readout of the pixel signal from each pixel is achieved.

SUMMARY OF THE INVENTION

According to a first aspect of the present invention, a solid-state image pickup device is provided, including: a first substrate including a pixel part in which a plurality of pixels disposed in a two-dimensional matrix are divided into a plurality of groups forming a set for each of a plurality of rows which are set in advance; and a second substrate including pixel load current sources corresponding to vertical signal lines to which the plurality of pixels disposed in the same column within the groups are connected, and column circuits that perform a process set in advance on a pixel signal which is output from the pixel to a corresponding vertical signal line, for each column of the pixels belonging to the group, and including a plurality of circuits that output the pixel signal processed by each of the column circuits, as an image signal, for each row of the pixels, so as to correspond to each of the groups, wherein the first substrate and the second substrate are laminated, and each of the vertical signal lines within each of the groups, and each of the pixel load current sources and the column circuits corresponding to the vertical signal line within the signal processing circuit corresponding to the group are electrically connected to each other through each inter-substrate connecting portion of the pixel load current source and the column circuit corresponding to the vertical signal line.

According to a second aspect of the present invention, in the solid-state image pickup device of the first aspect, the second substrate may further include a power supply controller that controls a power supply of a component within the signal processing circuit in accordance with an operation when the image signal is output from the solid-state image pickup device.

According to a third aspect of the present invention, in the solid-state image pickup device of the first or second aspect, the signal processing circuit may further include a pixel for correction that corresponds to each of the column circuits, and outputs a pixel signal for correction for correcting the corresponding column circuit to the vertical signal line to which the corresponding column circuit is connected.

According to a fourth aspect of the present invention, in the solid-state image pickup device of the second or third aspect, the power supply controller may set power supplies of all components within the signal processing circuit to be in an ON-state when the pixels within each of the groups are simultaneously driven, and the image signals based on the pixel signals which are output from the driven pixels are output from the solid-state image pickup device so as to be output from the signal processing circuit corresponding to each of the groups in parallel, and may set a power supply of a component within the signal processing circuit, operating in order to output the image signal, to be in an ON-state, and set a power supply of a component within the signal processing circuit, not operating in order to output the image signal, to be in an OFF-state, when each of the pixels is sequentially driven, and the image signals based on the pixel signals which are output from the driven pixels are sequentially output from the solid-state image pickup device so as to be output from the signal processing circuit corresponding to the driven pixels.

According to a fifth aspect of the present invention, in the solid-state image pickup device of the third or fourth aspect, the solid-state image pickup device may correct each of the column circuits included in each of the signal processing circuits, using the pixel signal for correction which is output by the corresponding pixel for correction, before the image signal is output from the solid-state image pickup device.

According to a sixth aspect of the present invention, in solid-state image pickup device of any one of the second to fifth aspects, the power supply controller may include an output part included in each of the signal processing circuits, and controls an ON-state and an OFF-state of a power supply of a component within the signal processing circuit.

According to a seventh aspect of the present invention, an image pickup apparatus provided with a solid-state image pickup device is provided, including: a first substrate including a pixel part in which a plurality of pixels disposed in a two-dimensional matrix are divided into a plurality of groups forming a set for each of a plurality of rows which are set in advance; and a second substrate including pixel load current sources corresponding to vertical signal lines to which the plurality of pixels disposed in the same column within the groups are connected, and column circuits that perform a process set in advance on a pixel signal which is output from the pixel to a corresponding vertical signal line, for each column of the pixels belonging to the group, and including a plurality of signal processing circuits that output the pixel signal processed by each of the column circuits, as an image signal, for each row of the pixels, so as to correspond to each of the groups, wherein the first substrate and the second substrate are laminated, and each of the vertical signal lines within each of the groups, and each of the pixel load current sources and the column circuits corresponding to the vertical signal line within the signal processing circuit corresponding to the group are electrically connected to each other through each inter-substrate connecting portion of the pixel load current source and the column circuit corresponding to the vertical signal line.

According to an eighth aspect of the present invention, in the image pickup apparatus of the seventh aspect, the image pickup apparatus may further include a mechanical shutter that controls an amount of light incident on the solid-state image pickup device, and the light incident on the solid-state image pickup device may be blocked by the mechanical shutter when the pixels within each of the groups are simultaneously driven, and the image signals based on the pixel signals which are output from the driven pixels are output from the solid-state image pickup device so as to be output from the signal processing circuit corresponding to each of the groups in parallel.

DETAILED DESCRIPTION OF THE INVENTION

Figure 1:
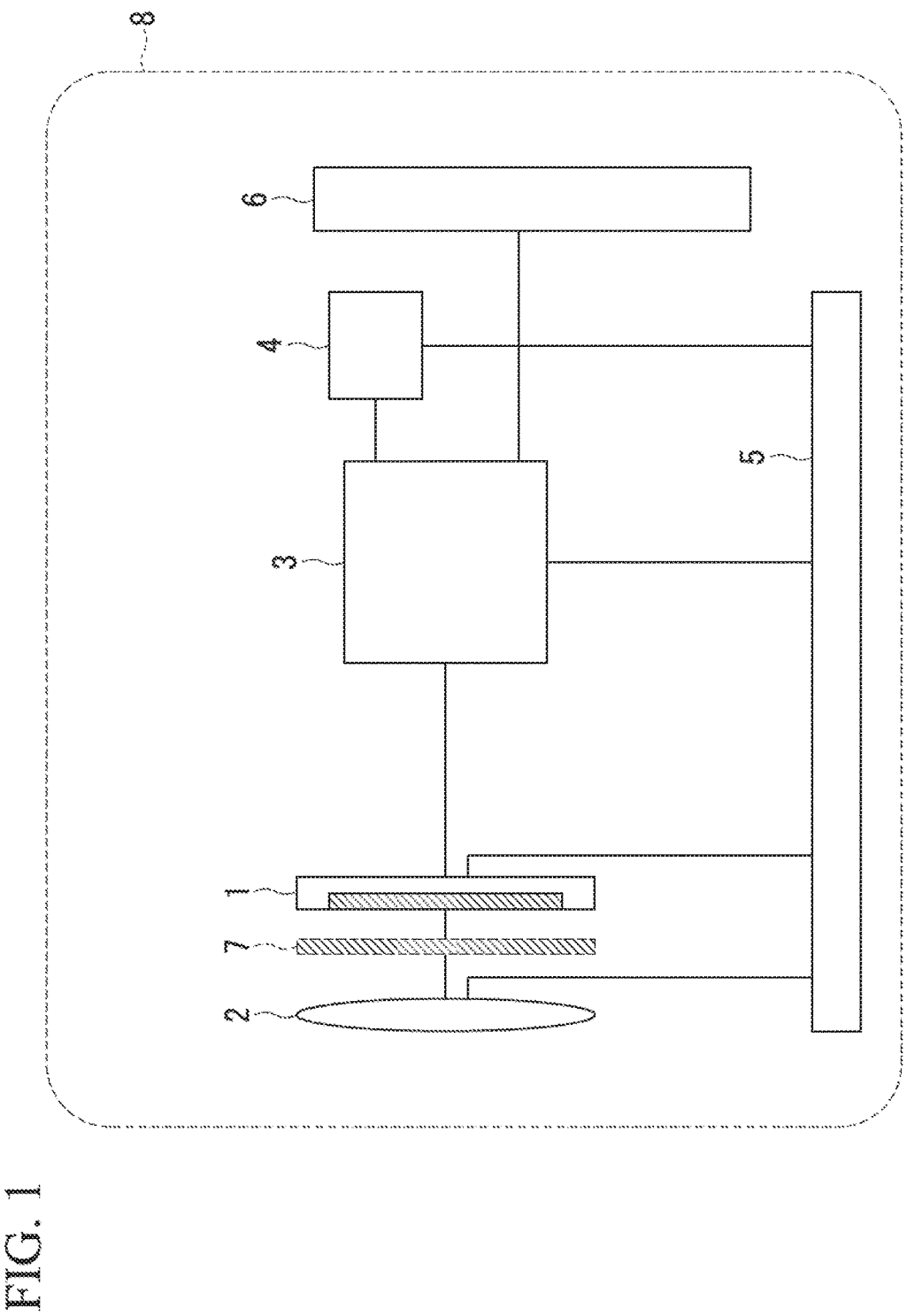
FIG. 1 is a block diagram illustrating a schematic configuration of an image pickup apparatus according to an embodiment of the present invention.

Hereinafter, an embodiment of the present invention will be described with reference the accompanying drawings. FIG. 1 is a block diagram illustrating a schematic configuration of an image pickup apparatus (for example, digital monocular camera system) according to the present embodiment. An image pickup apparatus 8 shown in FIG. 1 includes a lens part 2, a solid-state image pickup device 1, an image signal processing device 3, a recording device 4, a camera control device 5, a display device 6, and a mechanical shutter 7.

The lens part 2 is configured such that zooming, a focus, an aperture diaphragm, and the like are driven and controlled by the camera control device 5, and forms a subject image on the solid-state image pickup device 1.

The mechanical shutter 7 is a screen for mechanically opening and closing in order to control (adjust) the amount of subject light incident on the solid-state image pickup device 1. When a still image is captured in the image pickup apparatus 8, for example, by the operation of the mechanical shutter 7, a time at which the subject light is incident on the solid-state image pickup device 1, that is, an exposure time is adjusted. In addition, when a moving image is captured in the image pickup apparatus 8, for example, by the operation of the mechanical shutter 7, the amount of the subject light incident on the solid-state image pickup device 1 is adjusted.

The solid-state image pickup device 1 is a CMOS-type solid-state image pickup device, driven and controlled by the camera control device 5, which exposes subject light incident into the solid-state image pickup device 1 through the lens part 2 and converts the exposed light into an image signal. The details of this solid-state image pickup device 1 will be described later.

The image signal processing device 3 performs processes such as the amplification of a signal, the conversion of the signal into image data, various types of correction thereof, and the compression of the image data, with respect to an image signal which is output from the solid-state image pickup device 1. The image signal processing device 3 has a memory (not shown) used therein as means for temporarily storing image data in each process.

The recording device 4 is a removable recording medium such as a semiconductor memory, and records or reads out image data.

The display device 6 is a display device, such as a liquid crystal, which displays an image, formed in the solid-state image pickup device 1, which is based on image data processed by the image signal processing device 3 or image data read out from the recording device 4.

The camera control device 5 is a control device that controls the entire image pickup apparatus 8.

Figure 2A:
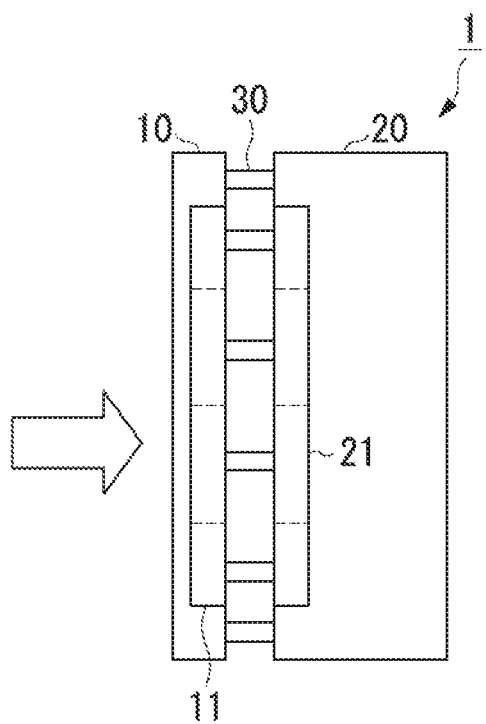
FIG. 2A is an overview diagram illustrating a schematic configuration of a solid-state image pickup device mounted in the image pickup apparatus of the present embodiment.
Figure 2B:
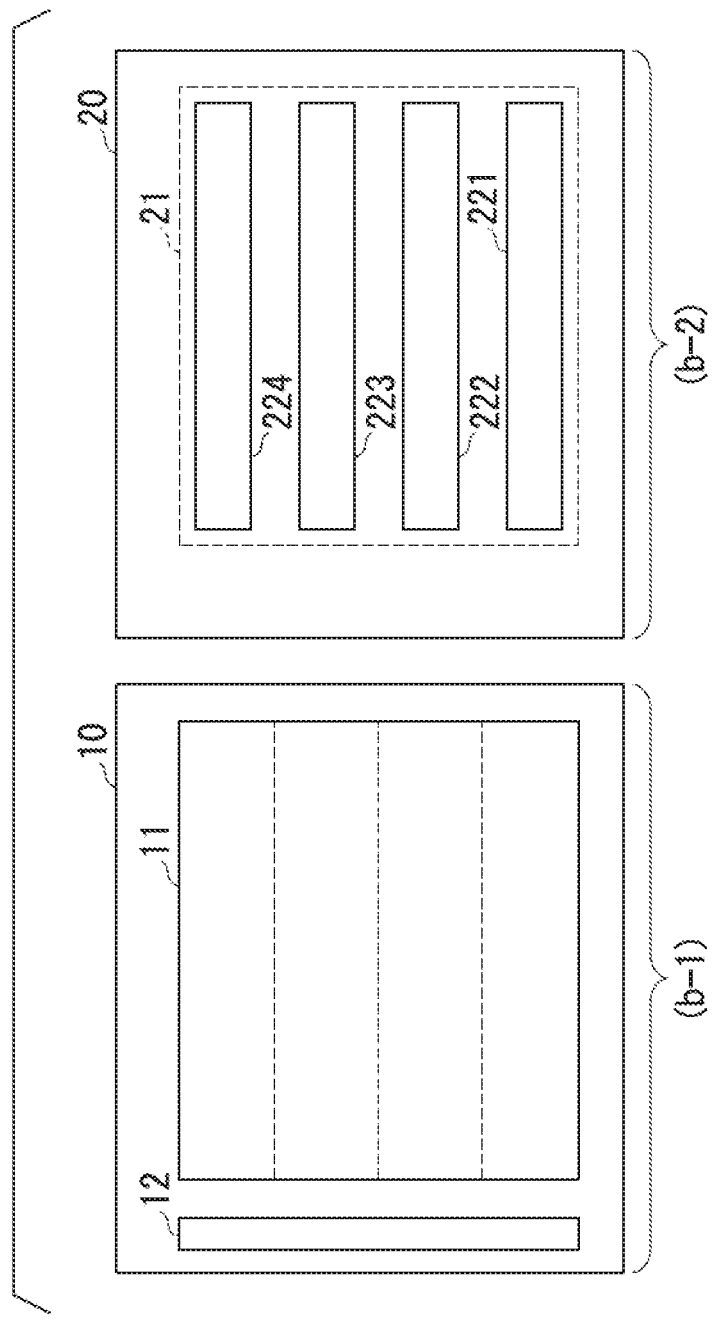
FIG. 2B is an overview diagram illustrating a schematic configuration of the solid-state image pickup device mounted in the image pickup apparatus of the present embodiment.

Next, the solid-state image pickup device 1 mounted in the image pickup apparatus 8 of the present embodiment will be described. FIGS. 2A and 2B are overview diagrams illustrating a schematic configuration of the solid-state image pickup device 1 mounted in the image pickup apparatus 8 of the present embodiment. The solid-state image pickup device 1 includes a first substrate 10, a second substrate 20, and an inter-substrate connecting portion 30. FIG. 2A shows a side view of the solid-state image pickup device 1, and 2B shows a plan view of each of the substrates constituting the solid-state image pickup device 1.

As shown in FIG. 2A, the solid-state image pickup device 1 has a configuration in which two substrates (chips) of the first substrate 10 and the second substrate 20 are laminated, and the first substrate 10 and the second substrate 20 are bonded (connected) to each other by the inter-substrate connecting portion 30.

A pixel array part 11 is formed in the first substrate 10, the pixel array part having a plurality of pixels (hereinafter, referred to as "unit pixels") that outputs a pixel signal based on incident subject light (visible light) being disposed in a two-dimensional matrix. In addition, the first substrate 10 includes a vertical readout circuit that reads out a pixel signal for each column from each unit pixel formed within the pixel array part 11 and outputs the read-out signal to the second substrate 20.

The second substrate 20 includes a plurality of column circuits that process the pixel signal, output by each unit pixel formed within the pixel array part 11 of the first substrate 10, for each column of the unit pixel, and has a signal processing circuit part 21 formed therein, the circuit part outputting the pixel signal processed by each column circuit, as an image signal, to the outside for each row of the unit pixel.

The inter-substrate connecting portion 30 is a connecting portion for electrically connecting a component within the first substrate 10 and a component within the second substrate 20. The components disposed in the first substrate 10 and the second substrate 20 which are bonded to each other transmit and receive each electrical signal through each of the inter-substrate connecting portions 30 corresponding thereto.

The first substrate 10 is a backside illumination (BSI)-type silicon substrate in which subject light (visible light) is incident on the unit pixel formed within the pixel array part 11 from the opposite side of a wiring layer. As shown in (b-1) of FIG. 2B, the first substrate 10 includes the pixel array part 11 and a vertical readout circuit 12.

As described above, the pixel array part 11 is a pixel part in which a plurality of unit pixels are disposed in a two-dimensional matrix. Each of the unit pixels within the pixel array part 11 includes a photoelectric conversion part that generates and accumulates signal charge based on the incident subject light (visible light) and an amplification part that amplifies the signal charge accumulated by this photoelectric conversion part to output the amplified signal charge as a pixel signal. Each of the unit pixels outputs the pixel signal based on the subject light amplified by the amplification part to a corresponding column circuit included within the signal processing circuit part 21 of the second substrate 20 through the inter-substrate connecting portion 30, in accordance with a control signal which is input from the vertical readout circuit 12. The details of this unit pixel will be described later.

The vertical readout circuit 12 drives each of the unit pixels within the pixel array part 11, and causes a corresponding column circuit included within the signal processing circuit part 21 of the second substrate 20 to read out (output) the pixel signal based on the subject light generated and accumulated by each of the unit pixels. The vertical readout circuit 12 outputs a control signal for driving a unit pixel for each row of the unit pixels disposed in the pixel array part 11.

As shown in (b-2) of FIG. 2B, the second substrate 20 includes the signal processing circuit part 21. As described above, the signal processing circuit part 21 includes the plurality of column circuits that correspond to each column of the unit pixels disposed within the pixel array part 11, and output a pixel signal after processing for which a process set in advance has been performed on each of the pixel signals which are sequentially input from corresponding unit pixels. In addition, the signal processing circuit part 21 includes a horizontal readout circuit that sequentially reads out the image signal processed by the column circuit corresponding to each of the unit pixels of each column disposed within the pixel array part 11, for each row of the unit pixels disposed within the pixel array part 11 to output the read-out image signal to the outside.

In the solid-state image pickup device 1, each of the unit pixels disposed within the pixel array part 11 is divided into a plurality of regions (groups) in a form of multiple rows of sets. Therefore, in the solid-state image pickup device 1, a vertical signal line for outputting a pixel signal to a corresponding column circuit included within the signal processing circuit part 21 from each of the unit pixels is divided into multiple parts. Therefore, in the solid-state image pickup device 1, the vertical readout circuit 12 can cause the unit pixels belonging to each group to simultaneously output the pixel signals to the corresponding column circuits. That is, the vertical readout circuit 12 can output not only a control signal for sequentially driving each unit pixel for each row to sequentially output the pixel signal from each group, but also a control signal for simultaneously driving the unit pixels within a plurality of groups to simultaneously output the pixel signals from each group. Therefore, in the solid-state image pickup device 1, the signal processing circuit part 21 is configured to correspond to each group of the unit pixel. More specifically, signal processing circuits (hereinafter, referred to as "group signal processing circuits") forming a set of a plurality of column circuits and one horizontal readout circuit corresponding to each column of the unit pixel are provided by the number of groups. In the solid-state image pickup device 1, the inter-substrate connecting portion 30 for transmitting the pixel signal output by each unit pixel to the corresponding group signal processing circuit is disposed for each divided vertical signal line.

FIGS. 2A and 2B show a configuration in which each of the unit pixels disposed within the pixel array part 11 is divided into four groups, that is, the vertical signal line within the pixel array part 11 is divided four. In addition, (b-2) of FIG. 2B shows a case where four group signal processing circuits 221 to 224 corresponding to the groups of the unit pixels, respectively, disposed within the pixel array part 11 are included within the signal processing circuit part 21. In addition, FIG. 2A shows a case where the inter-substrate connecting portion 30 for connection to the column circuit included in each of the corresponding group signal processing circuits 221 to 224 is disposed for each group of the unit pixels obtained by dividing the vertical signal line, that is, the inter-substrate connecting portion 30 is disposed for each of the divided vertical signal lines.

An example of the inter-substrate connecting portion 30 to be used includes a microbump created using an evaporation method or a plating method, for example, a through-silicon-via (TSV), a structure in which connection is performed by a metal wiring layer, or the like. However, in the solid-state image pickup device 1, considering that the inter-substrate connecting portion 30 is disposed within a region of the pixel array part 11, it is preferable that a microbump be used. In this case, an insulating member such as an adhesive may be filled into a space present between the first substrate 10 and the second substrate 20.

The inter-substrate connecting portion 30 may be used which has a plurality of structures based on a position at which a component within the first substrate 10 and a component within the second substrate 20 are connected to each other, that is, a position at which the inter-substrate connecting portion 30 is formed. For example, in the configuration shown in FIG. 2A, it is also possible to form a configuration in which a microbump is used as the inter-substrate connecting portion 30 that electrically connects a component within the pixel array part 11 formed in the first substrate 10 and a component within the signal processing circuit part 21 formed in the second substrate 20, and a through-silicon-via is used as the inter-substrate connecting portion 30 that electrically connects a component other than the pixel array part 11 and a component other than the signal processing circuit part 21.

With such a configuration, in the solid-state image pickup device 1, each of the unit pixels disposed within the pixel array part 11 is divided into a plurality of groups, and the vertical signal line within the pixel array part 11 is divided into multiple parts. Thereby, in the solid-state image pickup device 1, it is possible to reduce the length of each vertical signal line, and to reduce the number of unit pixels connected to each vertical signal line. Thereby, in the solid-state image pickup device 1, it is possible to reduce the load of each vertical signal line. Thereby, in the solid-state image pickup device 1, it is possible to realize a speed-up in readout of the pixel signal from each unit pixel to a corresponding column circuit and a reduction in power consumption, without increasing the current value of a pixel load current source corresponding to each unit pixel, and without increasing the size of a transistor of the amplification part.

Further, in the solid-state image pickup device 1, since the first substrate 10 having the pixel array part 11 formed therein and the second substrate 20 having the signal processing circuit part 21 formed therein are configured to be laminated, there is no limitation to the number of vertical signal lines to be divided as in the configuration in which the load of the vertical signal line is reduced in the solid-state image pickup device of the related art, and the vertical signal line can be divided into a suitable number. Thereby, in the solid-state image pickup device 1, it is possible to reduce the load of each vertical signal line without increasing a chip area, and to realize a speed-up in readout of the pixel signal from each unit pixel to a corresponding column circuit and a reduction in power consumption.

In the solid-state image pickup device 1, the pixel signals are simultaneously output from the unit pixel belonging to each group to a corresponding signal processing circuit part 21 (any of the group signal processing circuit 221 to the group signal processing circuit 224), and thus it is possible to simultaneously output the image signals from each of the group signal processing circuit 221 to the group signal processing circuit 224. More specifically, the vertical read-out circuit 12 simultaneously outputs control signals for reading out the pixel signal from each unit pixel to output the read-out signal to a corresponding column circuit, to the respective unit pixels belonging to different groups, that is, simultaneously outputs the pixel signals from the unit pixels of different rows disposed in the pixel array part 11 to corresponding column circuits. The image signals obtained by processing each pixel signal input from the unit pixel of a corresponding group are simultaneously output to the outside from each of the group signal processing circuit 221 to the group signal processing circuit 224. Thereby, in the configuration of the solid-state image pickup device 1 shown in FIGS. 2A and 2B, four rows' worth of image signals can be simultaneously output to the outside. Thereby, in the solid-state image pickup device 1, it is possible to realize a speed-up in output of the image signal.

In this manner, in the solid-state image pickup device 1, the load of each vertical signal line is reduced, and thus it is possible to achieve both a speed-up in readout of the pixel signal from each unit pixel to a corresponding column circuit and a reduction in power consumption, and the speed-up of the solid-state image pickup device 1 based on the image signals processed by each of the column circuits being output in parallel.

First Embodiment

Figure 3:
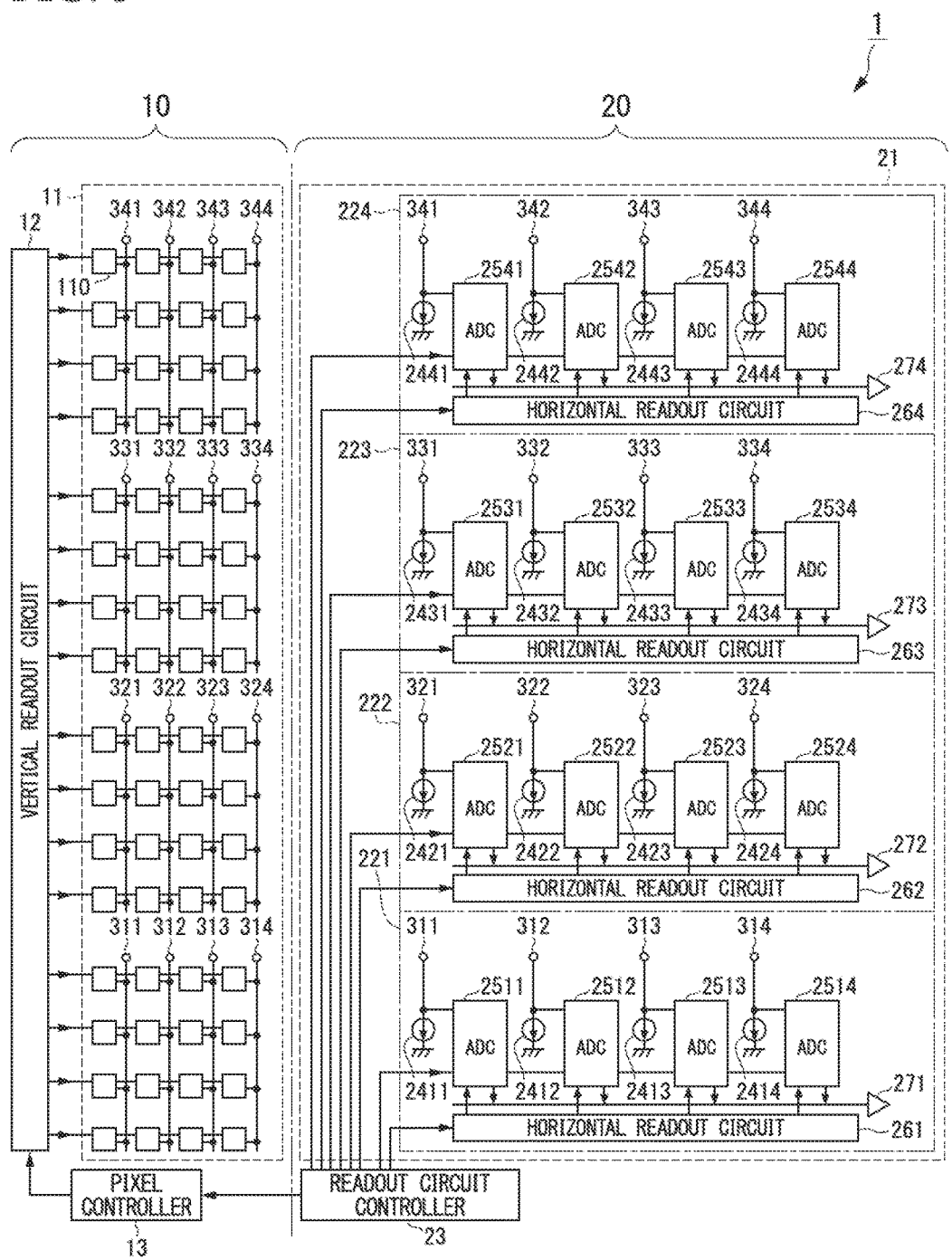
FIG. 3 is a block diagram illustrating a schematic configuration of a solid-state image pickup device according to a first embodiment of the present invention.

Next, an example of the more detailed configuration of the solid-state image pickup device 1 mounted in the image pickup apparatus 8 of the present embodiment will be described. FIG. 3 is a block diagram illustrating a schematic configuration of the solid-state image pickup device 1 according to the first embodiment. The solid-state image pickup device 1 of the first embodiment shown in FIG. 3 includes the first substrate 10 including the pixel array part 11, the vertical readout circuit 12, and the pixel controller 13, and the second substrate 20 including the signal processing circuit part 21 and a readout circuit controller 23.

The pixel array part 11 is configured such that unit pixels 110 are disposed in a two-dimensional matrix of sixteen rows and four columns, and that each of the unit pixels 110 disposed is divided into four groups. The pixel array part 11 is configured such that each vertical signal line correspond-ing to the unit pixels 110 disposed for each column is divided into four. More specifically, the pixel array part 11 is configured such that all the unit pixels 110 disposed are divided into a first group to a fourth group for every four rows and four columns, and that the vertical signal line corresponding to the unit pixel 110 the same one row is divided into four.

In addition, the signal processing circuit part 21 includes four group signal processing circuits 221 to 224 corresponding to the first group to the fourth group, respectively, of the unit pixels 110 divided in the pixel array part 11. Each of the group signal processing circuit 221 to the group signal processing circuit 224 includes pixel load current sources and column circuits having the number corresponding to the number of rows of the unit pixels 110 disposed within the pixel array part 11, and a horizontal readout circuit and an output part common to the respective column circuits. That is, each of the group signal processing circuit 221 to the group signal processing circuit 224 includes four pixel load current sources and four column circuits corresponding to each column of the unit pixels 110 disposed in four rows within the pixel array part 11, and one horizontal readout circuit and one output part.

More specifically, the group signal processing circuit 221 corresponding to the first group in the pixel array part 11 includes four pixel load current sources (pixel load current source 2411 to pixel load current source 2414) corresponding to the unit pixels 110 of four rows, respectively, belonging to the first group, four column circuits (column circuit 2511 to column circuit 2514), a horizontal readout circuit 261, and an output part 271. In addition, the group signal processing circuit 222 corresponding to the second group in the pixel array part 11 includes four pixel load current sources (pixel load current source 2421 to pixel load current source 2424) corresponding to the unit pixels 110 of four rows, respectively, belonging to the second group, four column circuits (column circuit 2521 to column circuit 2524), a horizontal readout circuit 262, and an output part 272. In addition, the group signal processing circuit 223 corresponding to the third group in the pixel array part 11 includes four pixel load current sources (pixel load current source 2431 to pixel load current source 2434) corresponding to the unit pixels 110 of four rows, respectively, belonging to the third group, four column circuits (column circuit 2531 to column circuit 2534), a horizontal readout circuit 263, and an output part 273. In addition, the group signal processing circuit 224 corresponding to the fourth group in the pixel array part 11 includes four pixel load current sources (pixel load current source 2441 to pixel load current source 2444) corresponding to the unit pixels 110 of four rows, respectively, belonging to the fourth group, four column circuits (column circuit 2541 to column circuit 2544), a horizontal readout circuit 264, and an output part 274.

In the following description, in a case where the group signal processing circuit 221, the group signal processing circuit 222, the group signal processing circuit 223, and the group signal processing circuit 224 are not distinguished from each other, these circuits are referred to as the "group signal processing circuits 22". In addition, in a case where the pixel load current source 2411 to the pixel load current source 2414 within the group signal processing circuit 221 are not distinguished from each other, these sources are referred to as the "pixel load current sources 241". In addition, in a case where the pixel load current source 2421 to the pixel load current source 2424 within the group signal processing circuit 222 are not distinguished from each other, these circuits are referred to as the "pixel load current sources 242". In addition, in a case where the pixel load current source 2431 to the pixel load current source 2434 within the group signal processing circuit 223 are not distinguished from each other, these circuits are referred to as the "pixel load current sources 243". In addition, in a case where the pixel load current source 2441 to the pixel load current source 2444 within the group signal processing circuit 224 are not distinguished from each other, these circuits are referred to as the "pixel load current sources 244". In addition, in a case where the pixel load current source 2411 to the pixel load current source 2414 within the group signal processing circuit 221, the pixel load current source 2421 to the pixel load current source 2424 within the group signal processing circuit 222, the pixel load current source 2431 to the pixel load current source 2434 within the group signal processing circuit 223, and the pixel load current source 2441 to the pixel load current source 2444 within the group signal processing circuit 224 are not distinguished from each other, these sources are referred to as the "pixel load current sources 24".

In addition, in the following description, in a case where the column circuit 2511 to the column circuit 2514 within the group signal processing circuit 221 are not distinguished from each other, these circuits are referred to as the "column circuits 251". In addition, in a case where the column circuit 2521 to the column circuit 2524 within the group signal processing circuit 222 are not distinguished from each other, these circuits are referred to as the "column circuits 252". In addition, in a case where the column circuit 2531 to the column circuit 2534 within the group signal processing circuit 223 are not distinguished from each other, these circuits are referred to as the "column circuits 253". In addition, in a case where the column circuit 2541 to the column circuit 2544 within the group signal processing circuit 224 are not distinguished from each other, these circuits are referred to as the "column circuits 254". In addition, in a case where the column circuit 2511 to the column circuit 2514 within the group signal processing circuit 221, the column circuit 2521 to the column circuit 2524 within the group signal processing circuit 222, the column circuit 2531 to the column circuit 2534 within the group signal processing circuit 223, and the column circuit 2541 to the column circuit 2544 within the group signal processing circuit 224 are not distinguished from each other, these circuits are referred to as the "column circuits 25".

In addition, in the following description, in a case where the horizontal readout circuit 261 within the group signal processing circuit 221, the horizontal readout circuit 262 within the group signal processing circuit 222, the horizontal readout circuit 263 within the group signal processing circuit 223, and the horizontal readout circuit 264 within the group signal processing circuit 224 are not distinguished from each other, these circuits are referred to as the "horizontal readout circuits 26". In addition, in a case where the output part 271 within the group signal processing circuit 221, the output part 272 within the group signal processing circuit 222, the output part 273 within the group signal processing circuit 223, and the output part 274 within the group signal processing circuit 224 are not distinguished from each other, these output parts are referred to as the "output parts 27".

Each of the unit pixels 110 within the pixel array part 11 outputs the pixel signal based on the incident subject light to a corresponding vertical signal line, in accordance with the control signal which is input from the vertical readout circuit 12. Each of the vertical signal lines corresponding to the unit pixels 110 of the same one row within each group is connected to a pixel load current source and a column circuit within each of the corresponding group signal processing circuits 22 through each of the corresponding inter-substrate connecting portions 30.

More specifically, the vertical signal line to which four unit pixels 110 of the first column of the first group are connected is connected to the corresponding pixel load current source 2411 and the corresponding column circuit 2511 in the group signal processing circuit 221, through the inter-substrate connecting portion 311. Similarly, each vertical signal line to which four unit pixels 110 of the second to fourth rows of the first group are connected is connected to the corresponding pixel load current sources 2412 to 2414 and the corresponding column circuits 2512 to 2514 in the group signal processing circuit 221, through each of the inter-substrate connecting portion 312 to the inter-substrate connecting portion 314.

Similarly, each vertical signal line to which four unit pixels 110 of the first to four rows of the second group are connected is connected to the corresponding pixel load current sources 2421 to 2424 and the corresponding column circuits 2521 to 2524 in the group signal processing circuit 222, through each of the inter-substrate connecting portion 321 to the inter-substrate connecting portion 324. Similarly, each vertical signal line to which four unit pixels 110 of the first to four rows of the third group are connected is connected to the corresponding pixel load current sources 2431 to 2434 and the corresponding column circuits 2531 to 2534 in the group signal processing circuit 223, through each of the inter-substrate connecting portion 331 to the inter-substrate connecting portion 334. Similarly, each vertical signal line to which four unit pixels 110 of the first to four rows of the fourth group are connected is connected to the corresponding pixel load current sources 2441 to 2444 and the corresponding column circuits 2541 to 2544 in the group signal processing circuit 224, through each of the inter-substrate connecting portion 341 to the inter-substrate connecting portion 344.

The pixel load current source 24 within each of the group signal processing circuits 22 is a current source which is configured such that one end thereof is connected to the ground of the group signal processing circuit 22, and that the other end thereof is connected to a corresponding vertical signal line. The pixel load current source 24 operates as the load of a transistor of an amplification part included within the unit pixel 110 connected to the corresponding vertical signal line.

The column circuit 25 within each of the group signal processing circuits 22 is a processing circuit that performs a process set in advance on each pixel signal which is sequentially input from the unit pixel 110 connected to the corresponding vertical signal line, in accordance with control from the readout circuit controller 23. Each of the column circuits outputs an output signal after having performed a process on the input pixel signal, to a corresponding output part 27, in accordance with control from the horizontal readout circuit 26 within the group signal processing circuit 22.

It is considered that an example of the column circuit 25 includes a correlated double sampling (CDS) circuit that performs noise suppression or the like on a pixel signal, an amplifier circuit that amplifies a pixel signal, an analog-digital converter circuit that performs analog-digital conversion on a pixel signal (analog signal) to output a digital signal based on the magnitude of the pixel signal, or the like. FIG. 3 shows a case where each of the column circuits 25 included in the solid-state image pickup device 1 of the first embodiment is an analog-digital converter circuit (ADC).

The analog-digital converter circuit may include, for example, a function of performing CDS processing.

The horizontal readout circuit 26 within each of the group signal processing circuits 22 sequentially reads out output signals after processing which are output from the corresponding column circuit 25, and sequentially outputs the read-out signals to the output part 27.

The output part 27 within each of the group signal processing circuits 22 outputs the output signals after processing which are sequentially input from the corresponding column circuit 25 by the horizontal readout circuit 26, as image signals, to the outside of the solid-state image pickup device 1.

The readout circuit controller 23 controls the pixel controller 13 included in the first substrate 10, and the column circuit 25 and the horizontal readout circuit 26 included in each of the group signal processing circuits 22 within the signal processing circuit part 21, in accordance with an operating mode when the solid-state image pickup device 1 reads out a pixel signal to output the read-out signal as an image signal. The details of an operating mode in which the solid-state image pickup device 1 outputs an image signal will be described later.

The pixel controller 13 controls a method of causing the vertical readout circuit 12 to drive each of the unit pixels 110 within the pixel array part 11 and read out a pixel signal, in accordance with control from the readout circuit controller 23, that is, in accordance with an operating mode when the solid-state image pickup device 1 reads out a pixel signal and outputs the read-out signal as an image signal.

The vertical readout circuit 12 drives each of the unit pixels 110 within the pixel array part 11 in accordance with control from the pixel controller 13, and outputs the pixel signal of each of the unit pixels 110 to a corresponding vertical signal line. As described above, the vertical readout circuit 12 can not only sequentially drive each of the unit pixels 110 included in the pixel array part 11, but also simultaneously drives the unit pixels 110 within a plurality of groups.

With such a configuration, in the solid-state image pickup device 1 of the first embodiment, each of the unit pixels 110 disposed within the pixel array part 11 is divided into four groups (first group to fourth group), that is, the vertical signal line within the pixel array part 11 is divided into four. Thereby, the length of each vertical signal line is reduced, and the number of unit pixels 110 connected to each vertical signal line is reduced to ¼. That is, in the solid-state image pickup device 1 of the first embodiment, the load of each divided vertical signal line is reduced to ¼ of the load of the vertical signal line of one column in the solid-state image pickup device of the related art. Thereby, in the solid-state image pickup device 1 of the first embodiment, it is possible to realize a speed-up in readout of the pixel signal from each of the unit pixels 110 to a corresponding column circuit 25 and a reduction in power consumption, without increasing the current value of the pixel load current source 24 corresponding to each of the unit pixels 110, and without increasing the size of a transistor of the amplification part included within the unit pixel 110.

In addition, the solid-state image pickup device 1 according to the first embodiment includes the group signal processing circuit 22, that is, the pixel load current source 24, the column circuit 25, the horizontal readout circuit 26, and the output part 27, for each of the vertical signal lines divided in the pixel array part 11. Thereby, in the solid-state image pickup device 1 of the first embodiment, the pixel signals are simultaneously output from the unit pixels 110 belonging to each group to the corresponding group signal processing circuits 221 to 224, and thus it is possible to simultaneously output the image signals from each of the group signal processing circuit 221 to the group signal processing circuit 224. That is, in the solid-state image pickup device 1 of the first embodiment, it is possible to simultaneously output four rows' worth of image signals to the outside. Thereby, in the solid-state image pickup device 1 of the first embodiment, it is possible to realize a speed-up in output of the image signal.

In this manner, in the solid-state image pickup device 1 of the first embodiment, it is possible to achieve both a speed-up in readout of the pixel signal from unit pixel 110 to the column circuit 25 and a reduction in power consumption based on a reduction in the load of each vertical signal line, and the speed-up of the solid-state image pickup device 1 based on the image signals processed by each of the column circuits 25 being output in parallel.

Figure 4:
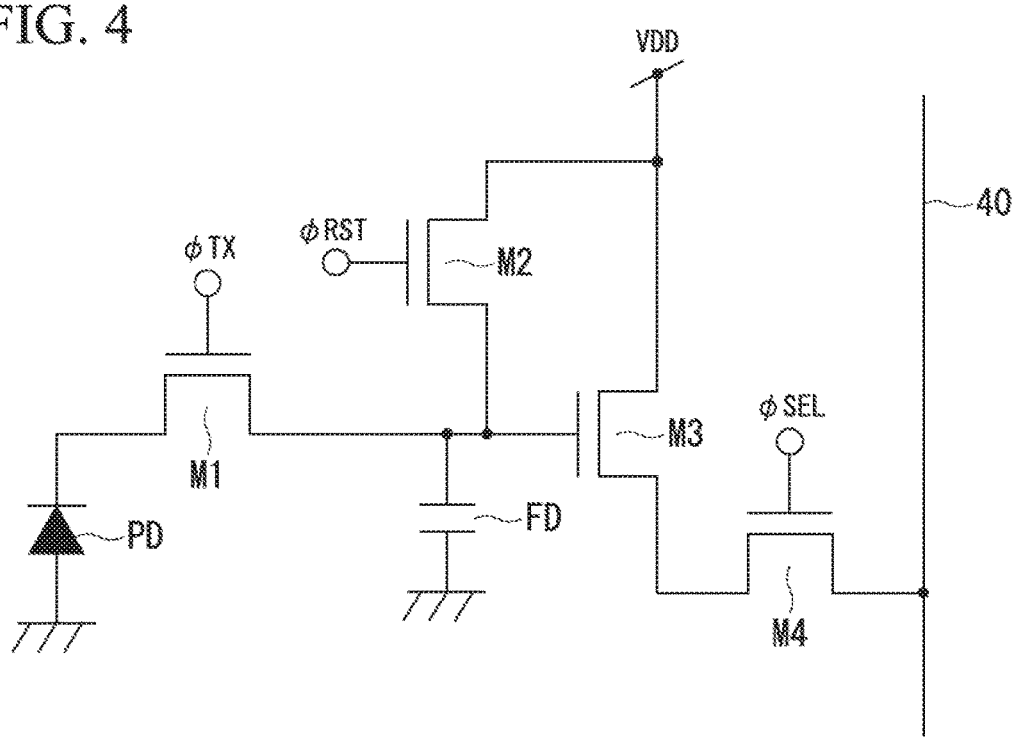
FIG. 4 is a circuit diagram illustrating a schematic configuration of a unit pixel within a pixel array part of the solid-state image pickup device of the first embodiment.

Next, the unit pixels 110 included in the pixel array part 11 within the solid-state image pickup device 1 of the first embodiment will be described. FIG. 4 is a circuit diagram illustrating a schematic configuration of the unit pixel 110 within the pixel array part 11 of the solid-state image pickup device 1 of the first embodiment. FIG. 4 shows one unit pixel 110.

In FIG. 4, the unit pixel 110 includes a photoelectric conversion part PD, a transfer transistor M1, a charge accumulation unit FD, a pixel reset transistor M2, an amplification transistor M3, and a selection transistor M4. The unit pixel 110 converts incident subject light (visible light) into a pixel signal, and outputs the converted signal to the vertical signal line 40.

The photoelectric conversion part PD photoelectrically converts the incident subject light to generate signal charge, and accumulates the generated signal charge as a photoelectric conversion signal.

The transfer transistor M1 transfers the photoelectric conversion signal accumulated in the photoelectric conversion part PD to the gate terminal of the amplification transistor M3, in accordance with a control signal φTX which is input from the vertical readout circuit 12. Thereby, the photoelectric conversion signal accumulated in the photoelectric conversion part PD and transferred by the transfer transistor M1 is accumulated in the charge accumulation unit FD.

The charge accumulation unit FD is a capacitor associated with a node connected to the gate terminal of the amplification transistor M3, and is denoted by a symbol of a capacitor in the schematic configuration of the unit pixel 110 shown in FIG. 4.

The amplification transistor M3 outputs a signal voltage based on the photoelectric conversion signal transferred to the gate terminal by the transfer transistor M1, that is, the photoelectric conversion signal accumulated in the charge accumulation unit FD. In this case, the amplification transistor M3 outputs a signal voltage obtained by amplifying the photoelectric conversion signal accumulated in the charge accumulation unit FD, in accordance with the current value of the pixel load current source 24 connected to the corresponding vertical signal line 40 through a corresponding inter-substrate connecting portion 30.

The selection transistor M4 outputs the signal voltage which is output from the amplification transistor M3, as a pixel signal, to the vertical signal line 40, in accordance with a control signal φSEL which is input from the vertical readout circuit 12. Thereby, the pixel signal based on the photoelectric conversion signal generated and accumulated by the photoelectric conversion part PD is read out to the vertical signal line 40.

The pixel reset transistor M2 resets the photoelectric conversion signal within the unit pixel 110 to a power supply voltage VDD, in accordance with a control signal φRST which is input from the vertical readout circuit 12.

With such a configuration, the pixel signal based on the photoelectric conversion signal obtained by photoelectrically converting the incident subject light by the photoelectric conversion part PD within the unit pixel 110 is input to a corresponding column circuit 25 through a corresponding inter-substrate connecting portion 30.

The operation of the unit pixel 110 shown in FIG. 4 is the same as the operation of a unit pixel disposed in a general solid-state image pickup device. Therefore, a detailed description of the operation of the unit pixel 110 will not be given.

Figure 5A:
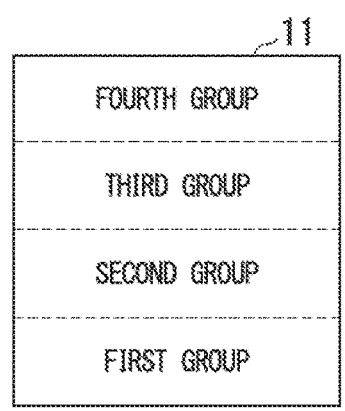
FIG. 5A is a diagram illustrating a method of reading out a pixel signal in the solid-state image pickup device of the first embodiment.
Figure 5B:
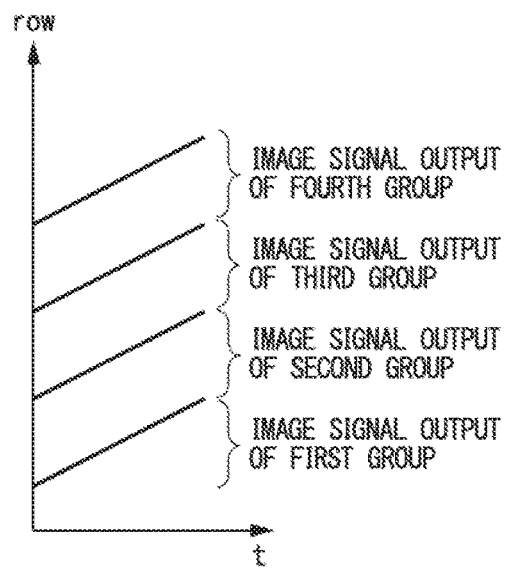
FIG. 5B is a diagram illustrating a method of reading out a pixel signal in the solid-state image pickup device of the first embodiment.
Figure 5C:
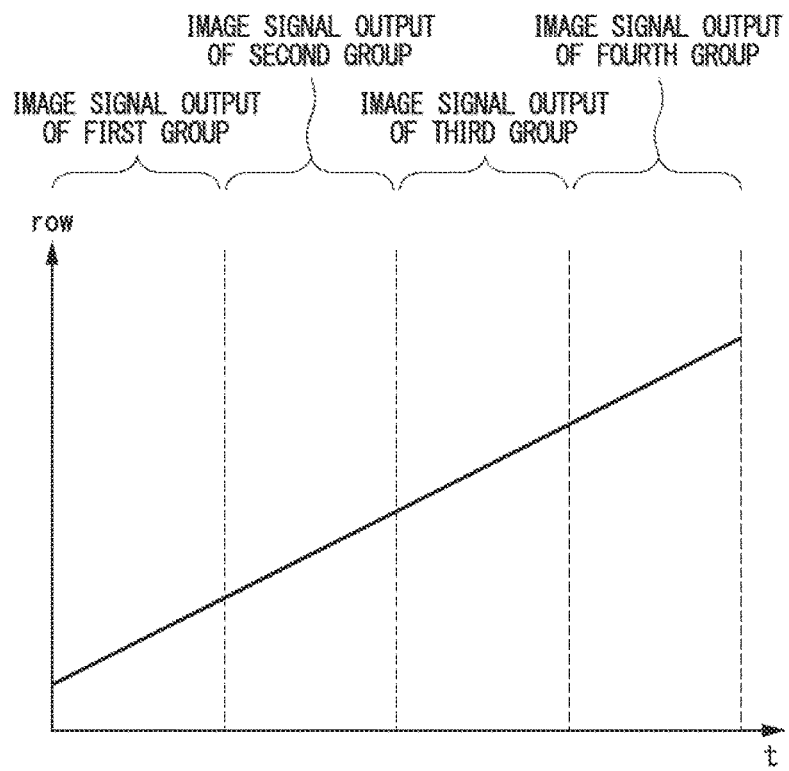
FIG. 5C is a diagram illustrating a method of reading out a pixel signal in the solid-state image pickup device of the first embodiment.

Next, an operating mode will be described in which the solid-state image pickup device 1 of the first embodiment reads out a pixel signal to output the read-out signal as an image signal. FIG. 5A to FIG. 5C are diagrams illustrating a method of reading out a pixel signal in the solid-state image pickup device 1 of the first embodiment. FIG. 5A shows regions of the first group to the fourth group in which all the unit pixels 110 disposed within the pixel array part 11 included in the solid-state image pickup device 1 are divided into four groups. In addition, FIGS. 5B and 5C schematically show the transition of a row of the unit pixels 110 that output a pixel signal in each operating mode of the solid-state image pickup device 1, that is, a row of the pixel array part 11 that performs an output as an image signal. In FIGS. 5B and 5C, the horizontal axis represents a time at which the solid-state image pickup device 1 outputs the image signal based on the pixel signal which is output by the each of the unit pixels 110, and the vertical axis represents a row of the unit pixels 110 in which the solid-state image pickup device 1 outputs the image signal based on the pixel signal.

As shown in FIG. 5A, in the solid-state image pickup device 1, regions of all the unit pixels 110 disposed within the pixel array part 11 are divided into four groups of the first group to the fourth group. In the solid-state image pickup device 1, the vertical readout circuit 12 can not only sequentially drive each of the unit pixels 110 included in the pixel array part 11, but also simultaneously drives the unit pixels 110 within a plurality of groups. Therefore, in the solid-state image pickup device 1, it is possible to output image signals in two operating modes of an operating mode (hereinafter, referred to as a "parallel operating mode") in which the unit pixels 110 within a plurality of groups are simultaneously driven and the image signals based on the pixel signals of a plurality of rows are output in parallel, and an operating mode (hereinafter, referred to as a "sequential operating mode") in which each of the unit pixels 110 included in the pixel array part 11 are sequentially driven and the image signals based on the pixel signals of each row are sequentially output. FIG. 5B schematically shows the transition of a row of the unit pixels 110 in the parallel operating mode, and FIG. 5C schematically shows the transition of a row of the unit pixels 110 in the sequential operating mode.

Switching between two operating modes, that is, the setting of the parallel operating mode or the sequential operating mode is performed by, for example, the camera control device 5 included in the image pickup apparatus 8. In the image pickup apparatus 8, the image signal processing device 3 that performs a process on the image signal which is output from the solid-state image pickup device 1 performs a process based on the operating mode of the solid-state image pickup device 1 which is set (switched) by the camera control device 5.

First, a method of reading out a pixel signal in the parallel operating mode shown in FIG. 5B will be described. The readout circuit controller 23 outputs a control signal indicating the output of an image signal in the parallel operating mode to the pixel controller 13. Thereby, the pixel controller 13 instructs the vertical readout circuit 12 to simultaneously drive the unit pixels 110 belonging to four groups and to sequentially read out the pixel signals. The vertical readout circuit 12 drives the unit pixels 110 of an initial row belonging to each of the first group to the fourth group in accordance with this instruction, and outputs each of the pixel signals to the group signal processing circuit 22 corresponding to each of the first group to the fourth group.

In addition, the readout circuit controller 23 causes each of the column circuits 25 within group signal processing circuit 22 to execute a process (here, analog digital conversion process) on the pixel signal which is output from the unit pixels 110 belonging to a corresponding group. In addition, the readout circuit controller 23 causes the horizontal readout circuit 26 within the group signal processing circuit 22 to sequentially output the output signals after processing which are output from each of the corresponding column circuits 25, to the output part 27.

Thereby, the image signals based on the pixel signals which are output by the unit pixels 110 of an initial row belonging to each of the first group to the fourth group, that is, four rows' worth of image signals output by the output part 27 within the group signal processing circuit 22 in parallel are simultaneously output to the outside.

Thereafter, the vertical readout circuit 12 drives the unit pixels 110 of the next row belonging to each of the first group to the fourth group, and outputs each of the pixel signals to the group signal processing circuit 22 corresponding to each of the first group to the fourth group. The readout circuit controller 23 executes a process by each of the column circuits 25 within the group signal processing circuit 22, and sequentially outputs the output signals after a process by the horizontal readout circuit 26 to the output part 27.

Thereby, four rows' worth of image signals based on the pixel signals output by the unit pixels 110 of the next row belonging to each of the first group to the fourth group are simultaneously output from the output part 27 within the group signal processing circuit 22.

Hereinafter, similarly, the vertical readout circuit 12 sequentially drives the unit pixels 110, for each row, belonging to each of the first group to the fourth group, and sequentially outputs each of the pixel signals to the group signal processing circuit 22 corresponding to each of the first group to the fourth group. In addition, the readout circuit controller 23 sequentially performs the process by each of the column circuits 25 within group signal processing circuit 22, and the output of the output signal after the process to the output part 27.

When the simultaneous output of the image signals based on the pixel signals, output by the unit pixels 110 of a final row belonging to each of the first group to the fourth group, from the output part 27 within the group signal processing circuit 22 is terminated, the solid-state image pickup device 1 completes the output of the image signals in the parallel operating mode.

In this manner, in the parallel operating mode, as shown in FIG. 5B, the image signals based on the pixel signals output by the unit pixels 110 belonging to each group of the first group to the fourth group are output in parallel. Thereby, in the parallel operating mode, it is possible to speed up the output of the image signal from the solid-state image pickup device 1.

In the parallel operating mode, the image signals based on the pixel signals output by the unit pixels 110 belonging to regions of each of the divided vertical signal lines, that is, each of the first group to the fourth group are output in parallel. Therefore, the parallel operating mode is preferably set in a case where subject light which is incident after the exposure of the solid-state image pickup device 1 is terminated is blocked by the mechanical shutter 7 included in the image pickup apparatus 8, or a case where a so-called global shutter method is adopted in which the photoelectric conversion signals output by the photoelectric conversion part PD within all the unit pixels 110 are simultaneously transferred by the transfer transistor M1.

Subsequently, a method of reading out a pixel signal in the sequential operating mode shown in FIG. 5C will be described. The readout circuit controller 23 outputs a control signal indicating the output of the image signal in the sequential operating mode to the pixel controller 13. Thereby, the pixel controller 13 instructs the vertical readout circuit 12 to sequentially drive the unit pixels 110 belonging to four groups, and to sequentially read out the pixel signals. The vertical readout circuit 12 drives the unit pixels 110 of an initial row belonging to the first group in accordance with this instruction, and outputs each of the pixel signals to the group signal processing circuit 221 corresponding to the first group.

In addition, the readout circuit controller 23 causes each of the column circuits 251 within the group signal processing circuit 221 to execute a process (here, analog digital conversion process) on the pixel signals which are output from the unit pixels 110 belonging to the corresponding first group. In addition, the readout circuit controller 23 causes the horizontal readout circuit 261 within the group signal processing circuit 221 to sequentially output the output signals after processing, output from each of the corresponding column circuits 251, to the output part 271.

Thereby, the image signals based on the pixel signals output by the unit pixels 110 of an initial row belonging to the first group are output to the outside from the output part 271 within the group signal processing circuit 221.

Thereafter, the vertical readout circuit 12 drives the unit pixels 110 of the next row belonging to the first group, and outputs each of the pixel signals to the group signal processing circuit 221 corresponding to the first group. The readout circuit controller 23 executes a process by each of the column circuits 251 within the group signal processing circuit 221, and sequentially outputs the output signals after a process by the horizontal readout circuit 261 to the output part 271.

Thereby, the image signals based on the pixel signals output by the unit pixels 110 of the next row belonging to the first group are output from the output part 271 within the group signal processing circuit 221.

Hereinafter, similarly, the vertical readout circuit 12 sequentially drives the unit pixels 110, for each row, belonging to the first group, and sequentially output each of the pixel signals to the group signal processing circuit 221 corresponding to the first group. In addition, the readout circuit controller 23 sequentially performs a process by each of the column circuits 251 within the group signal processing circuit 221, and the output of the output signal after the process to the output part 271.

Thereafter, after the driving of the unit pixels 110 of a final row belonging to the first group is terminated, the vertical readout circuit 12 continuously drives the unit pixels 110 of an initial row belonging to the second group, and outputs each of the pixel signals to the group signal processing circuit 222 corresponding to the second group.

In addition, the readout circuit controller 23 causes each of the column circuits 252 within the group signal processing circuit 222 to execute a process on the pixel signals which are output from the unit pixels 110 belonging to the corresponding second group, and causes the horizontal readout circuit 262 within the group signal processing circuit 222 to sequentially output the output signals after processing, output from each of the corresponding column circuits 252, to the output part 272.

Thereby, the image signals based on the pixel signals output by the unit pixels 110 of an initial row belonging to the second group are output to the outside from the output part 272 within the group signal processing circuit 222, subsequently to the pixel signals output by the unit pixels 110 of a final row of the first group.

Hereinafter, similarly, the vertical readout circuit 12 sequentially drives the unit pixels 110 belonging to the third group subsequently to the driving of the unit pixels 110 belonging to the second group, and further sequentially drives the unit pixels 110 belonging to the fourth group subsequently to the driving of the unit pixels 110 belonging to the third group, to sequentially output each of the pixel signals to a corresponding group signal processing circuit 22. In addition, the readout circuit controller 23 executes a process by each of the column circuits 25 within the group signal processing circuit 22 corresponding to the unit pixels 110 driven by the vertical readout circuit 12, and sequentially outputs the output signal after a process by the horizontal readout circuit 26 to the output part 27.

Thereby, subsequently to the output of the image signals based on the pixel signals, output by the unit pixels 110 of a final row belonging to the second group, from the output part 272 within the group signal processing circuit 222, the image signals based on the pixel signals output by the unit pixels 110 of an initial row belonging to the third group are sequentially output from the output part 273 within the group signal processing circuit 223. Further, subsequently to the output of the image signals based on the pixel signals, output by the unit pixels 110 of a final row belonging to the third group, from the output part 273 within the group signal processing circuit 223, the image signals based on the pixel signals output by the unit pixels 110 of an initial row belonging to the fourth group are sequentially output from the output part 274 within the group signal processing circuit 224.

When the output of the image signals based on the pixel signal, output by the unit pixels 110 of a final row belonging to the fourth group, from the output part 274 within the group signal processing circuit 224 is terminated, the solid-state image pickup device 1 completes the output of the image signals in the sequential operating mode.

In this manner, in the sequential operating mode, as shown in FIG. 5C, the image signals based on the pixel signals output by the unit pixels 110 belonging to each group of the first group to the fourth group are sequentially output from each of the group signal processing circuit 221 to the group signal processing circuit 224 corresponding to each of the unit pixels 110. Thereby, in the sequential operating mode, similarly to the solid-state image pickup device of the related art, it is possible to sequentially output the image signals based on the pixel signals output by all the unit pixels 110 disposed in the pixel array part 11. In this case, in the solid-state image pickup device 1, each of the unit pixels 110 disposed within the pixel array part 11 is divided into four groups and the vertical signal line is divided into four. Thereby, the length of each vertical signal line is reduced, and the number of unit pixels 110 connected to each vertical signal line is reduced to ¼. Therefore, in the solid-state image pickup device 1, the load of each divided vertical signal line is reduced to ¼ of the load of the vertical signal line of one row in the solid-state image pickup device of the related art, and thus power consumption when the image signal is output can be further reduced than in the solid-state image pickup device of the related art. Alternatively, in a case where the current value of the pixel load current source is set to be equal to that of the solid-state image pickup device of the related art, it is possible to further speed up readout from the pixel to the column circuit.

In addition, in the sequential operating mode, since the image signals are read out in a so-called rolling shutter system in which the image signals based on the pixel signals output by the unit pixels 110 belonging to each group are sequentially output across regions of the respective divided vertical signal lines, that is, the first group to the fourth group, the distortion of a subject becomes uniform in a column direction. Therefore, in the image pickup apparatus 8 having the solid-state image pickup device 1 of the first embodiment mounted therein, when a moving image is generated on the basis of the image signals which are output in the sequential operating mode, it is possible to prevent a difference in level of subject distortion from occurring between the respective groups (regions).

According to the first embodiment, a solid-state image pickup device (solid-state image pickup device 1) is configured which is provided with a first substrate (first substrate 10) including a pixel part (pixel array part 11) in which a plurality of pixels (unit pixels 110) disposed in a two-dimensional matrix are divided into a plurality of groups (first group to fourth group) forming a set for each of a plurality of rows which are set in advance; and a second substrate (second substrate 20) including pixel load current sources (pixel load current sources 24) corresponding to vertical signal lines (vertical signal lines 40) to which a plurality of unit pixels 110 disposed in the same column within each group of the first group to the fourth group are connected, and column circuits (column circuits 25) that perform a process set in advance on a pixel signal which is output from the unit pixel 110 to a corresponding vertical signal line 40, for each column of the unit pixels 110 belonging to each group of the first group to the fourth group, and including a plurality of signal processing circuits (group signal processing circuits 22) that output the pixel signal processed by each of the column circuits 25, as an image signal, for each column of the unit pixels 110, so as to correspond to each of the first group to the fourth group. The first substrate 10 and the second substrate 20 are laminated. Each of the vertical signal lines 40 within each group of the first group to the fourth group, and each of the pixel load current sources 24 and the column circuits 25 corresponding to each of the vertical signal lines 40 within the group signal processing circuit 22 corresponding to each group of the first group to the fourth group are electrically connected to each other through each inter-substrate connecting portion (inter-substrate connecting portion 30) corresponding to each of the vertical signal lines 40.

In addition, according to the first embodiment, an image pickup apparatus (image pickup apparatus 8) is configured which includes a solid-state image pickup device 1 provided with a first substrate 10 including a pixel array part 11 in which a plurality of unit pixels 110 disposed in a two-dimensional matrix are divided into a plurality of groups (first group to fourth group) forming a set for each of a plurality of rows which are set in advance; and a second substrate 20 including pixel load current sources 24 corresponding to vertical signal lines 40 to which a plurality of unit pixels 110 disposed in the same column within each group of the first group to the fourth group are connected, and column circuits 25 that perform a process set in advance on a pixel signal which is output from the unit pixel 110 to a corresponding vertical signal line 40, for each column of the unit pixels 110 belonging to each group of the first group to the fourth group, and including a plurality of group signal processing circuits 22 that output the pixel signal processed by each of the column circuits 25, as an image signal, for each column of the unit pixels 110, so as to correspond to each of the first group to the fourth group. The first substrate 10 and the second substrate 20 are laminated. Each of the vertical signal lines 40 within each group of the first group to the fourth group, and each of the pixel load current sources 24 and the column circuits 25 corresponding to each of the vertical signal lines 40 within the group signal processing circuit 22 corresponding to each group of the first group to the fourth group are electrically connected to each other through each inter-substrate connecting portion 30 corresponding to each of the vertical signal lines 40.

In addition, according to the first embodiment, the image pickup apparatus 8 is configured which further includes a mechanical shutter (mechanical shutter 7) that controls the amount of light incident on the solid-state image pickup device 1. The light incident on the solid-state image pickup device 1 is blocked by the mechanical shutter 7 when the unit pixels 110 within each group of the first group to the fourth group are simultaneously driven, and the image signals based on the pixel signals output from the unit pixels 110 driven herein are output from the solid-state image pickup device 1 so as to be output from the group signal processing circuits 22 corresponding to each group of the first group to the fourth group in parallel.

As described above, the solid-state image pickup device 1 of the first embodiment is configured such that the first substrate 10 having the pixel array part 11 formed therein and the second substrate 20 having the signal processing circuit part 21 formed therein are laminated. Thereby, in the solid-state image pickup device 1 of the first embodiment, each of the unit pixels 110 disposed within the pixel array part 11 can be divided into a plurality of groups without being limited to the number. In the solid-state image pickup device 1 of the first embodiment, the vertical signal line to which the unit pixels 110 of the same column within the pixel array part 11 are connected can be divided into the number of groups into which the unit pixels 110 are divided. Thereby, in the solid-state image pickup device 1 of the first embodiment, it is possible to reduce the length of each vertical signal line, to reduce the number of unit pixels 110 connected to each vertical signal line, and to further reduce the load of each divided vertical signal line than the load of the vertical signal line of one column in the solid-state image pickup device of the related art. Thereby, in the solid-state image pickup device 1 of the first embodiment, it is possible to realize a speed-up in readout of the pixel signal from each of the unit pixels 110 to a corresponding column circuit 25 and a reduction in power consumption, without increasing the current value of the pixel load current source 24 corresponding to each of the unit pixels 110, and without increasing the size of the amplification transistor M3 included within the unit pixel 110.

When the vertical signal line of the pixel array part 11 is divided in the solid-state image pickup device 1 of the first embodiment, it is preferable that the numbers of unit pixels 110 connected to each vertical signal line be equal to each other. That is, when each of the unit pixels 110 disposed within the pixel array part 11 is divided into a plurality of groups in the solid-state image pickup device 1 of the first embodiment, it is preferable that the numbers of unit pixels 110 belonging to each group be equal to each other. In the solid-state image pickup device 1 of the first embodiment shown in FIGS. 2A to 5C, a configuration is shown in which the unit pixels 110 are divided into four groups, the length of each vertical signal line within the pixel array part 11 is reduced to ¼, the number of unit pixels 110 connected to each vertical signal line is reduced to ¼, and the load of each vertical signal line is reduced to ¼.

In addition, in the solid-state image pickup device 1 of the first embodiment, the group signal processing circuits 22 corresponding to each group are included within the second substrate 20. In the solid-state image pickup device 1 of the first embodiment, in the parallel operating mode, the pixel signals are simultaneously output to a corresponding group signal processing circuit 22 from the unit pixels 110 belonging to each group, and thus four rows' worth of image signals are simultaneously output to the outside from each of the group signal processing circuits 22. Thereby, in the solid-state image pickup device 1 of the first embodiment, it is possible to realize a speed-up in output of the image signal. In this case, in the solid-state image pickup device 1 of the first embodiment, since the load of each vertical signal line is reduced in each group, it is possible to realize a reduction in power consumption when the image signal is output. In addition, in the solid-state image pickup device 1 of the first embodiment, in the sequential operating mode, the pixel signals are sequentially output from the unit pixels 110 belonging to each group to a corresponding group signal processing circuit 22, and thus the image signals are sequentially output to the outside from each of the group signal processing circuits 22. Thereby, in the solid-state image pickup device 1 of the first embodiment, it is possible to realize a reduction in power consumption when the image signal is output, from the effect of reducing the load of each vertical signal line in each group.

In this manner, in the solid-state image pickup device 1 of the first embodiment, it is possible to achieve both speed-up and a reduction in power consumption by reducing the load of each vertical signal line.

Second Embodiment

Next, an example of another configuration of the solid-state image pickup device mounted in the image pickup apparatus 8 of the present embodiment will be described. A solid-state image pickup device according to the second embodiment is mounted in the image pickup apparatus 8, instead of the solid-state image pickup device 1 included in the image pickup apparatus 8 of the present embodiment shown in FIG. 1. In the following description, the solid-state image pickup device according to the second embodiment is referred to as a "solid-state image pickup device 100". The configuration of the solid-state image pickup device 100 according to the second embodiment includes the same configuration as that of the solid-state image pickup device 1 of the first embodiment shown in FIG. 3. Therefore, in the following description, in the respective components of the solid-state image pickup device 100 according to the second embodiment, the same components as those of the solid-state image pickup device 1 of the first embodiment are denoted by the same reference numerals and signs as those of the solid-state image pickup device 1, and thus a detailed description of each component will not be given.

Figure 6:
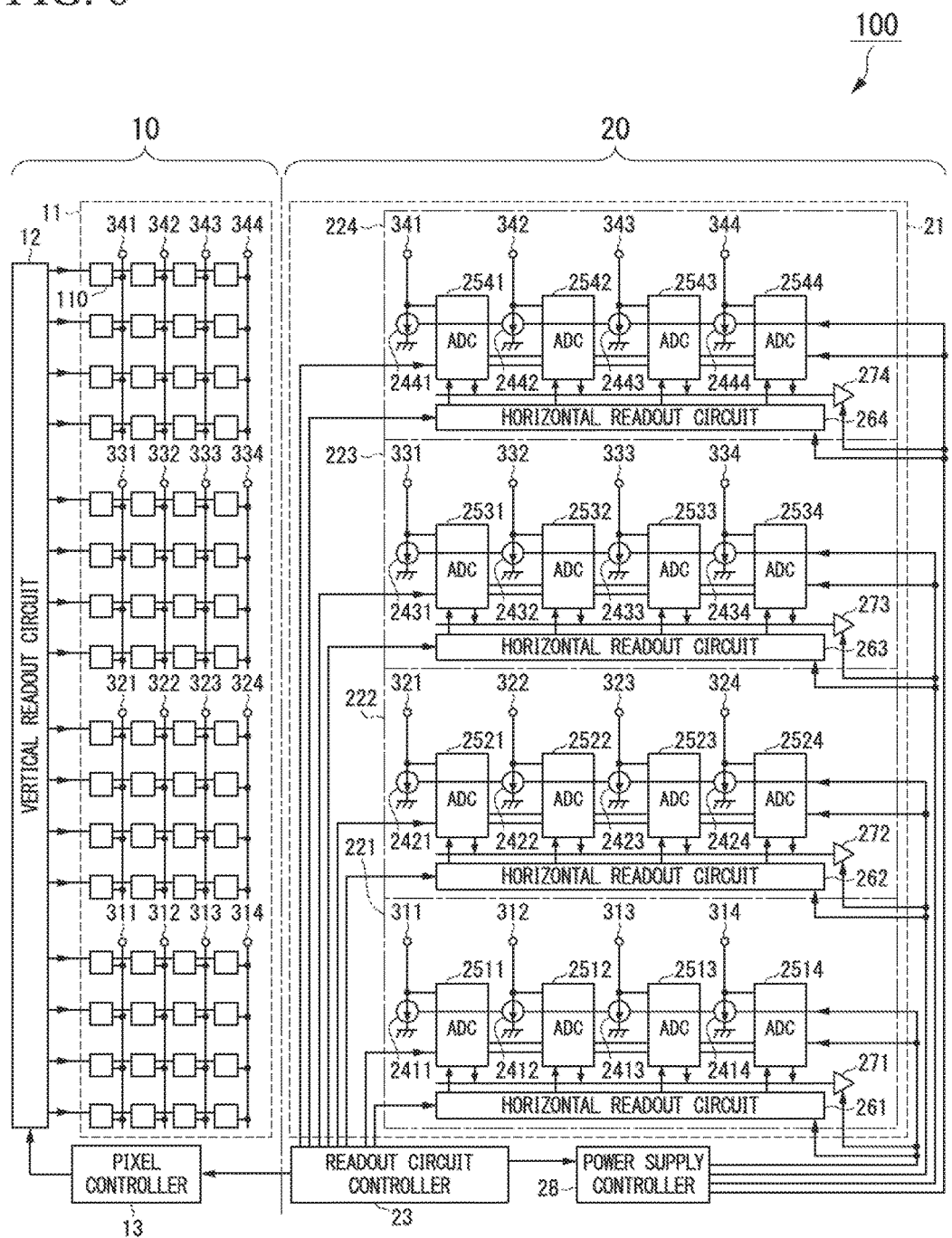
FIG. 6 is a block diagram illustrating a schematic configuration of a solid-state image pickup device according to a second embodiment of the present invention.

FIG. 6 is a block diagram illustrating a schematic configuration of the solid-state image pickup device 100 according to the second embodiment. Similarly to the solid-state image pickup device 1 of the first embodiment, the solid-state image pickup device 100 of the second embodiment is also configured such that two substrates (chips) of a first substrate 10 and a second substrate 20 are laminated, and that the first substrate 10 and the second substrate 20 are bonded (connected) to each other through an inter-substrate connecting portion 30. The solid-state image pickup device 100 of the second embodiment shown in FIG. 6 includes the first substrate 10 including a pixel array part 11, a vertical readout circuit 12, and a pixel controller 13, and the second substrate 20 including a signal processing circuit part 21, a readout circuit controller 23, and a power supply controller 28.

The solid-state image pickup device 100 of the second embodiment has a configuration in which the power supply controller 28 is added to the configuration of the solid-state image pickup device 1 of the first embodiment shown in FIG. 3. With the addition of this power supply controller 28, a function according to the power supply controller 28 is added to each corresponding component within the solid-state image pickup device 100 of the second embodiment. However, these components are the same as the respective components within the solid-state image pickup device 1 of the first embodiment, except for a function added corresponding to the power supply controller 28. That is, operations of these components are the same as the operations of the corresponding components within the solid-state image pickup device 1 of the first embodiment, except for an operation according to the added function. Therefore, in the following description, in order to facilitate the description, the components to which a function according to the power supply controller 28 is added are also denoted by the same reference numerals and signs as those of the solid-state image pickup device 1, and thus only operations according to the added function will be described.

The readout circuit controller 23 controls the pixel controller 13 included in the first substrate 10, and the column circuit 25 and the horizontal readout circuit 26 included in each of the group signal processing circuits 22 within the signal processing circuit part 21, in accordance with an operating mode when the solid-state image pickup device 100 reads out a pixel signal to output the read-out signal as an image signal. In addition, the readout circuit controller 23 controls the power supply controller 28 in accordance with the operating mode of the solid-state image pickup device 100.

The power supply controller 28 controls the power supply of the component of each of the group signal processing circuits 22 within the signal processing circuit part 21, in accordance with control from the readout circuit controller 23, that is, in accordance with the operating mode when the solid-state image pickup device 100 reads out a pixel signal to output the read-out signal as an image signal. That is, the power supply of a component within a group signal processing circuit 22 operating when the solid-state image pickup device 100 outputs a current image signal is set to be in an ON-state, and the power supply of a component within a group signal processing circuit 22 which does not operate is set to be in an OFF-state.

The control of turn-ON or turn-OFF of a power supply in the power supply controller 28 is performed by, for example, controlling a supply of a current to each component. More specifically, the power supply controller 28 supplies a current to a pixel load current source 24, a column circuit 25, a horizontal readout circuit 26, and an output part 27 included in a group signal processing circuit 22 operating when the solid-state image pickup device 100 outputs a current image signal, and stops a supply of a current to a pixel load current source 24, a column circuit 25, a horizontal readout circuit 26, and an output part 27 included in a group signal processing circuit 22 which does not operate in the output of the current image signal. Thereby, only a group signal processing circuit 22 that outputs an image signal operates. The details of the control of a power supply in each operating mode, that is, the control of turn-ON or turn-OFF of a power supply will be described later.

With such a configuration, in the solid-state image pickup device 100 of the second embodiment, similarly to the solid-state image pickup device 1 of the first embodiment, each of the unit pixels 110 disposed within the pixel array part 11 is divided into four groups of a first group to a fourth group, the length of each vertical signal line is reduced, and the number of unit pixels 110 connected to each vertical signal line is reduced to ¼. Thereby, in the solid-state image pickup device 100 of the second embodiment, similarly to the solid-state image pickup device 1 of the first embodiment, it is possible to achieve both a speed-up in readout of the pixel signal from the unit pixel 110 to the column circuit 25 and a reduction in power consumption based on a reduction in the load of each vertical signal line, and the speed-up of the solid-state image pickup device 100 based on the image signals processed by each of the column circuits 25 being output in parallel.

In addition, the solid-state image pickup device 100 according to the second embodiment includes the power supply controller 28. The power supply controller 28 controls the power supply of a component included in each of the group signal processing circuits 22, in accordance with the operating mode in which the solid-state image pickup device 100 reads out a pixel signal to output the read-out signal as an image signal. Thereby, current consumption of a component within a group signal processing circuit 22 which does not operate in the output of a current image signal is reduced, and this it is possible to realize a further reduction in power consumption of the solid-state image pickup device 100.

Figure 7A:
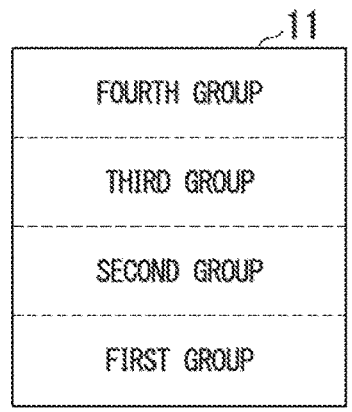
FIG. 7A is a diagram illustrating a method of reading out a pixel signal in the solid-state image pickup device of the second embodiment.
Figure 7B:
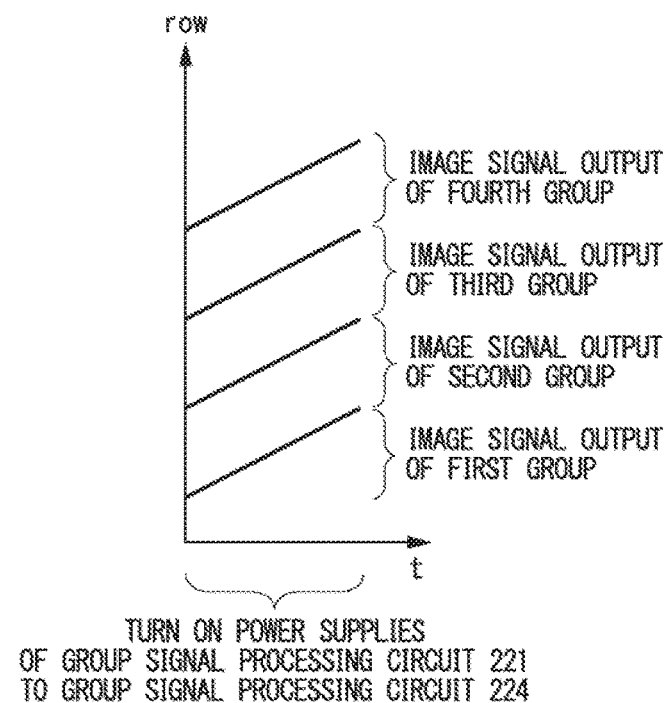
FIG. 7B is a diagram illustrating a method of reading out a pixel signal in the solid-state image pickup device of the second embodiment.
Figure 7C:
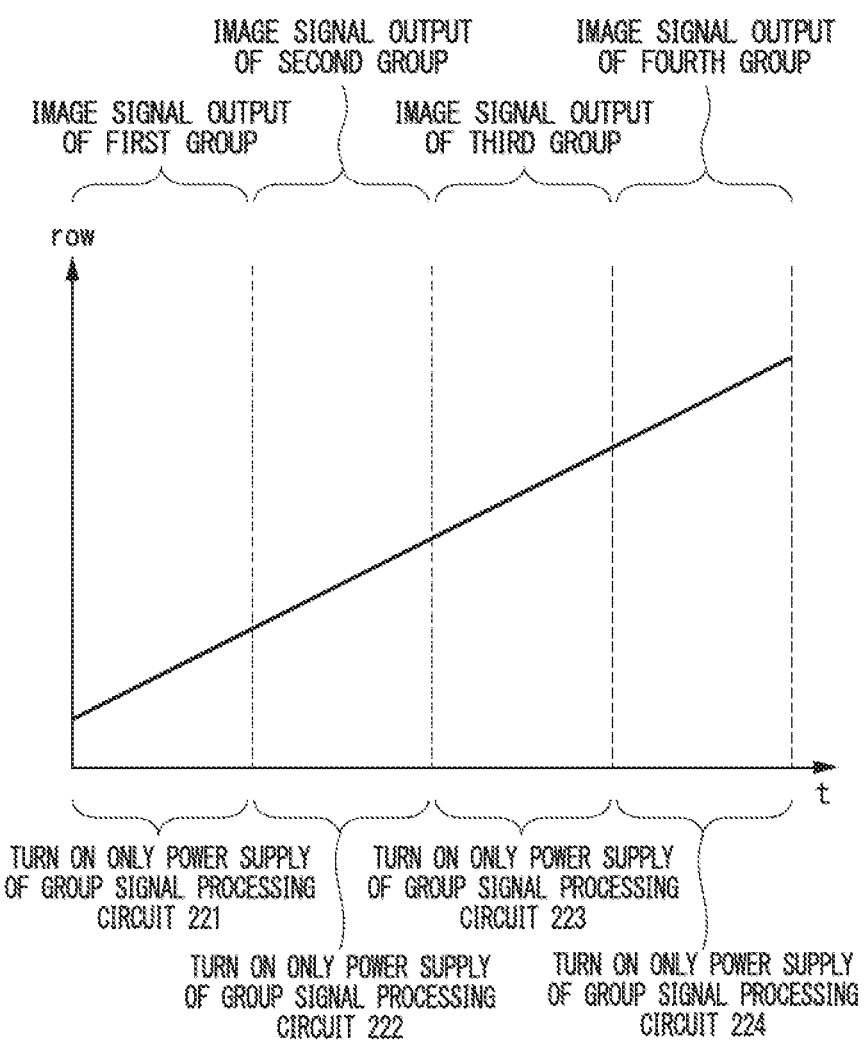
FIG. 7C is a diagram illustrating a method of reading out a pixel signal in the solid-state image pickup device of the second embodiment.

Next, an operating mode in which the solid-state image pickup device 100 of the second embodiment reads out a pixel signal to output the read-out the signal as an image signal will be described. FIGS. 7A to 7C are diagrams illustrating a method of reading out a pixel signal in the solid-state image pickup device 100 of the second embodiment.

FIG. 7A shows regions of the first group to the fourth group in which all the unit pixels 110 disposed within the pixel array part 11 included in the solid-state image pickup device 100 are divided into four groups. As shown in FIG. 7A, in the solid-state image pickup device 100, similarly to the solid-state image pickup device 1 of the first embodiment, the regions of all the unit pixels 110 disposed within the pixel array part 11 are divided into four groups of the first group to the fourth group. Therefore, in the solid-state image pickup device 100, similarly to the solid-state image pickup device 1 of the first embodiment, the image signal can be output in two operating modes of a parallel operating mode and a sequential operating mode.

In addition, as described above, in the solid-state image pickup device 100, the power supply controller 28 controls the power supply of the group signal processing circuit 22 in accordance with the operating mode. FIG. 7B schematically shows the transition of a row of the unit pixels 110 in the parallel operating mode, and FIG. 7C schematically shows the transition of a row of the unit pixels 110 in the sequential operating mode. In FIGS. 7B and 7C, the horizontal axis represents a time at which the solid-state image pickup device 100 outputs the image signal based on the pixel signal which is output by each of the unit pixels 110, and the vertical axis represents a row of the unit pixels 110 in which the solid-state image pickup device 100 outputs the image signal based on the pixel signal.

First, a method of reading out the pixel signal in the parallel operating mode shown in FIG. 7B will be described. The readout circuit controller 23 outputs a control signal indicating the output of the image signal in the parallel operating mode to the pixel controller 13 and the power supply controller 28. Thereby, the power supply controller 28 sets the power supplies of components within all the group signal processing circuits 22 to be in an ON-state. In addition, the pixel controller 13 instructs the vertical readout circuit 12 to simultaneously drive the unit pixels 110 belonging to four groups, and to sequentially read out the pixel signal. The vertical readout circuit 12 is sequentially driven from the unit pixels 110 of an initial row belonging to each of the first group to the fourth group in accordance with this instruction, and sequentially outputs each of the pixel signals to the group signal processing circuit 22 corresponding to each of the first group to the fourth group.

In addition, the readout circuit controller 23 causes each of the column circuits 25 within the group signal processing circuit 22 to sequentially execute a process (here, analog digital conversion process) for the pixel signals which are sequentially output from the unit pixels 110 belonging to a corresponding group. In addition, the readout circuit controller 23 causes the horizontal readout circuit 26 within the group signal processing circuit 22 to sequentially output the output signals after processing, sequentially output from each of the corresponding column circuits 25, to the output part 27.

Thereby, the image signals based on the pixel signals which are sequentially output from the unit pixels 110 of an initial row belonging to each of the first group to the fourth group, that is, four rows' worth of image signals output by the output part 27 within the group signal processing circuit 22 in parallel are simultaneously sequentially output to the outside.

As described above, in the parallel operating mode in the solid-state image pickup device 100, the power supply controller 28 sets the power supplies of the components within all the group signal processing circuits 22 to be in an ON-state. Therefore, the operation of the parallel operating mode in the solid-state image pickup device 100 is the same as the operation of the parallel operating mode in the solid-state image pickup device 1 of the first embodiment. Therefore, a detailed description of the operation of the parallel operating mode in the solid-state image pickup device 100 will not be given.

Subsequently, a method of reading out the pixel signal in the sequential operating mode shown in FIG. 7C will be described. The readout circuit controller 23 outputs a control signal indicating the output of the image signal in the sequential operating mode to the pixel controller 13 and the power supply controller 28. Thereby, the pixel controller 13 instructs the vertical readout circuit 12 to sequentially drive the unit pixels 110 belonging to four groups, and to sequentially read out the pixel signals. The vertical readout circuit 12 sequentially drives the unit pixels 110 of an initial row belonging to first group in accordance with this instruction, and sequentially output each of the pixel signals to the group signal processing circuit 221 corresponding to the first group.

In addition, the readout circuit controller 23 causes each of the column circuits 251 within the group signal processing circuit 221 to sequentially execute a process (here, analog digital conversion process) on the pixel signals which are sequentially output from the unit pixels 110 belonging to the corresponding first group. In addition, the readout circuit controller 23 causes the horizontal readout circuit 261 within the group signal processing circuit 221 to sequentially output the output signals after processing, sequentially output from each of the corresponding column circuits 251, to the output part 271.

In this case, the power supply controller 28 sets the power supplies of the components (pixel load current source 241, column circuit 251, horizontal readout circuit 261, and output part 271) within the group signal processing circuit 221 to be in an ON-state, in accordance with the control signal indicating the output of the image signal in the sequential operating mode which is input from the readout circuit controller 23. In addition, the power supply controller 28 sets the power supplies of the components (pixel load current source 242 to pixel load current source 244, column circuit 252 to column circuit 254, horizontal readout circuit 262 to horizontal readout circuit 264, and output part 272 to output part 274) within the group signal processing circuit 222 to the group signal processing circuit 224 to be in an OFF-state. Thereby, the image signals based on the pixel signals sequentially output from the unit pixels 110 of an initial row belonging to the first group are sequentially output to the outside from the output part 271 within the group signal processing circuit 221.

Thereafter, after the driving of the unit pixels 110 of a final row belonging to the first group is terminated, the vertical readout circuit 12 continuously sequentially drives the unit pixels 110 of an initial row belonging to the second group, and sequentially outputs each of the pixel signals to the group signal processing circuit 222 corresponding to the second group.

In addition, the readout circuit controller 23 causes each of the column circuits 252 within the group signal processing circuit 222 to sequentially execute a process on the pixel signals which are sequentially output from the unit pixels 110 belonging to the corresponding second group, and causes the horizontal readout circuit 262 within the group signal processing circuit 222 to sequentially output the output signals after processing, sequentially output from each of the corresponding column circuits 252, to the output part 272.

In this case, the power supply controller 28 sets the power supplies of the components (pixel load current source 242, column circuit 252, horizontal readout circuit 262, and output part 272) within the group signal processing circuit 222 to be in an ON-state. In addition, the power supply controller 28 sets the power supplies of the components (pixel load current source 241 and pixel load current source 243 to pixel load current source 244, column circuit 251 and column circuit 253 to column circuit 254, horizontal readout circuit 261 and horizontal readout circuit 263 to horizontal readout circuit 264, and output part 271 and output part 273 to output part 274) within the group signal processing circuit 221 and the group signal processing circuit 223 to the group signal processing circuit 224 to be in an OFF-state. Thereby, the image signals based on the pixel signals which are sequentially output from the unit pixels 110 of an initial row belonging to the second group are sequentially output to the outside from the output part 272 within the group signal processing circuit 222, subsequently to the pixel signals which are output by the unit pixels 110 of a final row of the first group.

Thereafter, after the driving of the unit pixels 110 of a final row belonging to the second group is terminated, the vertical readout circuit 12 continuously sequentially drives the unit pixels 110 of an initial row belonging to the third group, and sequentially outputs each of the pixel signals to the group signal processing circuit 223 corresponding to the third group.

In addition, the readout circuit controller 23 causes each of the column circuits 253 within the group signal processing circuit 223 to sequentially execute a process on the pixel signals which are sequentially output from the unit pixels 110 belonging to the corresponding third group, and causes the horizontal readout circuit 263 within the group signal processing circuit 223 to sequentially output the output signals after processing, sequentially output from each of the corresponding column circuits 253, to the output part 273.

In this case, the power supply controller 28 sets the power supplies of the components (pixel load current source 243, column circuit 253, horizontal readout circuit 263, and output part 273) within the group signal processing circuit 223 to be in an ON-state. In addition, the power supply controller 28 sets the power supplies of the components (pixel load current source 241 to pixel load current source 242 and pixel load current source 244, column circuit 251 to column circuit 252 and column circuit 254, horizontal readout circuit 261 to horizontal readout circuit 262 and horizontal readout circuit 264, and output part 271 to output part 272 and output part 274) within the group signal processing circuit 221 to group signal processing circuit 222 and the group signal processing circuit 224 to be in an OFF-state. Thereby, the image signals based on the pixel signals which are sequentially output from the unit pixels 110 of an initial row belonging to the third group are sequentially output to the outside from the output part 273 within the group signal processing circuit 223, subsequently to the pixel signals which are output by the unit pixels 110 of a final row of the second group.

Thereafter, after the driving of the unit pixels 110 of a final row belonging to the third group is terminated, the vertical readout circuit 12 continuously sequentially drives the unit pixels 110 of an initial row belonging to the fourth group, and sequentially outputs each of the pixel signals to the group signal processing circuit 224 corresponding to the fourth group.

In addition, the readout circuit controller 23 causes each of the column circuits 254 within the group signal processing circuit 224 to sequentially execute a process on the pixel signals which are sequentially output from the unit pixels 110 belonging to the corresponding fourth group, and causes the horizontal readout circuit 264 within the group signal processing circuit 224 to sequentially output the output signals after processing, sequentially output from each of the corresponding column circuits 254, to the output part 274.

In this case, the power supply controller 28 sets the power supplies of the components (pixel load current source 244, column circuit 254, horizontal readout circuit 264, and output part 274) within the group signal processing circuit 224 to be in an ON-state. In addition, the power supply controller 28 sets the power supplies of the components (pixel load current source 241 to pixel load current source 243, column circuit 251 to column circuit 253, horizontal readout circuit 261 to horizontal readout circuit 263, and output part 271 to output part 273) within the group signal processing circuit 221 to the group signal processing circuit 223 to be in an OFF-state. Thereby, the image signals based on the pixel signals which are sequentially output from the unit pixels 110 of an initial row belonging to the fourth group are sequentially output to the outside from the output part 274 within the group signal processing circuit 224, subsequently to the pixel signals which are output by the unit pixels 110 of a final row of the third group.

When the output of the image signals based on the pixel signals, output by the unit pixels 110 of a final row belonging to the fourth group, from the output part 274 within the group signal processing circuit 224 is terminated, the solid-state image pickup device 100 completes the output of the image signals in the sequential operating mode.

In this manner, in the sequential operating mode, as shown in FIG. 7C, the image signals based on the pixel signals which are output by the unit pixels 110 belonging to each group of the first group to the fourth group are sequentially output from each of the group signal processing circuit 221 to the group signal processing circuit 224 corresponding to each of the unit pixels 110. The image signals which are output in the sequential operating mode in this solid-state image pickup device 100 are the same as the image signals which are output in the sequential operating mode in the solid-state image pickup device 1 of the first embodiment. However, in the solid-state image pickup device 100, the power supply controller 28 sets only the power supply of the component within the group signal processing circuit 22 operating when the image signals are output to be in an ON-state, and sets the power supply of the component within the group signal processing circuit 22 which does not operate to be in an OFF-state. Therefore, in the sequential operating mode in the solid-state image pickup device 100, it is possible to obtain a further reduction effect in power consumption based on the power supply of the component within the group signal processing circuit 22, not operating, being set to in an OFF-state, in addition to the same effect of a reduction in power consumption as that in the sequential operating mode in the solid-state image pickup device 1 of the first embodiment based on a reduction in the load of each vertical signal line.

According to the second embodiment, the solid-state image pickup device (solid-state image pickup device 100) is configured in which the second substrate 20 further includes a power supply controller (power supply controller 28) that controls a power supply of a component within the group signal processing circuit 22 in accordance with an operation when the image signals are output from the solid-state image pickup device (solid-state image pickup device 100).

In addition, according to the second embodiment, the solid-state image pickup device 100 is configured in which the power supply controller 28 sets power supplies of all the components within the group signal processing circuit 22 to be in an ON-state when the unit pixels 110 within each group of the first group to the fourth group are simultaneously driven, and the image signals based on the pixel signals which are output from the unit pixels 110 driven herein are output from the solid-state image pickup device 100 so as to be output from the group signal processing circuits 22 corresponding to each group of the first group to the fourth group in parallel, and sets a power supply of a component within the group signal processing circuit 22, operating in order to output the current image signal, to be in an ON-state, and sets a power supply of a component within the group signal processing circuit 22, not operating in order to output the current image signal, to be in an OFF-state, when each of the unit pixels 110 is sequentially driven, and the image signals based on the pixel signals which are output from the unit pixels 110 driven herein are sequentially output from the solid-state image pickup device 100 so as to be output from the group signal processing circuits 22 corresponding to the unit pixels 110 driven herein.

In addition, according to the second embodiment, the solid-state image pickup device 100 is configured in which the power supply controller 28 includes an output part (output part 27) included in each of the group signal processing circuits 22, and controls an ON-state and an OFF-state of a power supply of a component within the group signal processing circuit 22.

As described above, the solid-state image pickup device 100 of the second embodiment is also configured such that the first substrate 10 having the pixel array part 11 formed therein and the second substrate 20 having the signal processing circuit part 21 formed therein are laminated. Thereby, in the solid-state image pickup device 100 of the second embodiment, similarly to the solid-state image pickup device 1 of the first embodiment, each of the unit pixels 110 disposed within the pixel array part 11 can be divided into a plurality of groups without being limited to the number, and the vertical signal line to which the unit pixels 110 of the same column within the pixel array part 11 are connected can be divided into the number of groups into which the unit pixels 110 are divided. Thereby, in the solid-state image pickup device 100 of the second embodiment, similarly to the solid-state image pickup device 1 of the first embodiment, it is possible to realize a speed-up in readout of the pixel signal from each of the unit pixels 110 to a corresponding column circuit 25 and a reduction in power consumption.

In addition, in the solid-state image pickup device 100 of the second embodiment, the group signal processing circuit 22 corresponding to each group is also included within the second substrate 20. In the solid-state image pickup device 100 of the second embodiment, in the sequential operating mode, only the power supply of the component within the group signal processing circuit 22 operating when the image signal is output is set to be in an ON-state, and the power supply of the component within the group signal processing circuit 22 which does not operate is set to be in an OFF-state. Thereby, in the solid-state image pickup device 100 of the second embodiment, in the sequential operating mode, it is possible to obtain the effect of a reduction in power consumption when the image signal is output based on the control of the power supply of the group signal processing circuit 22, in addition to the effect of a reduction in power consumption when the image signal is output based on a reduction in the load of each vertical signal line in each group. In the solid-state image pickup device 100 of the second embodiment, the operation in the parallel operating mode is also the same as the operation in the parallel operating mode in the solid-state image pickup device 1 of the first embodiment. Therefore, similarly to the solid-state image pickup device 1 of the first embodiment, it is possible to obtain the effect of a reduction in power consumption when the image signal is output based on a reduction in the load of each vertical signal line in each group.

In this manner, in the solid-state image pickup device 100 of the second embodiment, similarly to the solid-state image pickup device 1 of the first embodiment, it is possible to achieve both speed-up and a reduction in power consumption based on a reduction in the load of each vertical signal line.

In the configuration of the solid-state image pickup device 100 according to the second embodiment shown in FIG. 6, a configuration is shown in which the power supply controller 28 controls the power supplies of the column circuit 25 and the horizontal readout circuit 26 within each of the group signal processing circuits 22. However, the readout circuit controller 23 can also be configured to control the power supplies of the column circuit 25 and the horizontal readout circuit 26. In addition, instead of the power supply controller 28, the readout circuit controller 23 may be configured to control the power supplies of all the components within each of the group signal processing circuits 22.

Third Embodiment

Next, an example of still another configuration of a solid-state image pickup device mounted in an image pickup apparatus 8 of the present embodiment will be described. A solid-state image pickup device according to the third embodiment is mounted in the image pickup apparatus 8, instead of the solid-state image pickup device 1 included in the image pickup apparatus 8 of the present embodiment shown in FIG. 1. In the following description, the solid-state image pickup device according to the third embodiment is referred to as a "solid-state image pickup device 200". The configuration of the solid-state image pickup device 200 according to the third embodiment includes the same configuration as that of the solid-state image pickup device 1 of the first embodiment shown in FIG. 3. Therefore, in the following description, in the respective components of the solid-state image pickup device 200 according to the third embodiment, the same components as those of the solid-state image pickup device 1 of the first embodiment are denoted by the same reference numerals and signs as those of the solid-state image pickup device 1, and thus a detailed description of each component will not be given.

Figure 8:
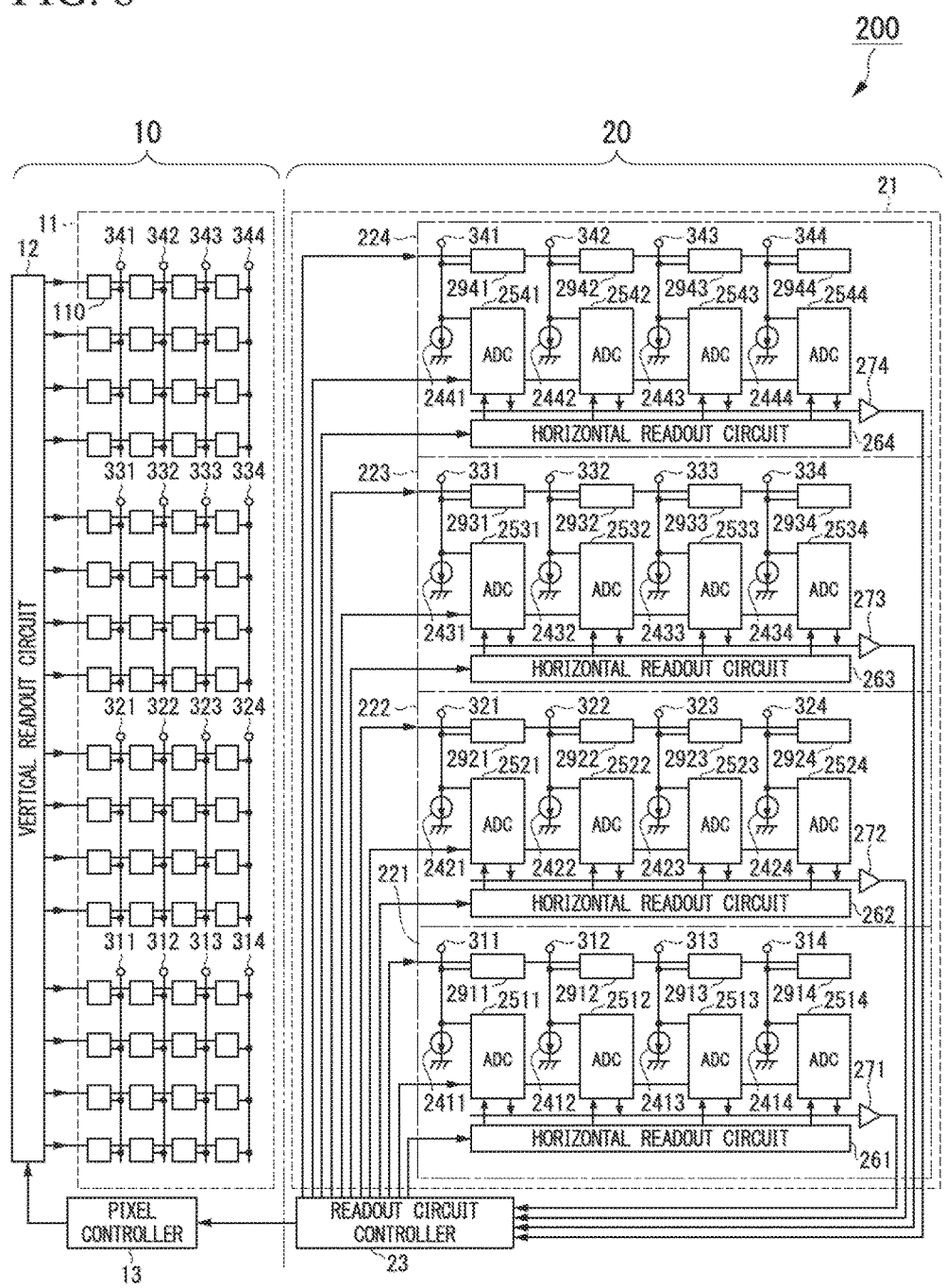
FIG. 8 is a block diagram illustrating a schematic configuration of a solid-state image pickup device according to a third embodiment of the present invention.

FIG. 8 is a block diagram illustrating a schematic configuration of the solid-state image pickup device 200 according to the third embodiment. Similarly to the solid-state image pickup device 1 of the first embodiment, the solid-state image pickup device 200 of the third embodiment is also configured such that two substrates (chips) of a first substrate 10 and a second substrate 20 are laminated, and that the first substrate 10 and the second substrate 20 are bonded (connected) to each other through an inter-substrate connecting portion 30. The solid-state image pickup device 200 of the third embodiment shown in FIG. 8 includes the first substrate 10 including a pixel array part 11, a vertical readout circuit 12 and a pixel controller 13, and the second substrate 20 including a signal processing circuit part 21 and a readout circuit controller 23.

The solid-state image pickup device 200 of the third embodiment has a configuration in which a pixel for performing correction (hereinafter, referred to as a "pixel for correction") corresponding to each of the column circuits 25 is added to each of the group signal processing circuits 22 within the signal processing circuit part 21 included in the solid-state image pickup device 1 of the first embodiment shown in FIG. 3. However, except for the addition of the pixel for correction, each of the group signal processing circuits 22 is the same as each of the group signal processing circuits 22 within the signal processing circuit part 21 included in the solid-state image pickup device 1 of the first embodiment. That is, except for an operation corresponding to the added pixel for correction, the operation of each of the group signal processing circuits 22 is the same as the operation of the group signal processing circuit 22 of the solid-state image pickup device 1 of the first embodiment. Therefore, in the following description, in order to facilitate the description, the group signal processing circuit 22 to which the pixel for correction is added is also denoted by the same reference numerals and signs as that of the solid-state image pickup device 1, and thus only operations corresponding to the added pixel for correction will be described.

In addition, a function of driving the pixel for correction is added to the readout circuit controller 23. However, except for the function of driving the pixel for correction, the readout circuit controller 23 is the same as the readout circuit controller 23 within the solid-state image pickup device 1 of the first embodiment. Therefore, in the following description, in order to facilitate the description, the readout circuit controller 23 to which the function of driving the pixel for correction is added is also denoted by the same reference numerals and signs as that of the solid-state image pickup device 1, and thus only operations corresponding to the added function will be described.

Similarly to the solid-state image pickup device 1 of the first embodiment, the signal processing circuit part 21 includes four group signal processing circuits 221 to 224 corresponding to each of the first group to the fourth group of the unit pixels 110 which are divided in the pixel array part 11. Each of the group signal processing circuit 221 to the group signal processing circuit 224 includes pixels for correction, pixel load current sources, and column circuits having the number corresponding to the number of rows of the unit pixels 110 disposed within the pixel array part 11, and a horizontal readout circuit and an output part common to the respective column circuits. That is, each of the group signal processing circuit 221 to the group signal processing circuit 224 includes four pixels for correction, four pixel load current sources, and four column circuits corresponding to each column of the unit pixels 110 disposed in four rows within the pixel array part 11, one horizontal readout circuit and one output part.

More specifically, the group signal processing circuit 221 corresponding to the first group in the pixel array part 11 includes four pixels for correction (pixel for correction 2911 to pixel for correction 2914), four pixel load current sources 241, and four column circuits 251 corresponding to the unit pixels 110 of four rows, respectively, belonging to the first group, the horizontal readout circuit 261, and the output part 271. In addition, the group signal processing circuit 222 corresponding to the second group in the pixel array part 11 includes four pixels for correction (pixel for correction 2921 to pixel for correction 2924), four pixel load current sources 242, and four column circuits 252 corresponding to the unit pixels 110 of four rows, respectively, belonging to the second group, the horizontal readout circuit 262, and the output part 272. In addition, the group signal processing circuit 223 corresponding to the third group in the pixel array part 11 includes four pixels for correction (pixel for correction 2931 to pixel for correction 2934), four pixel load current sources 243, and four column circuits 253 corresponding to the unit pixels 110 of four rows, respectively, belonging to the third group, the horizontal readout circuit 263, and the output part 273. In addition, the group signal processing circuit 224 corresponding to the fourth group in the pixel array part 11 includes four pixels for correction (pixel for correction 2941 to pixel for correction 2944), four pixel load current sources 244, and four column circuits 254 corresponding to the unit pixels 110 of four rows, respectively, belonging to the fourth group, the horizontal readout circuit 264, and the output part 274.

In the following description, in a case where the pixel for correction 2911 to the pixel for correction 2914 within the group signal processing circuit 221 are not distinguished from each other, these pixels for correction are referred to as the "pixels for correction 291". In addition, in a case where the pixel for correction 2921 to the pixel for correction 2924 within the group signal processing circuit 222 are not distinguished from each other, these pixels for correction are referred to as the "pixels for correction 292". In addition, in a case where the pixel for correction 2931 to the pixel for correction 2934 within the group signal processing circuit 223 are not distinguished from each other, these pixels for correction are referred to as the "pixels for correction 293". In addition, in a case where the pixel for correction 2941 to the pixel for correction 2944 within the group signal processing circuit 224 are not distinguished from each other, these pixels for correction are referred to as the "pixels for correction 294". In addition, in a case where the pixel for correction 2911 to the pixel for correction 2914 within the group signal processing circuit 221, the pixel for correction 2921 to the pixel for correction 2924 within the group signal processing circuit 222, the pixel for correction 2931 to the pixel for correction 2934 within the group signal processing circuit 223, and the pixel for correction 2941 to the pixel for correction 2944 within the group signal processing circuit 224 are not distinguished from each other, these pixels for correction are referred to as the "pixels for correction 29".

The pixels for correction 29 within each of the group signal processing circuits 22 are pixels, having the same configuration as that of the unit pixel 110, which output a pixel signal for correction for correcting the column circuit 25 included in each of the group signal processing circuits 22, in accordance with a control signal which is input from the readout circuit controller 23. However, the unit pixel 110 outputs a pixel signal based on subject light, whereas the pixel for correction 29 outputs a pixel signal for correction, based on the voltage value of a reference voltage which is set in advance, to a corresponding vertical signal line. Thereby, the pixel signal for correction based on the voltage value which is set in advance is input to each of the corresponding column circuits 25. In this case, the pixel load current source 24 within each of the group signal processing circuits 22 also operates as the load of a transistor of an amplification part included within the pixel for correction 29 connected to a corresponding vertical signal line. The details of this pixel for correction 29 will be described later.

The readout circuit controller 23 controls the pixel controller 13 included in the first substrate 10, and the column circuit 25 and the horizontal readout circuit 26 included in each of the group signal processing circuits 22 within the signal processing circuit part 21, in accordance with the operating mode when the solid-state image pickup device 200 reads out a pixel signal to output the read-out signal as an image signal. In addition, the readout circuit controller 23 drives the pixels for correction 29 within each of the group signal processing circuits 22 similarly to the vertical readout circuit 12, and reads out (outputs) the pixel signal for correction, output by each of the pixel for corrections 29, to a corresponding column circuit 25. The readout circuit controller 23 can output a control signal for driving the pixel for correction 29 for each of the group signal processing circuits 22, and can also simultaneously output the control signal to all the pixels for correction 29.

The readout circuit controller 23 drives the pixels for correction 29 within each of the group signal processing circuits 22 before the solid-state image pickup device 200 outputs the image signals based on the pixel signals in each operating mode, and causes the column circuit 25 within the group signal processing circuit 22 to perform a process on the pixels signal for correction. The readout circuit controller 23 corrects each of the column circuits 25 so that respective output signals after a process has been performed on the pixels signal for correction become the same as each other.

In the correction of the column circuit 25 by the readout circuit controller 23, for example, initially, the output signal of each of the column circuits 25 is read out, and a correction value for performing correction so that each of the column circuits 25 outputs the same output signal is calculated on the basis of the output signals which are read out from all the column circuits 25. The readout circuit controller 23 controls each of the column circuits 25 in accordance with the calculated correction value, when the image signal based on the pixel signal is output in each operating mode, that is, when each of the column circuits 25 is caused to perform a process on the pixel signal which is output by the unit pixel 110. Thereby, the solid-state image pickup device 200 can output an image signal in which the reference level of the pixel signal which is output by each of the unit pixels 110 is corrected.

With such a configuration, in the solid-state image pickup device 200 of the third embodiment, before the image signal based on the pixel signal which is output by the unit pixel 110 is output in each operating mode, the level of the output signal which is output by the column circuit 25 within each of the group signal processing circuits 22 is corrected. Thereby, in the solid-state image pickup device 200 of the third embodiment, even in a case where the vertical signal line to which the unit pixels 110 of the same column within the pixel array part 11 is connected is divided for each of the groups into which the unit pixels 110 are divided, it is possible to reduce a difference in level between the output signals which are output by the column circuit 25 within the group signal processing circuit 22 corresponding to each group. Thereby, it is possible to suppress a difference in level between the respective regions (groups) obtained by dividing the unit pixels 110 in an image (still image or moving image) which is generated by the image pickup apparatus 8 having the solid-state image pickup device 200 of the third embodiment mounted therein.

Next, the pixel for correction 29 included in each of the group signal processing circuits 22 within the solid-state image pickup device 200 of the third embodiment will be described. The pixel for correction 29 outputs a pixel signal for correction based on the voltage value of a reference voltage which is set in advance, instead of the pixel signal based on the photoelectric conversion signal obtained by photoelectrically converting the incident subject light by the photoelectric conversion part PD within the unit pixel 110 shown in FIG. 4. Therefore, the pixel for correction 29 includes the same configuration as that of the unit pixel 110. Therefore, in the following description, in the respective components of the pixel for correction 29, the same components as those of the unit pixel 110 are denoted by the same reference numerals and signs as those of the unit pixel 110, and the description thereof will be given.

Figure 9:
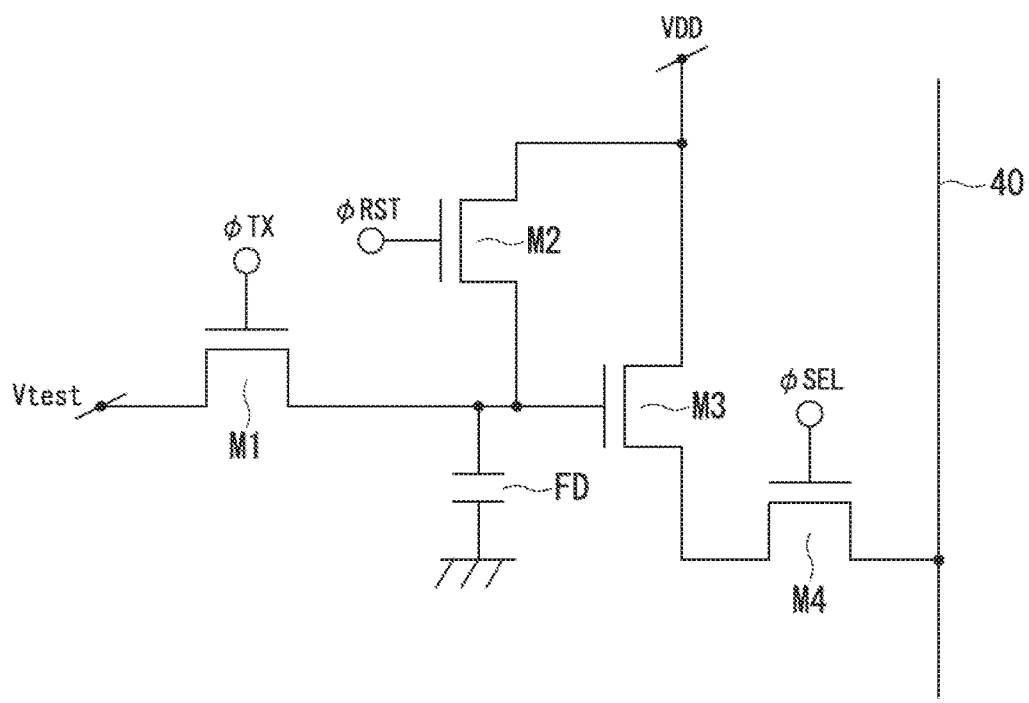
FIG. 9 is a circuit diagram illustrating a schematic configuration of a pixel for correction within a signal processing circuit part of the solid-state image pickup device of the third embodiment.

FIG. 9 is a circuit diagram illustrating a schematic configuration of the pixel for correction 29 within the signal processing circuit part 21 of the solid-state image pickup device 200 of the third embodiment. FIG. 9 shows one pixel for correction 29.

In FIG. 9, the pixel for correction 29 includes a transfer transistor M1, a charge accumulation unit FD, a pixel reset transistor M2, an amplification transistor M3, and a selection transistor M4. The pixel for correction 29 has the photoelectric conversion part PD included in the unit pixel 110 omitted therein, and causes the voltage value of a reference voltage Vtest which is set in advance to act on the voltage value of signal charge obtained by photoelectrically converting the incident subject light (visible light) by the photoelectric conversion part PD. The pixel for correction 29 converts the voltage value of the reference voltage Vtest into a pixel signal for correction, and outputs the converted voltage value to the vertical signal line 40.

The transfer transistor M1 transfers the voltage value of the reference voltage Vtest to the gate terminal of the amplification transistor M3 in accordance with a control signal φTX which is input from the readout circuit controller 23. Thereby, the voltage value of the reference voltage Vtest transferred by the transfer transistor M1 is accumulated in the charge accumulation unit FD.

The charge accumulation unit FD is a capacitor associated with a node connected to the gate terminal of the amplification transistor M3, and is denoted by a symbol of a capacitor in the schematic configuration of the pixel for correction 29 shown in FIG. 9.

The amplification transistor M3 outputs a signal voltage based on the voltage value of the reference voltage Vtest transferred to the gate terminal by the transfer transistor M1, that is, the voltage value of the reference voltage Vtest accumulated in the charge accumulation unit FD. In this case, the amplification transistor M3 outputs a signal voltage obtained by amplifying the voltage value of the reference voltage Vtest accumulated in the charge accumulation unit FD, in accordance with the current value of the pixel load current source 24 connected to a corresponding vertical signal line 40.

The selection transistor M4 outputs the signal voltage which is output from the amplification transistor M3, as a pixel signal for correction, to the vertical signal line 40, in accordance with a control signal φSEL which is input from the readout circuit controller 23. Thereby, the pixel signal for correction based on the voltage value of the reference voltage Vtest is read out to the vertical signal line 40 in a state where the signal corresponds to a pixel signal which is output by the unit pixel 110.

The pixel reset transistor M2 resets the voltage value of the reference voltage Vtest within the pixel for correction 29 to a power supply voltage VDD, in accordance with a control signal φRST which is input from the readout circuit controller 23.

With such a configuration, the pixel signal for correction based on the voltage value of the reference voltage Vtest within the pixel for correction 29 is input to a corresponding column circuit 25.

The operation of the pixel for correction 29 shown in FIG. 9 is the same as the operation of the unit pixel 110. Therefore, a detailed description of the operation of the pixel for correction 29 will not be given.

According to the third embodiment, the solid-state image pickup device (solid-state image pickup device 200) is configured in which the group signal processing circuit 22 further includes a pixel for correction (pixel for correction 29) that corresponds to each of the column circuits 25, and outputs a pixel signal for correction for correcting a corresponding column circuit 25 to the vertical signal line 40 to which a corresponding column circuit 25 is connected.

In addition, according to the third embodiment, the solid-state image pickup device 200 is configured in which each of the column circuits 25, included in each of the group signal processing circuits 22 is corrected using the pixel signal for correction which is output by a corresponding pixel for correction 29, before the image signal is output from the solid-state image pickup device 200.

As described above, the solid-state image pickup device 200 of the third embodiment is also configured such that the first substrate 10 having the pixel array part 11 formed therein and the second substrate 20 having the signal processing circuit part 21 formed therein are laminated. Thereby, in the solid-state image pickup device 200 of the third embodiment, similarly to the solid-state image pickup device 1 of the first embodiment, each of the unit pixels 110 disposed within the pixel array part 11 can be divided into a plurality of groups without being limited to the number, and the vertical signal line to which the unit pixels 110 of the same column within the pixel array part 11 are connected can be divided into the number of groups into which the unit pixels 110 are divided. Thereby, in the solid-state image pickup device 200 of the third embodiment, similarly to the solid-state image pickup device 1 of the first embodiment, it is possible to obtain a speed-up in readout of the pixel signal from each of the unit pixels 110 to a corresponding column circuit 25 and a reduction in power consumption, and the effect of a reduction in power consumption when the image signal is output based on a reduction in the load of each vertical signal line in each group.

In addition, in the solid-state image pickup device 200 of the third embodiment, the group signal processing circuit 22 corresponding to each group is also included within the second substrate 20. In the solid-state image pickup device 200 of the third embodiment, the pixel for correction 29 is included within each of the group signal processing circuits 22. Thereby, in the solid-state image pickup device 200 of the third embodiment, it is possible to reduce a difference in level between the output signals which are output by the column circuit 25 within each of the group signal processing circuits 22, and to suppress a difference in level the respective groups in the image signal which is output by division of the unit pixels 110 into groups. It is preferable that the output signals from each of the column circuits 25 based on the pixel signal for correction which is output by the pixel for correction 29 included within each of the group signal processing circuits 22 be read out multiple times, and that a correction value be calculated on the basis of each of the output signals. Thereby, it is possible to reduce the influence of a random variation in the pixel signal for correction which is output by the pixel for correction 29. Thereby, for example, it is possible to improve the accuracy of correction such as the suppression of the influence of noise on the output signal which is output by the same column circuit 25.

In this manner, in the solid-state image pickup device 200 of the third embodiment, similarly to the solid-state image pickup device 1 of the first embodiment, it is possible to achieve both speed-up and a reduction in power consumption based on a reduction in the load of each vertical signal line. In addition, in the solid-state image pickup device 200 of the third embodiment, a difference in level between the column circuits 25 corresponding to the group signal processing circuit 22 within each divided vertical signal line is suppressed, and thus the image pickup apparatus 8 having the solid-state image pickup device 200 of the third embodiment mounted therein can generate a satisfactory image.

In the solid-state image pickup device 200 of the third embodiment shown in FIG. 8, a description has been given of a configuration in which one pixel for correction 29 is included for each column circuit 25 within each of the group signal processing circuits 22. However, the number of pixels for correction 29 corresponding to each of the column circuits 25 is not limited to the configuration shown in FIG. 8, that is, one. For example, it is also possible to form a configuration in which a plurality of pixels for correction 29 are included in one column circuit 25. In this case, the readout circuit controller 23 can correct each of the column circuits 25 on the basis of each of the pixels signal for correction which are output by a plurality of corresponding pixels for correction 29, and can reduce the influence of a fixed variation in the pixel for correction 29 itself. Thereby, for example, it is possible to improve the accuracy of correction such as the suppression of the influence of noise on the output signal which is output by the column circuit 25 in accordance with each of the pixels signal for correction used in the calculation of a correction value. In a case where a plurality of pixels for correction 29 are included in one column circuit 25, it is considered that the number of rows of the unit pixels 110 disposed within a group to which this column circuit 25 corresponds is set to the maximum number of pixels for correction 29 included within the group signal processing circuit 22, but the number can be determined within a range capable of disposing the pixels for correction 29 within the group signal processing circuit 22 for each of a plurality of rows of the unit pixels 110 disposed within a group.

The correction of the column circuit 25 by the readout circuit controller 23 can be performed whenever the solid-state image pickup device 200 outputs the image signals based on the pixel signals in each operating mode, that is, every time before the solid-state image pickup device 200 outputs an image signal of each frame. However, for example, a storage unit that holds a correction value is included within the readout circuit controller 23, and thus the column circuit 25 can also be corrected at a timing which is set in advance. For example, when the image pickup apparatus 8 having the solid-state image pickup device 200 of the third embodiment mounted therein is started up, when the operating mode of the solid-state image pickup device 200 is changed, or at a periodic timing which is set in advance, a configuration can also be used in which the correction value held in the readout circuit controller 23 is updated.

In addition, in the configuration of the pixel for correction 29 shown in FIG. 9, a description has been given of a configuration similar to that of the unit pixel 110 in which the photoelectric conversion part PD is omitted from the component of the unit pixel 110, and instead, the voltage value of the reference voltage Vtest which is set in advance is transferred to the gate terminal of the amplification transistor M3 by the transfer transistor M1. However, the configuration of the pixel for correction 29 is not limited to the configuration shown in FIG. 9. For example, the pixel for correction 29 can also be formed to have the same configuration as that of the unit pixel 110, that is, the configuration in which the photoelectric conversion part PD is included. Thereby, in the solid-state image pickup device 200 of the third embodiment, similarly to the pixel signals which are output by the unit pixels 110 in multiple rows of optical black (OB) regions blocked constantly, the pixel signal for correction which is output by the pixel for correction 29 can be used in order to correct a fluctuation in the black level of the pixel signal. This is because the pixel for correction 29 is formed within the second substrate 20, and the pixel for correction 29 is easily blocked. With such a configuration, in the solid-state image pickup device 200 of the third embodiment, the same configuration is obtained as the configuration in which the optical black (OB) region is provided for each group dividing the region of the unit pixels 110 within the pixel array part 11, that is, even in the region of the central portion of the pixel array part 11. However, in a method (manufacturing process) of manufacturing a semiconductor device, since a larger number of processes are required for forming the photoelectric conversion part PD, it is considered that the configuration shown in FIG. 9 predominates in the pixel for correction 29. Even in this configuration, the pixel signal for correction which is output by the pixel for correction 29 can be processed similarly to the pixel signal which is output by the unit pixel 110 in the optical black (OB) region.

In the solid-state image pickup device 1 of the first embodiment, the solid-state image pickup device 100 of the second embodiment, and the solid-state image pickup device 200 of the third embodiment, a description has been given of a configuration in which each of the group signal processing circuits 22 includes each component separately. However, some of the components of each of the group signal processing circuits 22 can also be configured to be used in common.

Fourth Embodiment

Next, an example of still another configuration of the solid-state image pickup device mounted in the image pickup apparatus 8 of the present embodiment will be described. A solid-state image pickup device according to the fourth embodiment is mounted in the image pickup apparatus 8, instead of the solid-state image pickup device 1 included in the image pickup apparatus 8 of the present embodiment shown in FIG. 1. In the following description, the solid-state image pickup device according to the fourth embodiment is referred to as a "solid-state image pickup device 300". The configuration of the solid-state image pickup device 300 according to the fourth embodiment includes the same configuration as that of the solid-state image pickup device 100 of the second embodiment shown in FIG. 6. Therefore, in the following description, in the respective components of the solid-state image pickup device 300 according to the fourth embodiment, the same components as those of the solid-state image pickup device 100 of the second embodiment are denoted by the same reference numerals and signs as those of the solid-state image pickup device 100, and thus a detailed description of each component will not be given.

Figure 10:
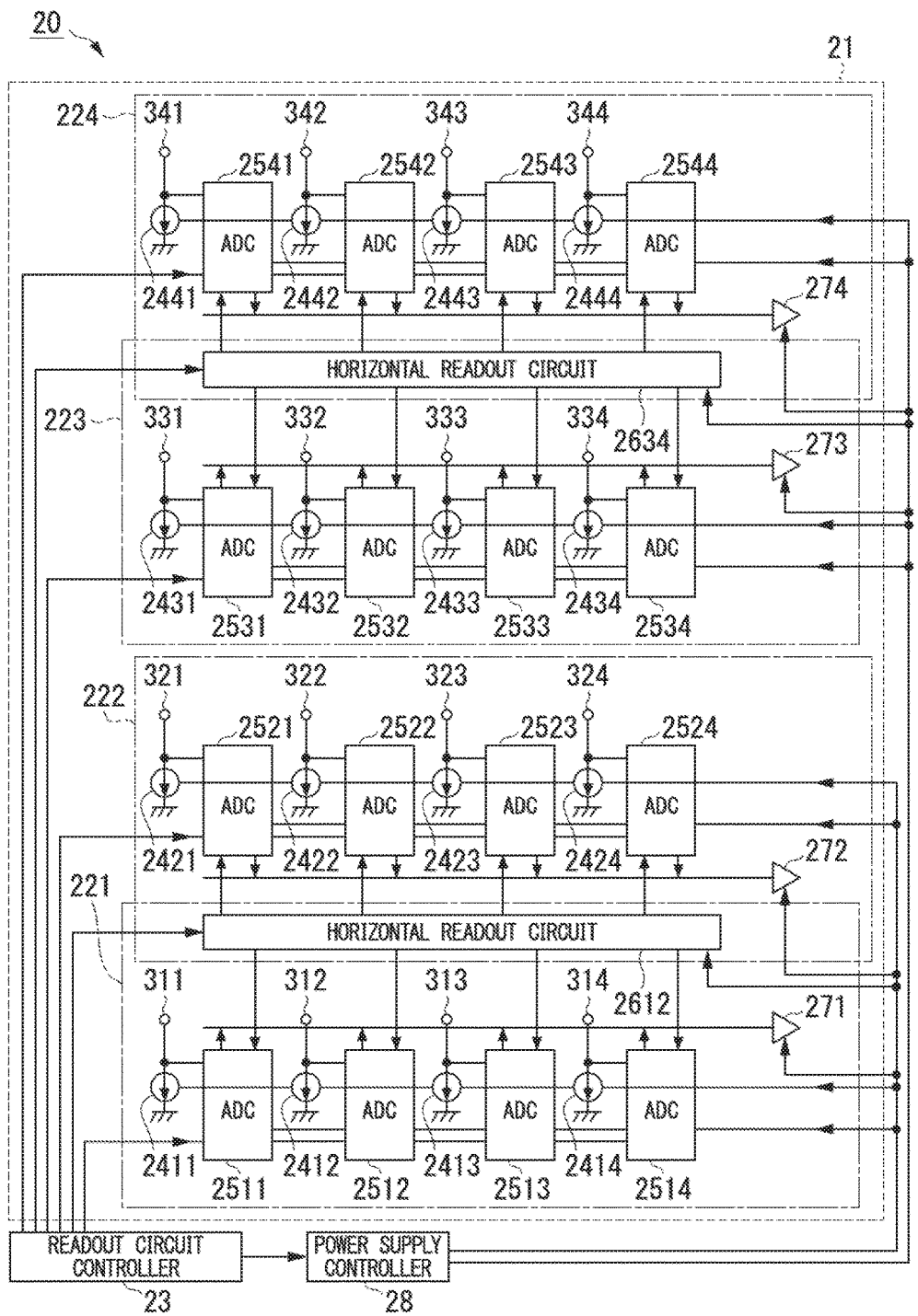
FIG. 10 is a block diagram illustrating a schematic configuration of a second substrate of a solid-state image pickup device according to a fourth embodiment of the present invention.

FIG. 10 is a block diagram illustrating a schematic configuration of a second substrate 20 of the solid-state image pickup device 300 according to the fourth embodiment. Similarly to the solid-state image pickup device 1 of the first embodiment, the solid-state image pickup device 300 of the fourth embodiment is also configured such that two substrates (chips) of a first substrate 10 and a second substrate 20 are laminated, and that the first substrate 10 and the second substrate 20 are bonded (connected) to each other through an inter-substrate connecting portion 30. The configuration of the first substrate 10 in the solid-state image pickup device 300 of the fourth embodiment is the same as the configuration of the first substrate 10 of the solid-state image pickup device 1 of the first embodiment, the solid-state image pickup device 100 of the second embodiment, and the solid-state image pickup device 200 of the third embodiment. Therefore, FIG. 10 shows only the configuration of the second substrate 20 of the solid-state image pickup device 300 of the fourth embodiment.

The second substrate 20 of the solid-state image pickup device 300 of the fourth embodiment shown in FIG. 10 includes a signal processing circuit part 21, a readout circuit controller 23, and a power supply controller 28. The second substrate 20 of the solid-state image pickup device 300 of the fourth embodiment has a configuration in which the group signal processing circuits 22 included in the signal processing circuit part 21 share the horizontal readout circuit 26 in the configuration of the solid-state image pickup device 100 of the second embodiment shown in FIG. 6. More specifically, in this configuration, the group signal processing circuit 221 and the group signal processing circuit 222 share a horizontal readout circuit, and the group signal processing circuit 223 and the group signal processing circuit 224 share a horizontal readout circuit.

In the following description, the horizontal readout circuit shared by the group signal processing circuit 221 and the group signal processing circuit 222 is referred to as a "horizontal readout circuit 2612", and the horizontal readout circuit shared by the group signal processing circuit 222 and the group signal processing circuit 223 is referred to as a "horizontal readout circuit 2634".

Except for sharing the horizontal readout circuit 26, each of the group signal processing circuits 22 is the same as the group signal processing circuit 22 included in the solid-state image pickup device 100 of the second embodiment, that is, the operations of the group signal processing circuits 22 are the same as each other. Therefore, in the following description, in order to facilitate the description, the same components as those of the group signal processing circuit 22 included in the solid-state image pickup device 100 of the second embodiment will not be described below. In a case where the horizontal readout circuit 2612 shared by the group signal processing circuit 221 and the group signal processing circuit 222 and the horizontal readout circuit 2634 shared by the group signal processing circuit 222 and the group signal processing circuit 223 are not distinguished from each other, these circuits are referred to as the "horizontal readout circuits 26".

The power supply controller 28 controls the power supply of each of the group signal processing circuits 22 within the signal processing circuit part 21, in accordance with control from the readout circuit controller 23, that is, in accordance with the operating mode when the solid-state image pickup device 300 reads out a pixel signal to output read-out the signal as an image signal. In this case, the power supply controller 28 controls only the power supplies of the pixel load current source 24, the column circuit 25 and the output part 27 included in the group signal processing circuit 22 operating when the solid-state image pickup device 300 outputs a current image signal, and only the power supply of the horizontal readout circuit 26 shared by the respective group signal processing circuits 22, to be in an ON-state.

The horizontal readout circuit 26 shared by the respective group signal processing circuits 22 sequentially reads out the output signal after processing which is output from a corresponding column circuits 25, and sequentially outputs the read-out signal to a corresponding output parts 27.

The output part 27 within each of the group signal processing circuits 22 outputs the output signal after processing which is sequentially input from a corresponding column circuit 25 by a corresponding horizontal readout circuit 26, as an image signal, to the outside of the solid-state image pickup device 300.

With such a configuration, in the solid-state image pickup device 300 of the fourth embodiment, similarly to the solid-state image pickup device 1 of the first embodiment, the solid-state image pickup device 100 of the second embodiment, and the solid-state image pickup device 200 of the third embodiment, it is possible to achieve both a speed-up in readout of the pixel signal from the unit pixel 110 to the column circuit 25 and a reduction in power consumption, and the speed-up of the solid-state image pickup device 300 based on the image signals processed by each of the column circuits 25 being output in parallel. In addition, in the solid-state image pickup device 300 of the fourth embodiment, since the horizontal readout circuit 26 is shared by the respective group signal processing circuits 22, it is possible to further reduce a circuit scale than in the solid-state image pickup device 1 of the first embodiment, the solid-state image pickup device 100 of the second embodiment, and the solid-state image pickup device 200 of the third embodiment.

Figure 11A:
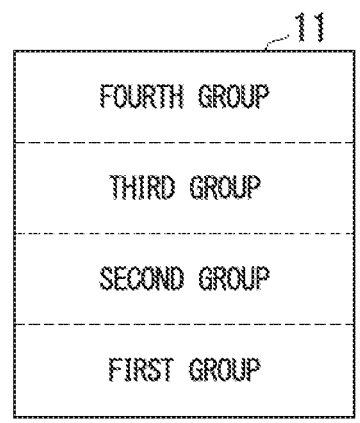
FIG. 11A is a diagram illustrating a method of reading out a pixel signal in the solid-state image pickup device of the fourth embodiment.
Figure 11B:
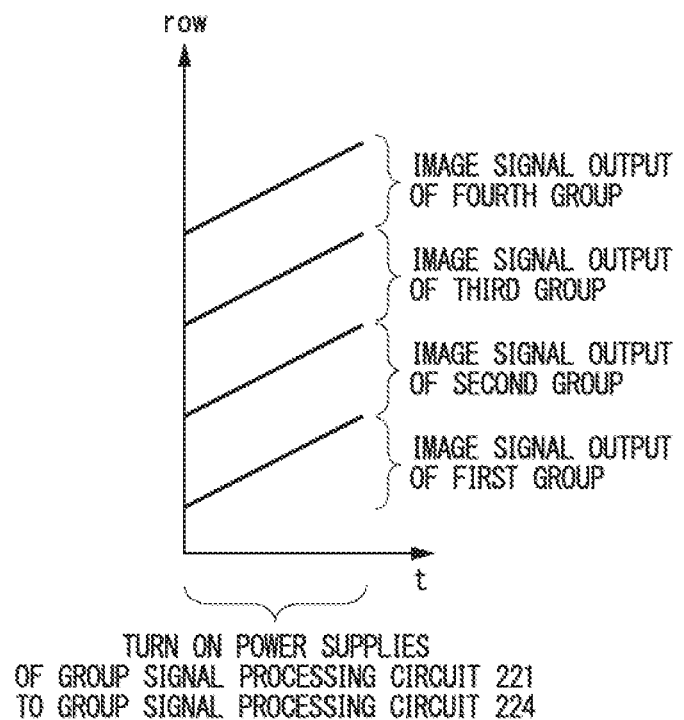
FIG. 11B is a diagram illustrating a method of reading out a pixel signal in the solid-state image pickup device of the fourth embodiment.
Figure 11C:
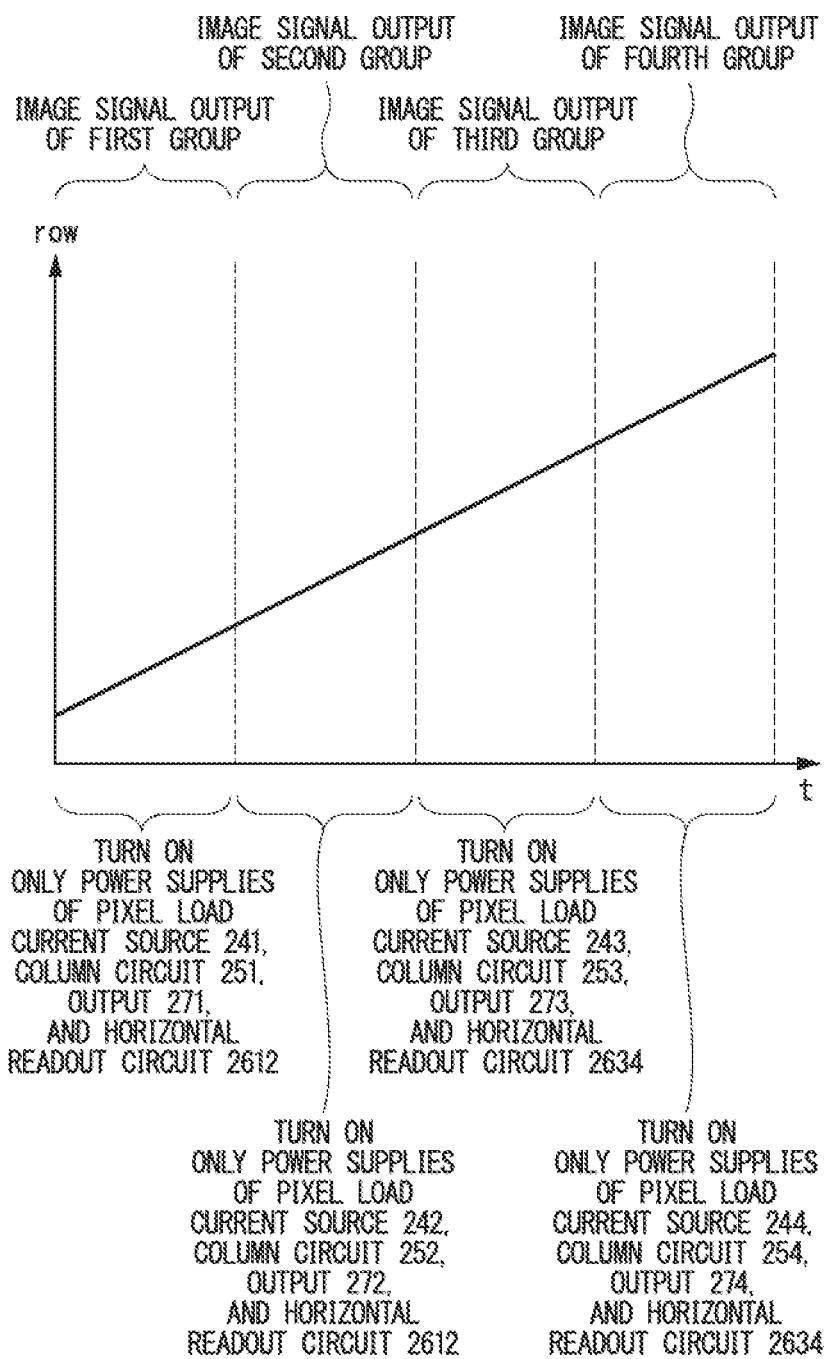
FIG. 11C is a diagram illustrating a method of reading out a pixel signal in the solid-state image pickup device of the fourth embodiment.

Next, an operating mode will be described in which the solid-state image pickup device 300 of the fourth embodiment reads out a pixel signal to output the read-out signal as an image signal. FIGS. 11A to 11C are diagrams illustrating a method of reading out a pixel signal in the solid-state image pickup device 300 of the fourth embodiment.

In the solid-state image pickup device 300 of the fourth embodiment, as shown in FIG. 11A, the regions of all the unit pixels 110 disposed within the pixel array part 11 are also divided into four groups of a first group to a fourth group. Therefore, in the solid-state image pickup device 300 of the fourth embodiment, similarly to the solid-state image pickup device 1 of the first embodiment, the solid-state image pickup device 100 of the second embodiment, and the solid-state image pickup device 200 of the third embodiment, it is possible to output the image signals in two operating modes of the parallel operating mode and the sequential operating mode.

FIG. 11B schematically shows the transition of a row of the unit pixels 110 in the parallel operating mode, and FIG. 11C schematically shows the transition of a row of the unit pixels 110 in the sequential operating mode. In the solid-state image pickup device 300, similarly to the solid-state image pickup device 100 of the second embodiment, the power supply controller 28 controls the power supply of the group signal processing circuit 22 in accordance with the operating mode. In FIGS. 11B and 11C, the horizontal axis represents a time at which the solid-state image pickup device 300 outputs the image signal based on the pixel signal which is output by each of the unit pixels 110, and the vertical axis represents a row of the unit pixels 110 in which the solid-state image pickup device 300 outputs the image signal based on the pixel signal.

In a method of reading out a pixel signal in the parallel operating mode shown in FIG. 11B, the power supply controller 28 sets the power supplies of components within all the group signal processing circuits 22 to be in an ON-state. In the operation of the parallel operating mode in the solid-state image pickup device 300, one horizontal readout circuit 26 shared by two group signal processing circuits 22 simultaneously sequentially reads out the output signals after processing which are output from the column circuit 25 within the shared group signal processing circuit 22, and sequentially outputs the read-out signals to corresponding output parts 27. Except for a difference between such operations, the operation of the parallel operating mode in the solid-state image pickup device 300 is the same as the operation of the parallel operating mode in the solid-state image pickup device 1 of the first embodiment, the solid-state image pickup device 100 of the second embodiment, and the solid-state image pickup device 200 of the third embodiment. Therefore, a detailed description of the operation of the parallel operating mode in the solid-state image pickup device 300 will not be given.

Subsequently, a method of reading out a pixel signal in the sequential operating mode shown in FIG. 11C will be described. In the method of reading out a pixel signal in the sequential operating mode of the solid-state image pickup device 300, similarly to the solid-state image pickup device 100 of the second embodiment, the power supply controller 28 controls only the power supply of the group signal processing circuit 22 operating when a current image signal is output, to be in an ON-state.

More specifically, in a period in which the solid-state image pickup device 300 outputs the image signal of the first group, as shown in FIG. 11B, the power supply controller 28 controls only the power supplies of the pixel load current source 241, the column circuit 251 and the output part 271 included in the group signal processing circuit 221, and only the power supply of the horizontal readout circuit 2612 shared by the group signal processing circuit 221 and the group signal processing circuit 222, to be in an ON-state. In addition, in a period in which the solid-state image pickup device 300 outputs an image signal of the second group, as shown in FIG. 11B, the power supply controller 28 controls only the power supplies of the pixel load current source 242, the column circuit 252 and the output part 272 included in the group signal processing circuit 222, and only the power supply of the horizontal readout circuit 2612 shared by the group signal processing circuit 221 and the group signal processing circuit 222, to be in an ON-state. In addition, in a period in which the solid-state image pickup device 300 output an image signal of the third group, as shown in FIG. 11B, the power supply controller 28 controls only the power supplies of the pixel load current source 243, the column circuit 253 and the output part 273 included in the group signal processing circuit 223, and only the power supply of the horizontal readout circuit 2634 shared by the group signal processing circuit 223 and the group signal processing circuit 224, to be in an ON-state. In addition, in a period in which the solid-state image pickup device 300 output an image signal of the fourth group, as shown in FIG. 11B, the power supply controller 28 controls only the power supplies of the pixel load current source 244, the column circuit 254 and the output part 274 included in the group signal processing circuit 224, and only the power supply of the horizontal readout circuit 2634 shared by the group signal processing circuit 223 and the group signal processing circuit 224, to be in an ON-state.

When the solid-state image pickup device 300 starts to read out the image signal in the sequential operating mode, the readout circuit controller 23 outputs a control signal indicating the output of the image signal in the sequential operating mode to the pixel controller 13 and the power supply controller 28. Thereby, the pixel controller 13 instructs the vertical readout circuit 12 to sequentially drive the unit pixels 110 belonging to four groups, and to sequentially read out the pixel signals. The vertical readout circuit 12 sequentially drives the unit pixels 110 of an initial row belonging to first group in accordance with this instruction, and sequentially output each of the pixel signals to the group signal processing circuit 221 corresponding to the first group.

In addition, the readout circuit controller 23 causes each of the column circuits 251 within the group signal processing circuit 221 to sequentially execute a process (here, analog digital conversion process) on the pixel signals which are sequentially output from the unit pixels 110 belonging to the corresponding first group. In addition, the readout circuit controller 23 causes the horizontal readout circuit 2612 shared by the group signal processing circuit 221 and the group signal processing circuit 222 to sequentially output the output signals after processing, sequentially output from each of the corresponding column circuits 251 within the group signal processing circuit 221, to the output part 271.

In this case, the power supply controller 28 sets the power supply of a component operating when the image signal of the first group is output, to be in an ON-state, and sets the power supply of a component operating when the image signals of the second group to the fourth group are output, to be in an OFF-state, in accordance with the control signal indicating the output of the image signal in the sequential operating mode which is input from the readout circuit controller 23. More specifically, the power supply controller 28 sets only the power supplies of the pixel load current source 241, the column circuit 251 and the output part 271 included in the group signal processing circuit 221, and only the power supply of the horizontal readout circuit 2612 shared by the group signal processing circuit 221 and the group signal processing circuit 222, to be in an ON-state. In addition, the power supply controller 28 sets the power supplies of the pixel load current source 242, the column circuit 252 and the output part 272 included in the group signal processing circuit 222, to be in an OFF-state. In addition, the power supply controller 28 sets the power supplies of the pixel load current source 243, the column circuit 253 and the output part 273 included in the group signal processing circuit 223, and the power supplies of the pixel load current source 244, the column circuit 254 and the output part 274 included in the group signal processing circuit 224, and the power supply of the horizontal readout circuit 2634 shared by the group signal processing circuit 223 and the group signal processing circuit 224, to be in an OFF-state.

Thereby, the image signals based on the pixel signals which are sequentially output from the unit pixels 110 of an initial row belonging to the first group are sequentially output to the outside from the output part 271 within the group signal processing circuit 221.

Thereafter, after the driving of the unit pixels 110 of a final row belonging to the first group is terminated, the vertical readout circuit 12 continuously sequentially drives the unit pixels 110 of an initial row belonging to the second group, and sequentially outputs each of the pixel signals to the group signal processing circuit 222 corresponding to the second group.

In addition, the readout circuit controller 23 causes each of the column circuits 252 within the group signal processing circuit 222 to sequentially execute a process on the pixel signals which are sequentially output from the unit pixels 110 belonging to the corresponding second group. In addition, the readout circuit controller 23 causes the horizontal readout circuit 2612 shared by the group signal processing circuit 221 and the group signal processing circuit 222 to sequentially output the output signals after processing, sequentially output from each of the corresponding column circuits 252 within the group signal processing circuit 222, to the output part 272.

In this case, the power supply controller 28 sets the power supply of a component operating when the image signal of the second group is output, to be in an ON-state, and sets the power supply of a component operating when the image signals of the second group and the third group to the fourth group are output, to be in an OFF-state. More specifically, the power supply controller 28 sets only the power supplies of the pixel load current source 242, the column circuit 252 and the output part 272 included in the group signal processing circuit 222, and only the power supply of the horizontal readout circuit 2612 shared by the group signal processing circuit 221 and the group signal processing circuit 222, to be in an ON-state. In addition, the power supply controller 28 sets the power supplies of the power supplies of the pixel load current source 241, the column circuit 251 and the output part 271 included in the group signal processing circuit 221, to be in an OFF-state. In addition, the power supply controller 28 sets the power supplies of the pixel load current source 243, the column circuit 253 and the output part 273 included in the group signal processing circuit 223, and the power supplies of the pixel load current source 244, the column circuit 254 and the output part 274 included in the group signal processing circuit 224, and the power supply of the horizontal readout circuit 2634 shared by the group signal processing circuit 223 and the group signal processing circuit 224, to be in an OFF-state.

Thereby, the image signals based on the pixel signals which are sequentially output from the unit pixels 110 of an initial row belonging to the second group are sequentially output to the outside from the output part 272 within the group signal processing circuit 222, subsequently to the pixel signals which are output by the unit pixels 110 of a final row of the first group.

Thereafter, after the driving of the unit pixels 110 of a final row belonging to the second group is terminated, the vertical readout circuit 12 continuously sequentially drives the unit pixels 110 of an initial row belonging to the third group, and sequentially outputs each of the pixel signals to the group signal processing circuit 223 corresponding to the third group.

In addition, the readout circuit controller 23 causes each of the column circuits 253 within the group signal processing circuit 223 to sequentially execute a process on the pixel signals which are sequentially output from the unit pixels 110 belonging to the corresponding third group. In addition, the readout circuit controller 23 causes the horizontal readout circuit 2634 shared by the group signal processing circuit 223 and the group signal processing circuit 224 to sequentially output the output signals after processing, sequentially output from each of the corresponding column circuits 253 within the group signal processing circuit 223, to the output part 273.

In this case, the power supply controller 28 sets the power supply of a component operating when the image signal of the third group is output, to be in an ON-state, and sets the power supply of a component operating when the image signals of the first group to the second group and the fourth group are output, to be in an OFF-state. More specifically, the power supply controller 28 sets only the power supplies of the pixel load current source 243, the column circuit 253 and the output part 273 included in the group signal processing circuit 223, and only the power supply of the horizontal readout circuit 2634 shared by the group signal processing circuit 223 and the group signal processing circuit 224, to be in an ON-state. In addition, the power supply controller 28 sets the power supplies of the pixel load current source 244, the column circuit 254 and the output part 274 included in the group signal processing circuit 224, to be in an OFF-state. In addition, the power supply controller 28 sets the power supplies of the pixel load current source 241, the column circuit 251 and the output part 271 included in the group signal processing circuit 221, the power supplies of the pixel load current source 242, the column circuit 252 and the output part 272 included in the group signal processing circuit 222, and the power supply of the horizontal readout circuit 2612 shared by the group signal processing circuit 221 and the group signal processing circuit 222, to be in an OFF-state.

Thereby, the image signals based on the pixel signals which are sequentially output from the unit pixels 110 of an initial row belonging to the third group are sequentially output to the outside from the output part 273 within the group signal processing circuit 223, subsequently to the pixel signals which are output by the unit pixels 110 of a final row of the second group.

Thereafter, after the driving of the unit pixels 110 of a final row belonging to the third group is terminated, the vertical readout circuit 12 continuously sequentially drives the unit pixels 110 of an initial row belonging to the fourth group, and sequentially outputs each of the pixel signals to the group signal processing circuit 224 corresponding to the fourth group.

In addition, the readout circuit controller 23 causes each of the column circuits 254 within the group signal processing circuit 224 to sequentially execute a process on the pixel signals which are sequentially output from the unit pixels 110 belonging to the corresponding fourth group. In addition, the readout circuit controller 23 causes the horizontal readout circuit 2634 shared by the group signal processing circuit 223 and the group signal processing circuit 224 to sequentially output the output signals after processing, sequentially output from each of the corresponding column circuits 254 within the group signal processing circuit 224, to the output part 274.

In this case, the power supply controller 28 sets the power supply of a component operating when the image signal of the fourth group is output, to be in an ON-state, and sets the power supply of a component operating when the image signals of the first group to the third group are output, to be in an OFF-state. More specifically, the power supply controller 28 sets only the power supplies of the pixel load current source 244, the column circuit 254 and the output part 274 included in the group signal processing circuit 224, and only the power supply of the horizontal readout circuit 2634 shared by the group signal processing circuit 223 and the group signal processing circuit 224, to be in an ON-state. In addition, the power supply controller 28 sets the power supplies of the pixel load current source 243, the column circuit 253 and the output part 273 included in the group signal processing circuit 223, to be in an OFF-state. In addition, the power supply controller 28 sets the power supplies of the pixel load current source 241, the column circuit 251 and the output part 271 included in the group signal processing circuit 221, the power supplies of the pixel load current source 242, the column circuit 252 and the output part 272 included in the group signal processing circuit 222, and the power supply of the horizontal readout circuit 2612 shared by the group signal processing circuit 221 and the group signal processing circuit 222, to be in an OFF-state.

Thereby, the image signals based on the pixel signals which are sequentially output from the unit pixels 110 of an initial row belonging to the fourth group are sequentially output to the outside from the output part 274 within the group signal processing circuit 224, subsequently to the pixel signals which are output by the unit pixels 110 of a final row of the third group.

When the output of the image signals based on the pixel signals, output by the unit pixels 110 of a final row belonging to the fourth group, from the output part 274 within the group signal processing circuit 224 is terminated, the solid-state image pickup device 300 completes the output of the image signals in the sequential operating mode.

In this manner, in the sequential operating mode in the solid-state image pickup device 300, as shown in FIG. 11C, the image signals based on the pixel signals which are output by the unit pixels 110 belonging to each group of the first group to the fourth group are sequentially output from each of the group signal processing circuit 221 to the group signal processing circuit 224 corresponding to each of the unit pixels 110. The image signal which is output in the sequential operating mode in this solid-state image pickup device 300 is the same as the image signal which is output in the sequential operating mode in the solid-state image pickup device 1 of the first embodiment, the solid-state image pickup device 100 of the second embodiment, and the solid-state image pickup device 200 of the third embodiment. In the solid-state image pickup device 300, similarly to the solid-state image pickup device 100 of the second embodiment, the power supply controller 28 sets only the power supply of the component within the group signal processing circuit 22 operating when the image signals are output to be in an ON-state, and sets the power supply of the component within the group signal processing circuit 22 which does not operate to be in an OFF-state. However, in the solid-state image pickup device 300, the horizontal readout circuit 26 is shared by two group signal processing circuits 22. Therefore, in the solid-state image pickup device 300, similarly to the solid-state image pickup device 100 of the second embodiment, it is possible to obtain the effect of a reduction in circuit scale based on the horizontal readout circuit 26 being shared by two group signal processing circuits 22, in addition to the effect of a reduction in power consumption based on the power supply of a component within the group signal processing circuit 22, which does not operate, being set to be in an OFF-state.

As described above, the solid-state image pickup device 300 of the fourth embodiment is also configured such that the first substrate 10 having the pixel array part 11 formed therein and the second substrate 20 having the signal processing circuit part 21 formed therein are laminated. Thereby, in the solid-state image pickup device 300 of the fourth embodiment, similarly to the solid-state image pickup device 1 of the first embodiment, the solid-state image pickup device 100 of the second embodiment, and the solid-state image pickup device 200 of the third embodiment, each of the unit pixels 110 disposed within the pixel array part 11 is divided into a plurality of groups without being limited to the number, and thus the vertical signal line to which the unit pixels 110 of the same column within the pixel array part 11 is connected can be divided into the number of groups. Thereby, in the solid-state image pickup device 300 of the fourth embodiment, similarly to the solid-state image pickup device 1 of the first embodiment, the solid-state image pickup device 100 of second embodiment, and the solid-state image pickup device 200 of the third embodiment, it is possible to obtain a speed-up in readout of the pixel signal from each of the unit pixels 110 to a corresponding column circuit 25 and a reduction in power consumption, and the effect of a reduction in power consumption when the image signal is output based on a reduction in the load of each vertical signal line in each group.

In addition, in the solid-state image pickup device 300 of the fourth embodiment, the group signal processing circuit 22 corresponding to each group is also included within the second substrate 20. In the solid-state image pickup device 300 of the fourth embodiment, the horizontal readout circuit 26 is shared by a plurality of group signal processing circuits 22. In addition, in the solid-state image pickup device 300 of the fourth embodiment, in the sequential operating mode, only the power supply of a component within the group signal processing circuit 22 operating when the image signal is output is set to be in an ON-state, and the power supply of a component within the group signal processing circuit 22 which does not operate is set to be in an OFF-state. Thereby, in the solid-state image pickup device 300 of the fourth embodiment, in the sequential operating mode, it is also possible to obtain the effect of a reduction in circuit scale based on the horizontal readout circuit 26 being shared by a plurality of group signal processing circuits 22, in addition to the same effect of a reduction in power consumption when the image signal is output as that in the solid-state image pickup device 100 of the second embodiment. In the solid-state image pickup device 300 of the fourth embodiment, since the operation in the parallel operating mode is the same as the operation of the parallel operating mode in the solid-state image pickup device 1 of the first embodiment, the solid-state image pickup device 100 of the second embodiment, and the solid-state image pickup device 200 of the third embodiment, it is possible to obtain the effect of a reduction in power consumption when the image signal is output based on a reduction in the load of each vertical signal line in each group.

In this manner, in the solid-state image pickup device 300 of the fourth embodiment, similarly to the solid-state image pickup device 1 of the first embodiment, the solid-state image pickup device 100 of the second embodiment, and the solid-state image pickup device 200 of the third embodiment, it is possible to achieve both speed-up and a reduction in power consumption based on a reduction in the load of each vertical signal line. In addition, in the solid-state image pickup device 300 of the fourth embodiment, it is possible to further reduce a circuit scale than in the solid-state image pickup device 1 of the first embodiment, the solid-state image pickup device 100 of the second embodiment, and the solid-state image pickup device 200 of the third embodiment.

In the configuration of the solid-state image pickup device 300 according to the fourth embodiment shown in FIG. 10, a configuration is also shown in which the power supply controller 28 controls the power supply of the column circuit 25 within each of the group signal processing circuits 22 and the power supply of the horizontal readout circuit 26 shared by a plurality of group signal processing circuits 22. However, the readout circuit controller 23 can also be configured to control the power supplies of the column circuit 25 and the horizontal readout circuit 26. In addition, instead of the power supply controller 28, the readout circuit controller 23 may be configured to control the power supplies of all the components within each of the group signal processing circuits 22.

In the solid-state image pickup device 1 of the first embodiment, the solid-state image pickup device 100 of the second embodiment, the solid-state image pickup device 200 of the third embodiment, and the solid-state image pickup device 300 of the fourth embodiment, a configuration has been described in which the image signals based on the pixel signals which are output from corresponding unit pixels 110 are output from the output part 27 included in each of the group signal processing circuits 22. That is, in the solid-state image pickup device 1 of the first embodiment, the solid-state image pickup device 100 of the second embodiment, the solid-state image pickup device 200 of the third embodiment, and the solid-state image pickup device 300 of the fourth embodiment, a configuration has been described in which the image signals are output from the output terminal corresponding to each divided group. However, as can be seen from FIGS. 5C, 7C, and 11C, in the sequential operating mode, a case does not occur in which a plurality of output parts 27 output the image signal to the outside in parallel (at the same time). That is, the output part 27 that outputs the image signal in the sequential operating mode is any one of the output parts 27. Therefore, the output part 27 that outputs the image signal in the sequential operating mode can be configured to be the same output part 27, that is, the output part 27 can also be configured to be used in common.

Fifth Embodiment

Next, an example of still another configuration of the solid-state image pickup device mounted in the image pickup apparatus 8 of the present embodiment will be described. A solid-state image pickup device according to the fifth embodiment is mounted in the image pickup apparatus 8, instead of the solid-state image pickup device 1 included in the image pickup apparatus 8 of the present embodiment shown in FIG. 1. In the following description, the solid-state image pickup device according to the fifth embodiment is referred to as a "solid-state image pickup device 400". The configuration of the solid-state image pickup device 400 according to the fifth embodiment includes the same configuration as that of the solid-state image pickup device 300 of the fourth embodiment shown in FIG. 10. Therefore, in the following description, in the respective components of the solid-state image pickup device 400 according to the fifth embodiment, the same components as those of the solid-state image pickup device 300 of the fourth embodiment are denoted by the same reference numerals and signs as those of the solid-state image pickup device 300, and thus a detailed description of each component will not be given.

Figure 12:
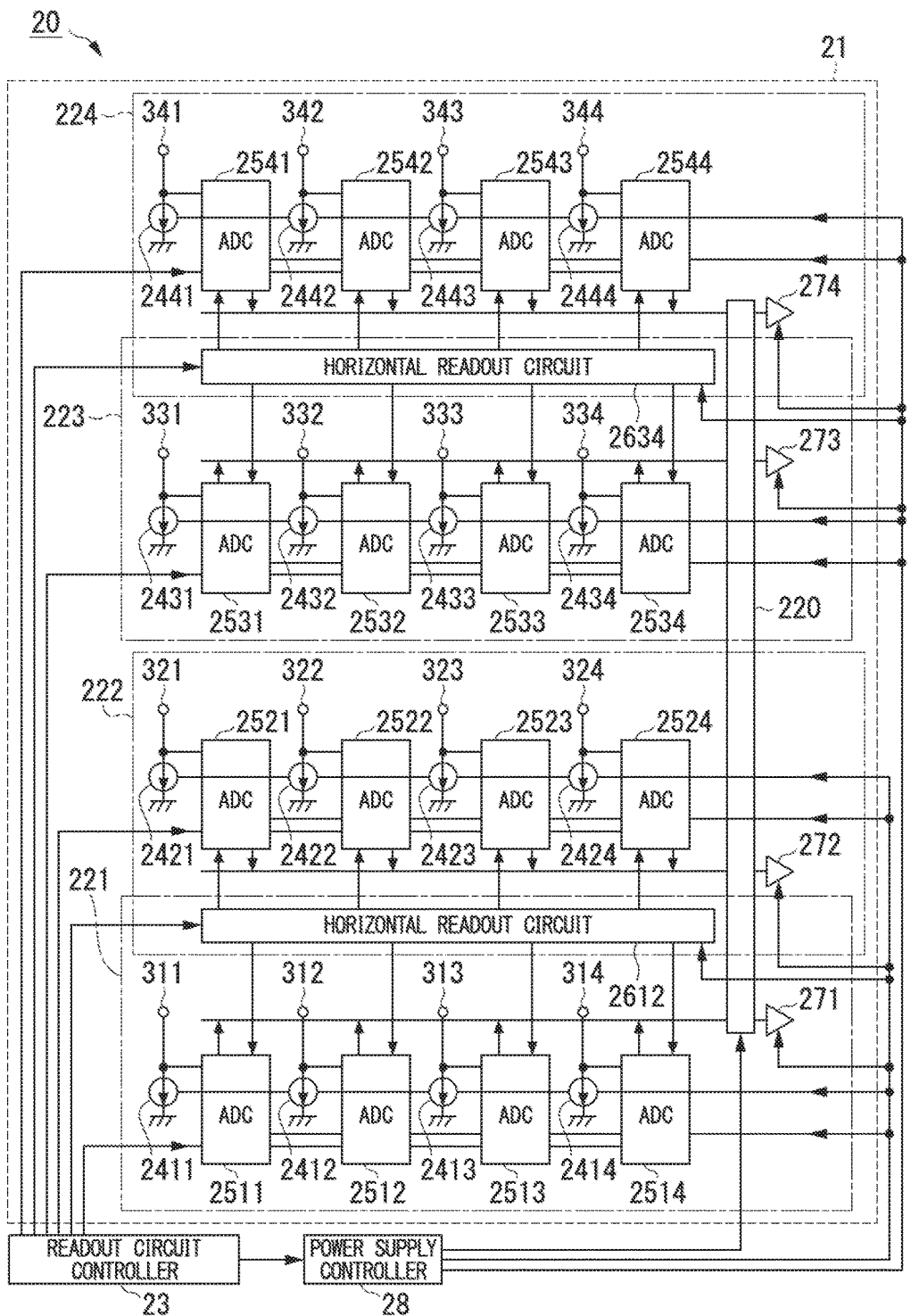
FIG. 12 is a block diagram illustrating a schematic configuration of a second substrate of a solid-state image pickup device according to a fifth embodiment of the present invention.

FIG. 12 is a block diagram illustrating a schematic configuration of a second substrate 20 of the solid-state image pickup device 400 according to the fifth embodiment. Similarly to the solid-state image pickup device 1 of the first embodiment, the solid-state image pickup device 400 of the fifth embodiment is also configured such that two substrates (chips) of a first substrate 10 and a second substrate 20 are laminated, and that the first substrate 10 and the second substrate 20 are bonded (connected) to each other through an inter-substrate connecting portion 30. The configuration of the first substrate 10 in the solid-state image pickup device 400 of the fifth embodiment is the same as the configuration of the first substrate 10 of the solid-state image pickup device of the first to fourth embodiments. Therefore, FIG. 12 shows only the configuration of the second substrate 20 of the solid-state image pickup device 400 of the fifth embodiment.

The second substrate 20 of the solid-state image pickup device 400 of the fifth embodiment shown in FIG. 12 includes a signal processing circuit part 21, a readout circuit controller 23, and a power supply controller 28. In addition, similarly to the solid-state image pickup device 300 of the fourth embodiment, the second substrate 20 of the solid-state image pickup device 400 of the fifth embodiment has a configuration in which the group signal processing circuits 22 included in the signal processing circuit part 21 share the horizontal readout circuit 26. Further, the second substrate 20 of the solid-state image pickup device 400 of the fifth embodiment includes a multiplexer 220 shared by all the group signal processing circuits 22 included in the signal processing circuit part 21.

Except for sharing the multiplexer 220, each of the group signal processing circuits 22 is the same as the group signal processing circuit 22 included in the solid-state image pickup device 300 of the fourth embodiment, that is, the operations of the group signal processing circuits 22 are the same as each other. Therefore, in the following description, in order to facilitate the description, the same components as those of the group signal processing circuit 22 included in the solid-state image pickup device 300 of the fourth embodiment will not be described below.

Similarly to the power supply controller 28 included in the solid-state image pickup device 300 of the fourth embodiment, the power supply controller 28 controls the power supply of each of the group signal processing circuits 22 within the signal processing circuit part 21, in accordance with control from the readout circuit controller 23, that is, in accordance with the operating mode when the solid-state image pickup device 400 reads out a pixel signal to output the read-out signal as an image signal. In addition, the power supply controller 28 controls the selection of the image signal by the multiplexer 220 in accordance with the operating mode when the solid-state image pickup device 400 reads out a pixel signal to output the read-out signal as an image signal, and outputs the image signal from the output part 27 within the group signal processing circuit 22 designated from the readout circuit controller 23.

The multiplexer 220 shared by the respective group signal processing circuits 22 switches the output part 27 which is an output destination of the output signal after processing which is output from each of the corresponding column circuits 25, in accordance with control from the power supply controller 28.

The output part 27 within each of the group signal processing circuits 22 outputs the output signal after processing which is sequentially input from the column circuit 25 through the multiplexer 220, as an image signal, to the outside of the solid-state image pickup device 400.

With such a configuration, in the solid-state image pickup device 400 of the fifth embodiment, the image signal is output from the output part 27 within the group signal processing circuit 22 designated from the readout circuit controller 23. In the solid-state image pickup device 400 of the fifth embodiment, similarly to the solid-state image pickup devices of the first to fourth embodiments, it is possible to achieve both a speed-up in readout of the pixel signal from the unit pixel 110 to the column circuit 25 and a reduction in power consumption, and the speed-up of the solid-state image pickup device 400 based on the image signals processed by each of the column circuits 25 being output in parallel.

Figure 13A:
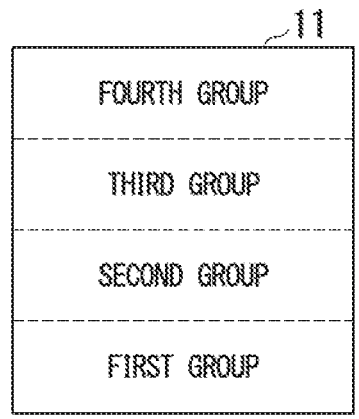
FIG. 13A is a diagram illustrating a method of reading out a pixel signal in the solid-state image pickup device of the fifth embodiment.
Figure 13B:
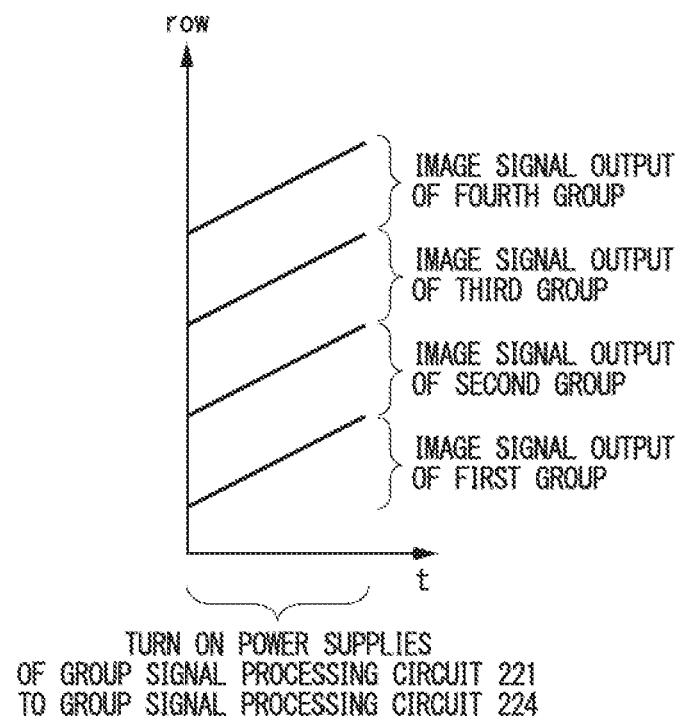
FIG. 13B is a diagram illustrating a method of reading out a pixel signal in the solid-state image pickup device of the fifth embodiment.
Figure 13C:
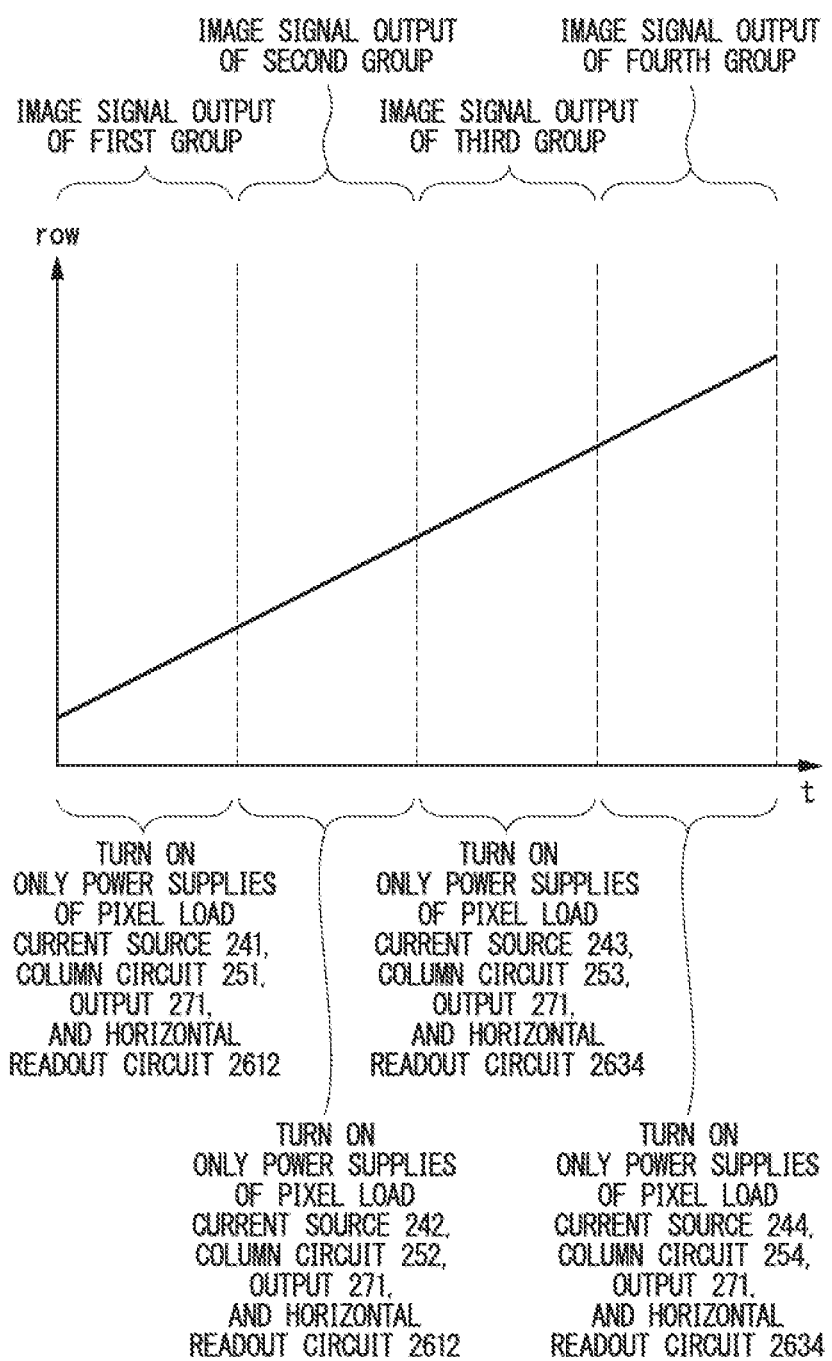
FIG. 13C is a diagram illustrating a method of reading out a pixel signal in the solid-state image pickup device of the fifth embodiment.

Next, an operating mode will be described in which the solid-state image pickup device 400 of the fifth embodiment reads out a pixel signal to output the read-out signal as an image signal. FIGS. 13A to 13C are diagrams illustrating a method of reading out a pixel signal in the solid-state image pickup device 400 of the fifth embodiment.

In the solid-state image pickup device 400 of the fifth embodiment, as shown in FIG. 13A, the regions of all the unit pixels 110 disposed within the pixel array part 11 are also divided into four groups of a first group to a fourth group. Therefore, in the solid-state image pickup device 400 of the fifth embodiment, similarly to the solid-state image pickup devices of the first to fourth embodiments, it is possible to output the image signals in two operating modes of the parallel operating mode and the sequential operating mode.

FIG. 13B schematically shows the transition of a row of the unit pixels 110 in the parallel operating mode, and FIG. 13C schematically shows the transition of a row of the unit pixels 110 in the sequential operating mode. In the solid-state image pickup device 400, similarly to the solid-state image pickup device 300 of the fourth embodiment, the power supply controller 28 controls the power supply of the group signal processing circuit 22 in accordance with the operating mode. In FIGS. 13B and 13C, the horizontal axis represents a time at which the solid-state image pickup device 400 outputs the image signal based on the pixel signal which is output by each of the unit pixels 110, and the vertical axis represents a row of the unit pixels 110 in which the solid-state image pickup device 400 outputs the image signal based on the pixel signal.

In a method of reading out a pixel signal in the parallel operating mode shown in FIG. 13B, the power supply controller 28 sets the power supplies of components within all the group signal processing circuits 22 to be in an ON-state. Therefore, in the operation of the parallel operating mode in the solid-state image pickup device 400, one horizontal readout circuit 26 shared by two group signal processing circuits 22 simultaneously sequentially reads out the output signals after processing, output from the column circuit 25 within the shared group signal processing circuit 22 to sequentially output the read-out signals to a corresponding output part 27, thereby allowing four rows' worth of image signals to be simultaneously output to the outside, similarly to the solid-state image pickup device 300 of the fourth embodiment. Therefore, a detailed description of the operation of the parallel operating mode in the solid-state image pickup device 300 will not be given.

Subsequently, a method of reading out a pixel signal in the sequential operating mode shown in FIG. 13C will be described. An example will be described in which all the image signals are output from the output part 271 in the sequential operating mode shown in FIG. 13C. In a method of reading out a pixel signal in the sequential operating mode of the solid-state image pickup device 400, similarly to the solid-state image pickup device 300 of the fourth embodiment, the power supply controller 28 controls only the power supply of the group signal processing circuit 22 operating when a current image signal is output, to be in an ON-state. In addition, the power supply controller 28 performs control so that the multiplexer 220 switches the output destination of the output signal after processing, output from each of the column circuits 25, to the output part 271, in accordance with control from the readout circuit controller 23.

More specifically, in a period in which the solid-state image pickup device 400 outputs the image signal of the first group, connection between the column circuit 25 and the output part 271 within the group signal processing circuit 221 in the multiplexer 220 is controlled so as to output the image signal, output by each of the column circuits 25 within the group signal processing circuit 221, from the output part 271. In addition, in a period in which the solid-state image pickup device 400 outputs the image signal of the second group, connection between the column circuit 25 and the output part 271 within the group signal processing circuit 222 in the multiplexer 220 is controlled so as to output the image signal, output by each of the column circuits 25 within the group signal processing circuit 222, to the output part 271. In addition, in a period in which the solid-state image pickup device 400 outputs the image signal of the third group, connection between the column circuit 25 and the output part 271 within the group signal processing circuit 223 in the multiplexer 220 is controlled so as to output the image signal, output by each of the column circuits 25 within the group signal processing circuit 223, to the output part 271. In addition, in a period in which the solid-state image pickup device 400 outputs the image signal of the fourth group, connection between the column circuit 25 and the output part 271 within the group signal processing circuit 224 in the multiplexer 220 is controlled so as to output the image signal, output by each of the column circuits 25 within the group signal processing circuit 224, to the output part 271.

When the solid-state image pickup device 400 starts to read out the image signal in the sequential operating mode, the readout circuit controller 23 outputs a control signal indicating the output of the image signal in the sequential operating mode to the pixel controller 13 and the power supply controller 28. Thereby, the pixel controller 13 instructs the vertical readout circuit 12 to sequentially drive the unit pixels 110 belonging to four groups, and to sequentially read out the pixel signals. The vertical readout circuit 12 sequentially drives the unit pixels 110 of an initial row belonging to first group in accordance with this instruction, and sequentially output each of the pixel signals to the group signal processing circuit 221 corresponding to the first group.

In addition, the readout circuit controller 23 causes each of the column circuits 251 within the group signal processing circuit 221 to sequentially execute a process (here, analog digital conversion process) on the pixel signals which are sequentially output from the unit pixels 110 belonging to the corresponding first group. In addition, the readout circuit controller 23 causes the horizontal readout circuit 2612 shared by the group signal processing circuit 221 and the group signal processing circuit 222 to sequentially output the output signals after processing, sequentially output from each of the corresponding column circuits 251 within the group signal processing circuit 221, to the multiplexer 220. In addition, the power supply controller 28 controls the multiplexer 220 so as to connect the output signal line of each of the corresponding column circuits 251 within the group signal processing circuit 221 to the input signal line of the output part 271.

The power supply controller 28 sets the power supply of a component operating when the image signal of the first group is output, to be in an ON-state, and sets the power supply of a component operating when the image signals of the second group to the fourth group are output, to be in an OFF-state, in accordance with the control signal indicating the output of the image signal in the sequential operating mode which is input from the readout circuit controller 23. More specifically, the power supply controller 28 sets only the power supplies of the pixel load current source 241, the column circuit 251 and the output part 271 included in the group signal processing circuit 221, and only the power supply of the horizontal readout circuit 2612 shared by the group signal processing circuit 221 and the group signal processing circuit 222, to be in an ON-state. In addition, the power supply controller 28 sets the power supplies of the pixel load current source 242, the column circuit 252 and the output part 272 included in the group signal processing circuit 222, to be in an OFF-state. In addition, the power supply controller 28 sets the power supplies of the pixel load current source 243, the column circuit 253 and the output part 273 included in the group signal processing circuit 223, and the power supplies of the pixel load current source 244, the column circuit 254 and the output part 274 included in the group signal processing circuit 224, and the power supply of the horizontal readout circuit 2634 shared by the group signal processing circuit 223 and the group signal processing circuit 224, to be in an OFF-state.

Thereby, the image signals based on the pixel signals which are sequentially output from the unit pixels 110 of an initial row belonging to the first group are sequentially output to the outside from the output part 271 within the group signal processing circuit 221 through the multiplexer 220.

Thereafter, after the driving of the unit pixels 110 of a final row belonging to the first group is terminated, the vertical readout circuit 12 continuously sequentially drives the unit pixels 110 of an initial row belonging to the second group, and sequentially outputs each of the pixel signals to the group signal processing circuit 222 corresponding to the second group.

In addition, the readout circuit controller 23 causes each of the column circuits 252 within the group signal processing circuit 222 to sequentially execute a process on the pixel signals which are sequentially output from the unit pixels 110 belonging to the corresponding second group. In addition, the readout circuit controller 23 causes the horizontal readout circuit 2612 shared by the group signal processing circuit 221 and the group signal processing circuit 222 to sequentially output the output signals after processing, sequentially output from each of the corresponding column circuits 252 within the group signal processing circuit 222, to the multiplexer 220. In addition, the power supply controller 28 controls the multiplexer 220 so as to connect the output signal line of each of the corresponding column circuits 252 within the group signal processing circuit 222 to the input signal line of the output part 271.

The power supply controller 28 sets the power supply of a component operating when the image signal of the second group is output, to be in an ON-state, and sets the power supply of a component operating when the image signals of the second group and the third group to the fourth group are output, to be in an OFF-state. More specifically, the power supply controller 28 sets only the power supplies of the pixel load current source 242 and the column circuit 252 included in the group signal processing circuit 222, only the power supply of the horizontal readout circuit 2612 shared by the group signal processing circuit 221 and the group signal processing circuit 222, and only the power supply of the output part 271 included in the group signal processing circuit 221, to be in an ON-state. In addition, the power supply controller 28 sets the power supplies of the pixel load current source 241 and the column circuit 251 included in the group signal processing circuit 221, and the power supply of the output part 272 included in the group signal processing circuit 222, to be in an OFF-state. In addition, the power supply controller 28 sets the power supplies of the pixel load current source 243, the column circuit 253 and the output part 273 included in the group signal processing circuit 223, and the power supplies of the pixel load current source 244, the column circuit 254 and the output part 274 included in the group signal processing circuit 224, and the power supply of the horizontal readout circuit 2634 shared by the group signal processing circuit 223 and the group signal processing circuit 224, to be in an OFF-state.

Thereby, the image signals based on the pixel signals which are sequentially output from the unit pixels 110 of an initial row belonging to the second group are sequentially output to the outside from the output part 271 within the group signal processing circuit 221 through the multiplexer 220, subsequently to the pixel signals which are output by the unit pixels 110 of a final row of the first group.

Thereafter, after the driving of the unit pixels 110 of a final row belonging to the second group is terminated, the vertical readout circuit 12 continuously sequentially drives the unit pixels 110 of an initial row belonging to the third group, and sequentially outputs each of the pixel signals to the group signal processing circuit 223 corresponding to the third group.

In addition, the readout circuit controller 23 causes each of the column circuits 253 within the group signal processing circuit 223 to sequentially execute a process on the pixel signals which are sequentially output from the unit pixels 110 belonging to the corresponding third group. In addition, the readout circuit controller 23 causes the horizontal readout circuit 2634 shared by the group signal processing circuit 223 and the group signal processing circuit 224 to sequentially output the output signals after processing, sequentially output from each of the corresponding column circuits 253 within the group signal processing circuit 223, to the multiplexer 220. In addition, the power supply controller 28 controls the multiplexer 220 so as to connect the output signal line of each of the corresponding column circuits 253 within the group signal processing circuit 223 to the input signal line of the output part 271.

The power supply controller 28 sets the power supply of a component operating when the image signal of the third group is output, to be in an ON-state, and sets the power supply of a component operating when the image signals of the first group to the second group and the fourth group are output, to be in an OFF-state. More specifically, the power supply controller 28 sets only the power supplies of the pixel load current source 243 and the column circuit 253 included in the group signal processing circuit 223, only the power supply of the horizontal readout circuit 2634 shared by the group signal processing circuit 223 and the group signal processing circuit 224, and only the power supply of the output part 271 included in the group signal processing circuit 221, to be in an ON-state. In addition, the power supply controller 28 sets the power supplies of the pixel load current source 244, the column circuit 254 and the output part 274 included in the group signal processing circuit 224, and the power supply of the output part 273 included in the group signal processing circuit 223, to be in an OFF-state. In addition, the power supply controller 28 sets the power supplies of the pixel load current source 241 and the column circuit 251 included in the group signal processing circuit 221, the power supplies of the pixel load current source 242, the column circuit 252 and the output part 272 included in the group signal processing circuit 222, and the power supply of the horizontal readout circuit 2612 shared by the group signal processing circuit 221 and the group signal processing circuit 222, to be in an OFF-state.

Thereby, the image signals based on the pixel signals which are sequentially output from the unit pixels 110 of an initial row belonging to the third group are sequentially output to the outside from the output part 271 within the group signal processing circuit 221 through the multiplexer 220, subsequently to the pixel signals which are output by the unit pixels 110 of a final row of the second group.

Thereafter, after the driving of the unit pixels 110 of a final row belonging to the third group is terminated, the vertical readout circuit 12 continuously sequentially drives the unit pixels 110 of an initial row belonging to the fourth group, and sequentially outputs each of the pixel signals to the group signal processing circuit 224 corresponding to the fourth group.

In addition, the readout circuit controller 23 causes each of the column circuits 254 within the group signal processing circuit 224 to sequentially execute a process on the pixel signals which are sequentially output from the unit pixels 110 belonging to the corresponding fourth group. In addition, the readout circuit controller 23 causes the horizontal readout circuit 2634 shared by the group signal processing circuit 223 and the group signal processing circuit 224 to sequentially output the output signals after processing, sequentially output from each of the corresponding column circuits 254 within the group signal processing circuit 224, to the multiplexer 220. In addition, the power supply controller 28 controls the multiplexer 220 so as to connect the output signal line of each of the corresponding column circuits 254 within the group signal processing circuit 224 to the input signal line of the output part 271.

The power supply controller 28 sets the power supply of a component operating when the image signal of the fourth group is output, to be in an ON-state, and sets the power supply of a component operating when the image signals of the first group to the third group are output, to be in an OFF-state. More specifically, the power supply controller 28 sets only the power supplies of the pixel load current source 244 and the column circuit 254 included in the group signal processing circuit 224, only the power supply of the horizontal readout circuit 2634 shared by the group signal processing circuit 223 and the group signal processing circuit 224, and the power supply of the output part 271 included in the group signal processing circuit 221, to be in an ON-state. In addition, the power supply controller 28 sets the power supplies of the pixel load current source 243, the column circuit 253 and the output part 273 included in the group signal processing circuit 223, and the power supply of the output part 274 included in the group signal processing circuit 224, to be in an OFF-state. In addition, the power supply controller 28 sets the power supplies of the pixel load current source 241 and the column circuit 251 included in the group signal processing circuit 221, the power supplies of the pixel load current source 242, the column circuit 252 and the output part 272 included in the group signal processing circuit 222, and the power supply of the horizontal readout circuit 2612 shared by the group signal processing circuit 221 and the group signal processing circuit 222, to be in an OFF-state.

Thereby, image signals based on the pixel signals which are sequentially output from the unit pixels 110 of an initial row belonging to the fourth group are sequentially output to the outside from the output part 271 within the group signal processing circuit 221 through the multiplexer 220, subsequently to the pixel signals which are output by the unit pixels 110 of a final row of the third group.

When the output of the image signals based on the pixel signals, output by the unit pixels 110 of a final row belonging to the fourth group, from the output part 271 within the group signal processing circuit 221 is terminated, the solid-state image pickup device 400 completes the output of the image signals in the sequential operating mode.

In this manner, in the sequential operating mode in the solid-state image pickup device 400, as shown in FIG. 13C, the image signals based on the pixel signals which are output by the unit pixels 110 belonging to each group of the first group to the fourth group are sequentially output from one output part 27 (here, output part 271 within the group signal processing circuit 221). The image signals which are output in the sequential operating mode in the solid-state image pickup device 400 are the same as the image signals which are output in the sequential operating mode in the solid-state image pickup device of the first to fourth embodiments. Thereby, in the image pickup apparatus 8 having the solid-state image pickup device 400 of the fifth embodiment mounted therein, since all the image signals are output from one output terminal, that is, an output terminal of one system, it is possible to facilitate a process when an image (still image or moving image) is generated on the basis of the image signals which are output in the sequential operating mode.

An example has been described in which all the image signals are output from the output part 271 in the sequential operating mode shown in FIG. 13C, but it is also possible to output the image signal from another output part 27, and to output the image signals from a plurality of output parts 27. Even in this case, it is considered that operations are performed similarly to the aforementioned operations, and thus the detailed description thereof will not be given.

As described above, the solid-state image pickup device 400 of the fifth embodiment is also configured such that the first substrate 10 having the pixel array part 11 formed therein and the second substrate 20 having the signal processing circuit part 21 formed therein are laminated. Thereby, in the solid-state image pickup device 400 of the fifth embodiment, similarly to the solid-state image pickup devices of the first to fourth embodiments, each of the unit pixels 110 disposed within the pixel array part 11 is divided into a plurality of groups without being limited to the number, and thus the vertical signal line to which the unit pixels 110 of the same column within the pixel array part 11 are connected can be divided into the number of groups. Thereby, in the solid-state image pickup device 400 of the fifth embodiment, similarly to the solid-state image pickup devices of the first to fourth embodiments, it is possible to obtain a speed-up in readout of the pixel signal from each of the unit pixels 110 to a corresponding column circuit 25 and a reduction in power consumption, and the effect of a reduction in power consumption when the image signal is output based on a reduction in the load of each vertical signal line in each group.

In addition, in the solid-state image pickup device 400 of the fifth embodiment, the group signal processing circuit 22 corresponding to each group is also included within the second substrate 20. In the solid-state image pickup device 400 of the fifth embodiment, the output part 27 that outputs the image signal can be switched by the multiplexer 220. Thereby, in the solid-state image pickup device 400 of the fifth embodiment, in the sequential operating mode, it is possible to obtain the effect of being capable of facilitating the following process by switching the output part 27 that outputs the image signal using the multiplexer 220, in addition to the same effect of a reduction in power consumption when the image signal is output as that in the solid-state image pickup device 300 of the fourth embodiment. In the solid-state image pickup device 400 of the fifth embodiment, since the operation in the parallel operating mode is the same as the operation of the parallel operating mode in the solid-state image pickup devices of the first to fourth embodiments, it is possible to obtain the effect of a reduction in power consumption when the image signal is output based on a reduction in the load of each vertical signal line in each group.

In this manner, in the solid-state image pickup device 400 of the fifth embodiment, similarly to the solid-state image pickup devices of the first to fourth embodiments, it is possible to achieve both speed-up and a reduction in power consumption based on a reduction in the load of each vertical signal line. In addition, in the solid-state image pickup device 400 of the fifth embodiment, it is possible to further facilitate the following process for the image signal which is output in the sequential operating mode than in the solid-state image pickup devices of the first to fourth embodiments.

In the configuration of the solid-state image pickup device 400 according to the fifth embodiment shown in FIG. 12, a configuration is shown in which the power supply controller 28 performs control for switching the output part 27 which is an output destination of the image signal which is output through the multiplexer 220. However, the readout circuit controller 23 can also be configured to control the switching of the output part 27 using the multiplexer 220.

As described above, according to the mode for carrying out the present invention, the solid-state image pickup device is configured such that the first substrate having the pixel array part formed therein and the second substrate having the signal processing circuit part formed therein are laminated. Each of the unit pixels disposed within the pixel array part of the first substrate is divided into a plurality of groups (four groups in the embodiment), and the signal processing circuit (group signal processing circuit in the embodiment) corresponding to each group is disposed in the second substrate. Thereby, in the solid-state image pickup device of the mode for carrying out the present invention, each of the unit pixels disposed within the pixel array part can be divided into a plurality of groups without being limited to the number, and the vertical signal line to which the unit pixels of the same column within the pixel array part are connected can be divided by the number of groups into which the unit pixels are divided. Thereby, in the solid-state image pickup device of the mode for carrying out the present invention, it is possible to reduce the length of each vertical signal line, to reduce the number of unit pixels connected to each vertical signal line, and to further reduce the load of each divided vertical signal line than the load of the vertical signal line of one column in the solid-state image pickup device of the related art. Thereby, in the solid-state image pickup device of the mode for carrying out the present invention, it is possible to realize a speed-up in readout of the pixel signal from each of the unit pixels to the column circuit within a corresponding signal processing circuit (group signal processing circuit in the embodiment) and a reduction in power consumption, without increasing the current value of the pixel load current source corresponding to each of the unit pixels, and without increasing the size of an amplification transistor included within the unit pixel.

In addition, in the solid-state image pickup device of the mode for carrying out the present invention, the pixel signals are simultaneously read out from the unit pixels belonging to each group divided into multiple parts, and thus image signals having the same number of rows (four rows in the embodiment) as the number of groups into which the unit pixel is divided are simultaneously output. Thereby, in the solid-state image pickup device of the mode for carrying out the present invention, it is possible to realize a reduction in power consumption based on the load of each vertical signal line being reduced within each group, and speed-up based on multiple columns' worth of image signals being simultaneously output. In addition, in the solid-state image pickup device of the mode for carrying out the present invention, the pixel signals are sequentially read out from the unit pixels belonging to each group divided into multiple parts, and thus the image signals corresponding to each of the unit pixels disposed in the pixel array part are sequentially output. Thereby, in the solid-state image pickup device of the mode for carrying out the present invention, it is possible to realize a reduction in power consumption based on the load of each vertical signal line being reduced within each group. In this manner, in the solid-state image pickup device of the mode for carrying out the present invention, it is possible to realize a speed-up in readout of the pixel signal and a reduction in power consumption based on a reduction in the load of each vertical signal line, and speed-up based on the parallel output of the pixel signal.

In addition, in the solid-state image pickup device of the mode for carrying out the present invention, only the power supply of a component within the signal processing circuit (group signal processing circuit in the embodiment) operating when the image signal is output is set to be in an ON-state, and the power supply of a component within the signal processing circuit (group signal processing circuit in the embodiment) which does not operate is set to be in an OFF-state. Thereby, in the solid-state image pickup device of the mode for carrying out the present invention, it is possible to obtain the effect of a reduction in power consumption when the image signal is output based on the power supply of a component within the signal processing circuit (group signal processing circuit in the embodiment), which does not operate, to be in an OFF-state, in addition to the effect of a reduction in power consumption when the image signal is output based on a reduction in the load of each vertical signal line in each group.

In addition, in the solid-state image pickup device of the mode for carrying out the present invention, the pixel signal for correction for correcting the column circuit is included within the signal processing circuit (group signal processing circuit in the embodiment) corresponding to each group disposed in the second substrate. Thereby, in the solid-state image pickup device of the mode for carrying out the present invention, it is possible to reduce a difference in level between the output signals which are output by each of the column circuits, and to suppress a difference in level between the respective groups based on the unit pixels disposed within the pixel array part being divided into multiple parts. The output signals from each of the column circuits based on the pixel signal for correction which is output by the pixel for correction are read out multiple times, or a plurality of pixels for correction corresponding to one column circuit is included, and thus it is possible to improve the accuracy of correction such as the suppression of the influence of noise on the output signal which is output by the same column circuit.

In addition, in the solid-state image pickup device of the mode for carrying out the present invention, a component is shared by the signal processing circuits (group signal processing circuits in the embodiment) corresponding to each group disposed in the second substrate. Thereby, it is possible to reduce the circuit scale of the solid-state image pickup device of the mode for carrying out the present invention.

In addition, in the solid-state image pickup device of the mode for carrying out the present invention, the multiplexer for selecting the output part that outputs the output signal, output by the column circuit, as an image signal is included. Thereby, in the solid-state image pickup device of the mode for carrying out the present invention, it is possible to configure the output terminal that outputs an image signal in one system, and to facilitate a process of generating an image (still image or moving image) based on the image signal in the image pickup apparatus having the solid-state image pickup device of the mode for carrying out the present invention mounted therein.

The specific configuration of a circuit component in the present invention is not limited to the mode for carrying out the present invention, and can be variously changed and modified without departing from the spirit and scope of the present invention. For example, even in a case where the component and circuit configuration of the solid-state image pickup device or the unit pixel are changed, the same effect can be obtained by applying the idea of the present invention.

In addition, the arrangement of the unit pixels in a column direction and a row direction, and the number of groups are not limited to the mode for carrying out the present invention, and the numbers of disposed column directions and row directions in which the unit pixels are arranged, and the number of groups into which the unit pixels are divided can be changed without departing from the spirit and scope of the present invention. For example, in the embodiments, a case has been described of a case where the number of groups into which each of the unit pixels 110 disposed within the pixel array part 11 is divided is four, that is, the unit pixels are divided into the first group to the fourth group, but the number of groups may be two or three, and may be five or more.

As described above, although the embodiments of the present invention have been described with reference to the accompanying drawings, the specific configurations are not limited to the embodiments, and can be variously changed and modified without departing from the spirit or scope of the present invention.

In addition, the solid-state image pickup device according to the embodiments of the present invention may be configured such that two substrates are connected to each other by the connecting portion, and that three or more substrates are connected to each other by the connecting portion.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A solid-state image pickup device comprising:
a first substrate which has a pixel part divided into a plurality of groups obtained by dividing a plurality of pixels arranged in a two-dimensional matrix into groups corresponding to each of a plurality of predetermined rows; and
a second substrate including a pixel load current source corresponding to a vertical signal line to which the plurality of pixels disposed in the same column within the groups are connected, a column circuit that performs a predetermined process on a pixel signal which is output from the pixel to a corresponding vertical signal line, and a pixel for correction that outputs a pixel signal for correction for correcting the corresponding column circuit to the vertical signal line to which the corresponding column circuit is connected, for each column of the pixels belonging to the group, and including a plurality of signal processing circuits that output the pixel signal processed by each of the column circuits, as an image signal, for each row of the pixels, so as to correspond to each of the groups,
wherein the first substrate and the second substrate are laminated, and
each of the vertical signal line within each of the groups and each of the pixel load current source and the column circuit corresponding to the vertical signal line within the signal processing circuit corresponding to the group are electrically connected to each other through each inter-substrate connecting portion of the pixel load current source and the column circuit corresponding to the vertical signal line.

2. The solid-state image pickup device according to claim 1, wherein the second substrate further includes a power supply controller that controls a power supply of a component within the signal processing circuit in accordance with an operation when the image signal is output from the solid-state image pickup device.

3. The solid-state image pickup device according to claim 2, wherein the power supply controller sets power supplies of all components within the signal processing circuit to be in an ON-state when the pixels within each of the groups are simultaneously driven, and the image signals based on the pixel signals which are output from the driven pixels are output from the solid-state image pickup device so as to be output from the signal processing circuit corresponding to each of the groups in parallel, and
sets a power supply of a component within the signal processing circuit, operating in order to output the image signal, to be in an ON-state, and sets a power supply of a component within the signal processing circuit, not operating in order to output the image signal, to be in an OFF-state, when each of the pixels is sequentially driven, and the image signals based on the pixel signals which are output from the driven pixels are sequentially output from the solid-state image pickup device so as to be output from the signal processing circuit corresponding to the driven pixels.

4. The solid-state image pickup device according to claim 3, wherein each of the column circuit included in each of the signal processing circuit is corrected using the pixel signal for correction which is output by the corresponding pixel for correction, before the image signal is output from the solid-state image pickup device.

5. The solid-state image pickup device according to claim 2, wherein the power supply controller includes an output part included in each of the signal processing circuit, and controls an ON-state and an OFF-state of a power supply of a component within the signal processing circuit.

6. An image pickup apparatus comprising a solid-state image pickup device including:
a first substrate which has a pixel part divided into a plurality of groups obtained by dividing a plurality of pixels arranged in a two-dimensional matrix into groups corresponding to each of a plurality of predetermined rows; and
a second substrate including a pixel load current source corresponding to a vertical signal line to which the plurality of pixels disposed in the same column within the groups are connected, a column circuit that performs a predetermined process on a pixel signal which is output from the pixel to a corresponding vertical signal line, and a pixel for correction that outputs a pixel signal for correction for correcting the corresponding column circuit to the vertical signal line to which the corresponding column circuit is connected, for each column of the pixels belonging to the group, and including a plurality of signal processing circuits that output the pixel signal processed by each of the column circuits, as an image signal, for each row of the pixels, so as to correspond to each of the groups, wherein the first substrate and the second substrate are laminated, and each of the vertical signal line within each of the groups and each of the pixel load current source and the column circuit corresponding to the vertical signal line within the signal processing circuit corresponding to the group are electrically connected to each other through each inter-substrate connecting portion of the pixel load current source and the column circuit corresponding to the vertical signal line.

7. The image pickup apparatus according to claim 6, further comprising a mechanical shutter that controls an amount of light incident on the solid-state image pickup device, wherein the light incident on the solid-state image pickup device is blocked by the mechanical shutter when the pixels within each of the groups are simultaneously driven, and the image signals based on the pixel signals which are output from the driven pixels are output from the solid-state image pickup device so as to be output from the signal processing circuit corresponding to each of the groups in parallel.

* * * * *